(12) United States Patent
Raring et al.

(10) Patent No.: US 12,538,610 B2
(45) Date of Patent: Jan. 27, 2026

(54) METHOD FOR MANUFACTURING A MICRO LED DISPLAY USING PARALLEL MASS TRANSPORT

(71) Applicant: KYOCERA SLD Laser, Inc., Goleta, CA (US)

(72) Inventors: James W. Raring, Santa Barbara, CA (US); Alexander Sztein, Santa Barbara, CA (US); Nicholas J. Pfister, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 564 days.

(21) Appl. No.: 17/962,379

(22) Filed: Oct. 7, 2022

(65) Prior Publication Data

US 2024/0120435 A1 Apr. 11, 2024

(51) Int. Cl.
*H10H 20/01* (2025.01)
*H01L 25/075* (2006.01)

(52) U.S. Cl.
CPC ..... *H10H 20/0137* (2025.01); *H01L 25/0753* (2013.01); *H10H 20/018* (2025.01)

(58) Field of Classification Search
CPC . H10H 20/0137; H10H 20/018; H01L 25/167
USPC .......................................................... 257/79
See application file for complete search history.

(56) References Cited

U.S. PATENT DOCUMENTS

| | | | |
|---|---|---|---|
| 9,653,642 B1 * | 5/2017 | Raring | H10D 84/204 |
| 9,871,350 B2 | 1/2018 | McLaurin et al. | |
| 10,749,315 B2 | 8/2020 | McLaurin et al. | |
| 11,139,637 B2 | 10/2021 | McLaurin et al. | |
| 11,227,970 B1 * | 1/2022 | Oyer | H01L 25/0753 |
| 11,710,944 B2 | 7/2023 | McLaurin et al. | |
| 2008/0219309 A1 | 9/2008 | Hata et al. | |
| 2011/0064102 A1 | 3/2011 | Raring et al. | |
| 2013/0039374 A1 | 2/2013 | Lutgen et al. | |
| 2014/0240952 A1 | 8/2014 | Nakanishi et al. | |
| 2014/0247853 A1 | 9/2014 | Deppe | |
| 2015/0229108 A1 * | 8/2015 | Steigerwald | H01S 5/04256 372/45.01 |
| 2017/0141539 A1 | 5/2017 | Ring | |
| 2018/0269234 A1 * | 9/2018 | Hughes | H10H 29/142 |
| 2019/0273365 A1 | 9/2019 | Zediker et al. | |
| 2021/0257814 A1 | 8/2021 | Enya | |
| 2021/0296859 A1 | 9/2021 | Cheng et al. | |
| 2022/0077658 A1 | 3/2022 | McLaurin et al. | |
| 2022/0189830 A1 * | 6/2022 | Beyne | H01L 21/78 |

(Continued)

OTHER PUBLICATIONS

U.S. Appl. No. 15/180,737 Restriction Requirement mailed May 11, 2017, 7 pages.

(Continued)

*Primary Examiner* — Eliseo Ramos Feliciano
*Assistant Examiner* — Mikka Liu
(74) *Attorney, Agent, or Firm* — Kilpatrick Townsend & Stockton LLP

(57) ABSTRACT

Methods for manufacturing LED display panel devices include providing donor wafers having LED die configured to emit different color emissions. At least some of the LED die are selectively transferred from the donor wafers to a carrier wafer such that the carrier wafer is configured with different color emitting LEDs. The different color LEDs may include red-green-blue LEDs to form a RGB display panel.

23 Claims, 49 Drawing Sheets

Screening before removing sacrificial region

(56) References Cited

U.S. PATENT DOCUMENTS

| | | |
|---|---|---|
| 2022/0224072 A1 | 7/2022 | Enya et al. |
| 2023/0299557 A1 | 9/2023 | Hashimoto et al. |
| 2023/0352913 A1 | 11/2023 | Kasai |
| 2024/0055835 A1 | 2/2024 | Pfister et al. |
| 2024/0079848 A1 | 3/2024 | Nakanishi |

OTHER PUBLICATIONS

U.S. Appl. No. 15/180,737 Notice of Allowance mailed Aug. 25, 2017, 11 pages.
U.S. Appl. No. 17/477,016 Non-Final Office Action mailed Nov. 29, 2022, 11 pages.
U.S. Appl. No. 15/820,160 Restriction Requirement mailed Aug. 23, 2019, 5 pages.
U.S. Appl. No. 15/820,160 Non-Final Office Action mailed Nov. 20, 2019, 8 pages.
U.S. Appl. No. 15/820,160 Notice of Allowance mailed Apr. 1, 2020, 9 pages.
U.S. Appl. No. 16/844,299 Restriction Requirement mailed Dec. 15, 2020, 6 pages.
U.S. Appl. No. 16/844,299 Non-Final Office Action mailed Mar. 3, 2021, 10 pages.
U.S. Appl. No. 16/844,299 Notice of Allowance mailed Jun. 11, 2021, 10 pages.
U.S. Appl. No. 17/477,016 , Notice of Allowance, Mailed on Mar. 9, 2023, 9 pages.
Non-Final Office Action for U.S. Appl. No. 17/885,478, Mailed on Sep. 5, 2025, 26 pages.

\* cited by examiner

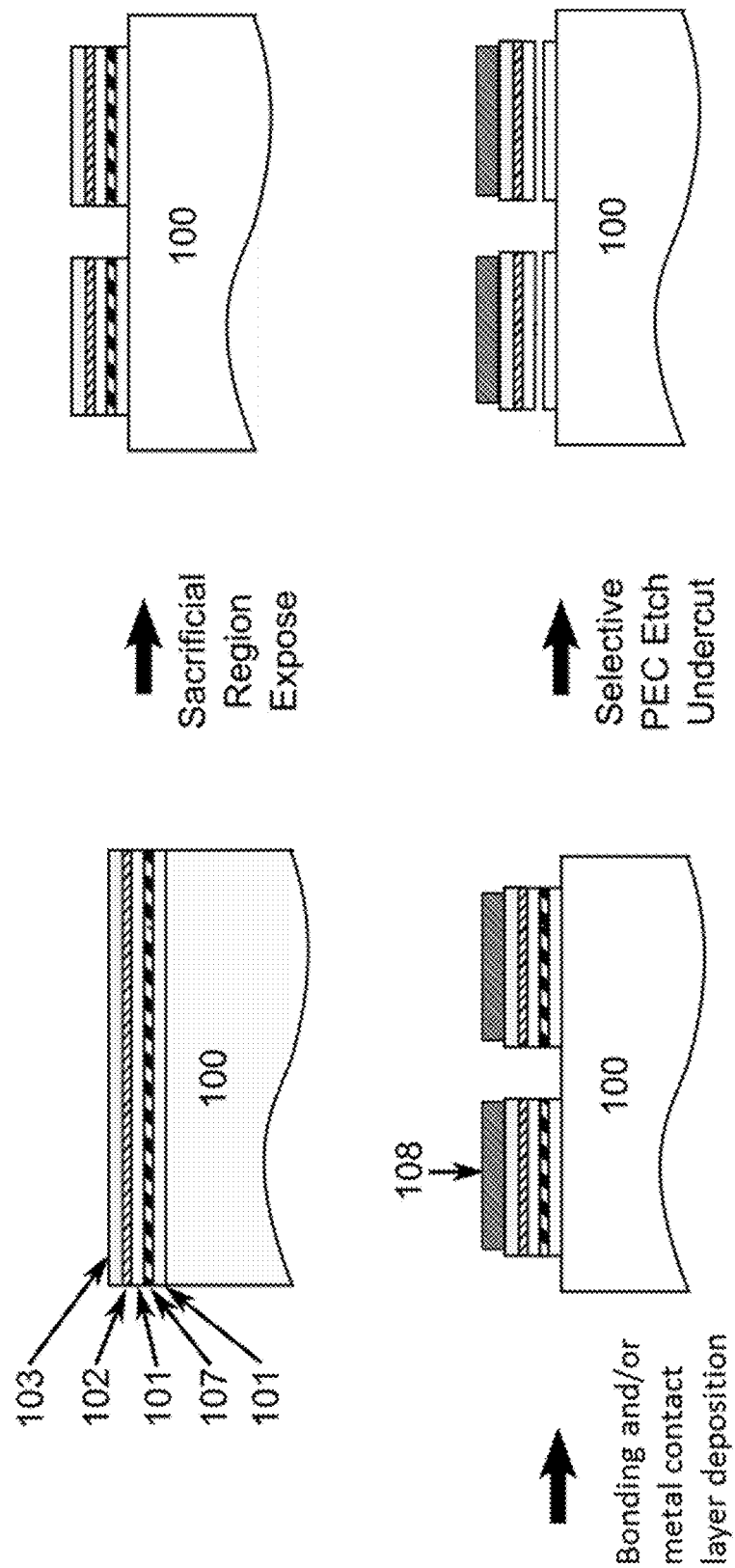

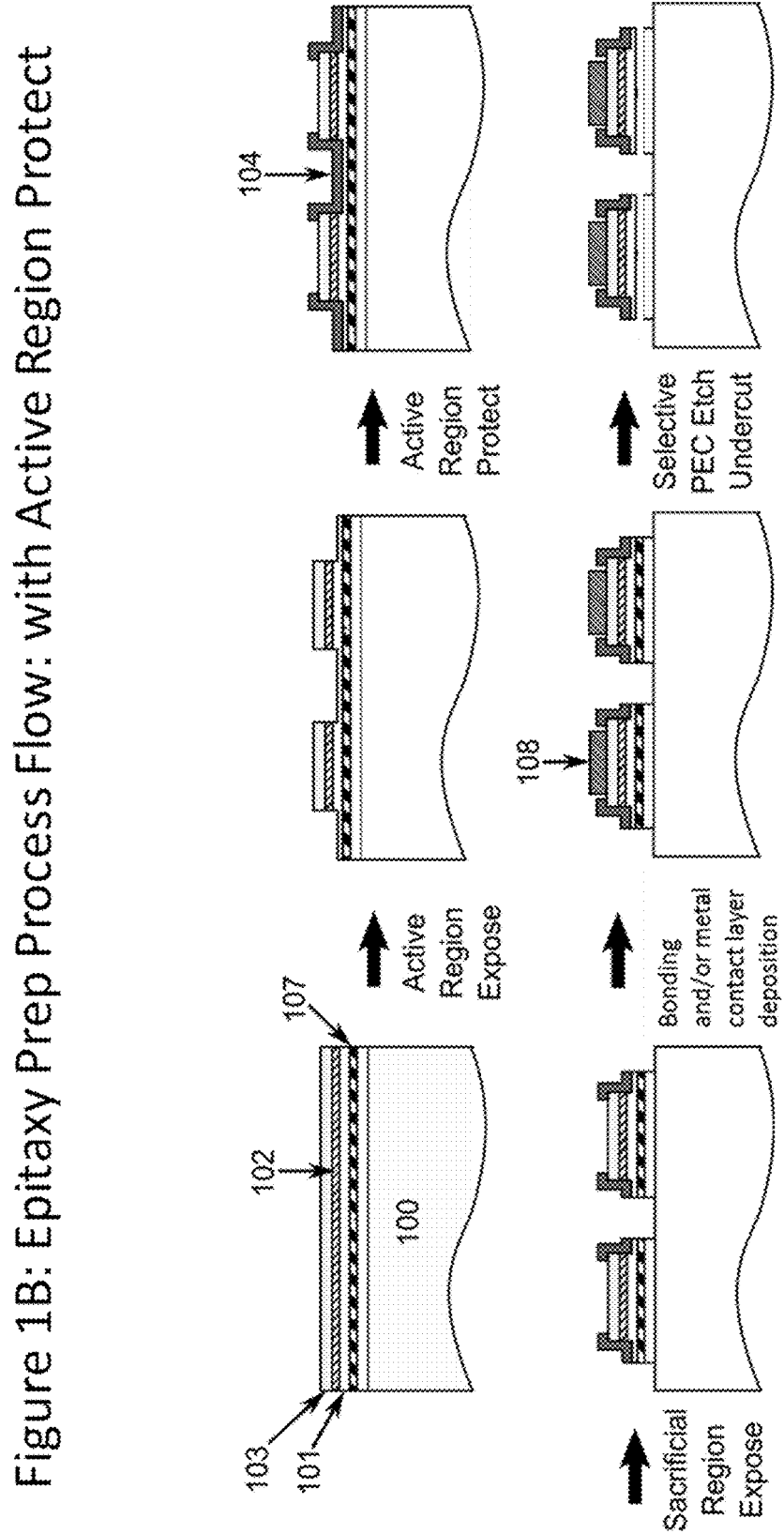
Figure 1B: Epitaxy Prep Process Flow: with Active Region Protect

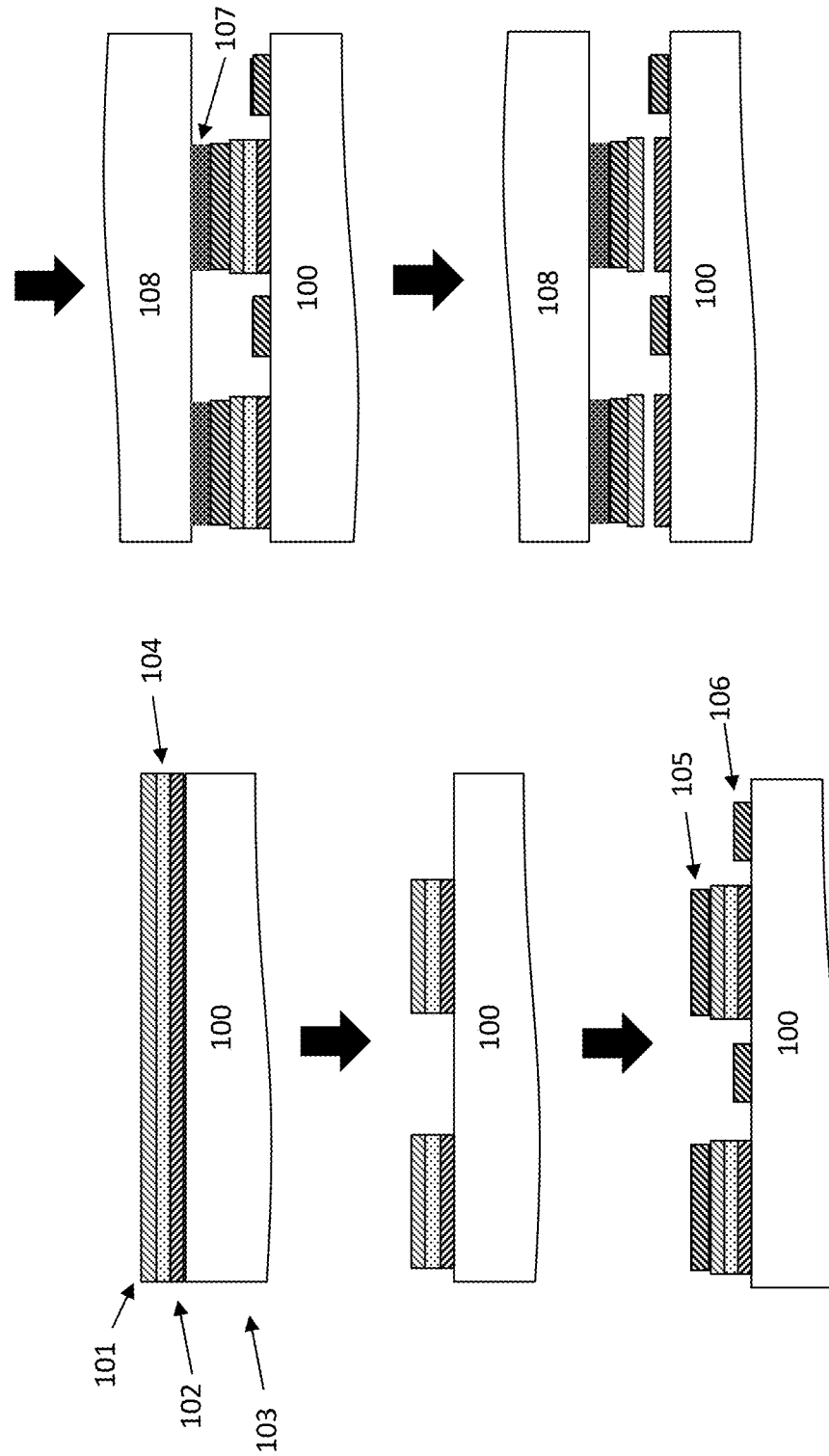
Figure 2A: Bond then etch

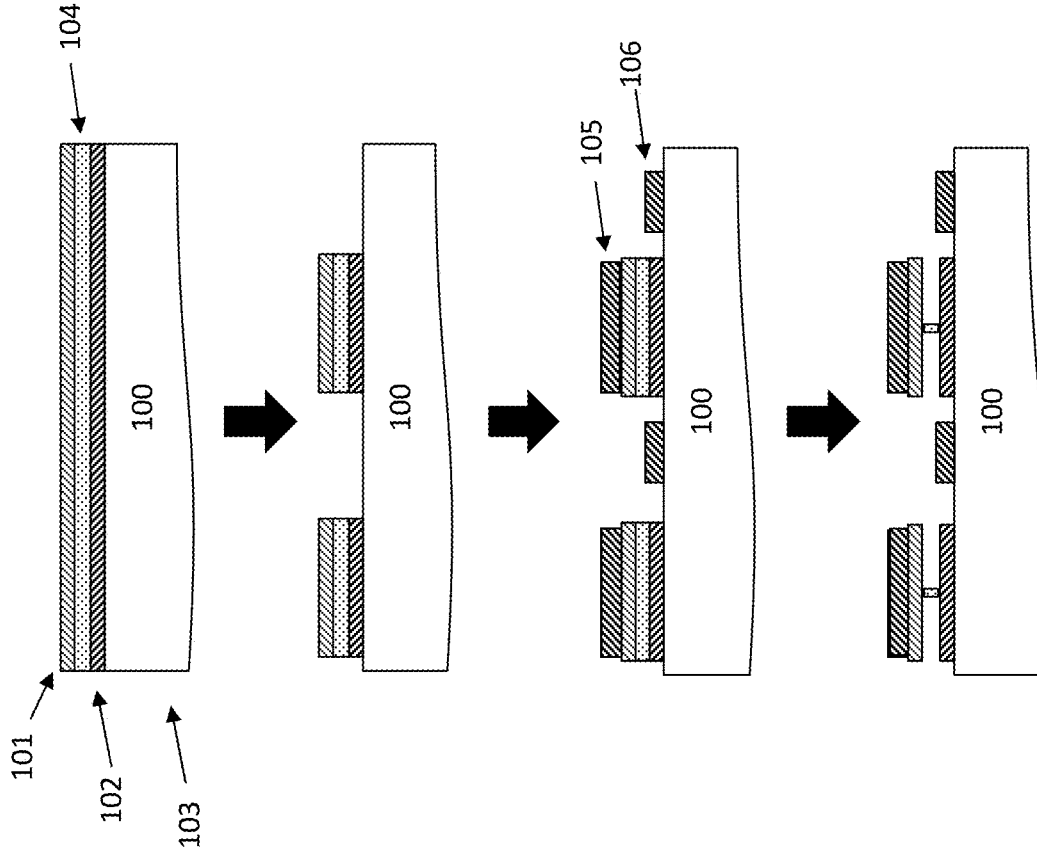
Figure 2B: Etch then bond: sacrificial layer not fully removed

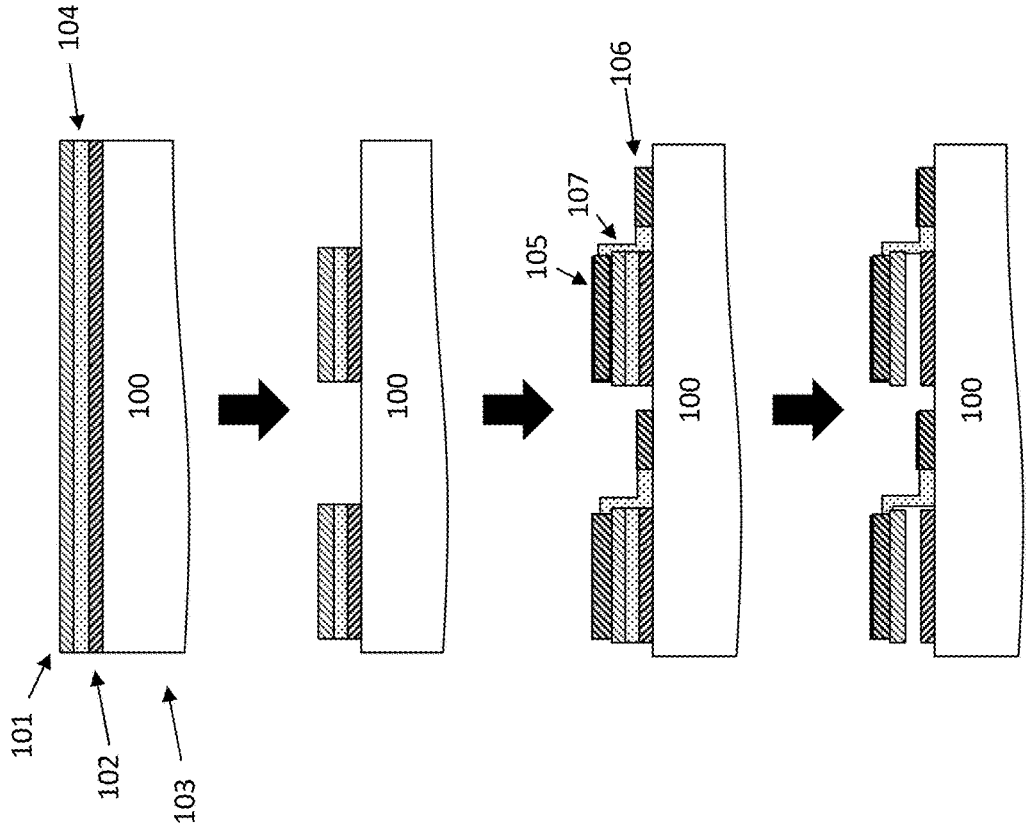
Figure 2C: Etch then bond: microfabricated anchor made from metal, ceramic, polymer, or the like.

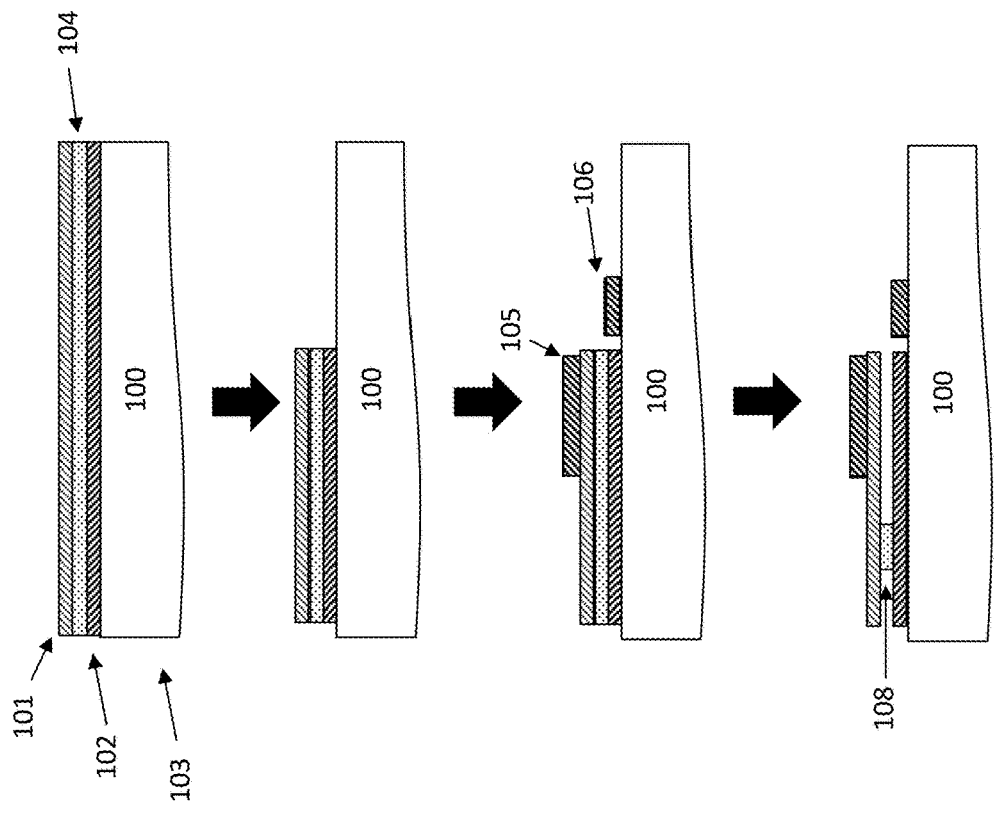
Figure 2D: Etch then bond: anchor composed of epitaxial semiconductor material

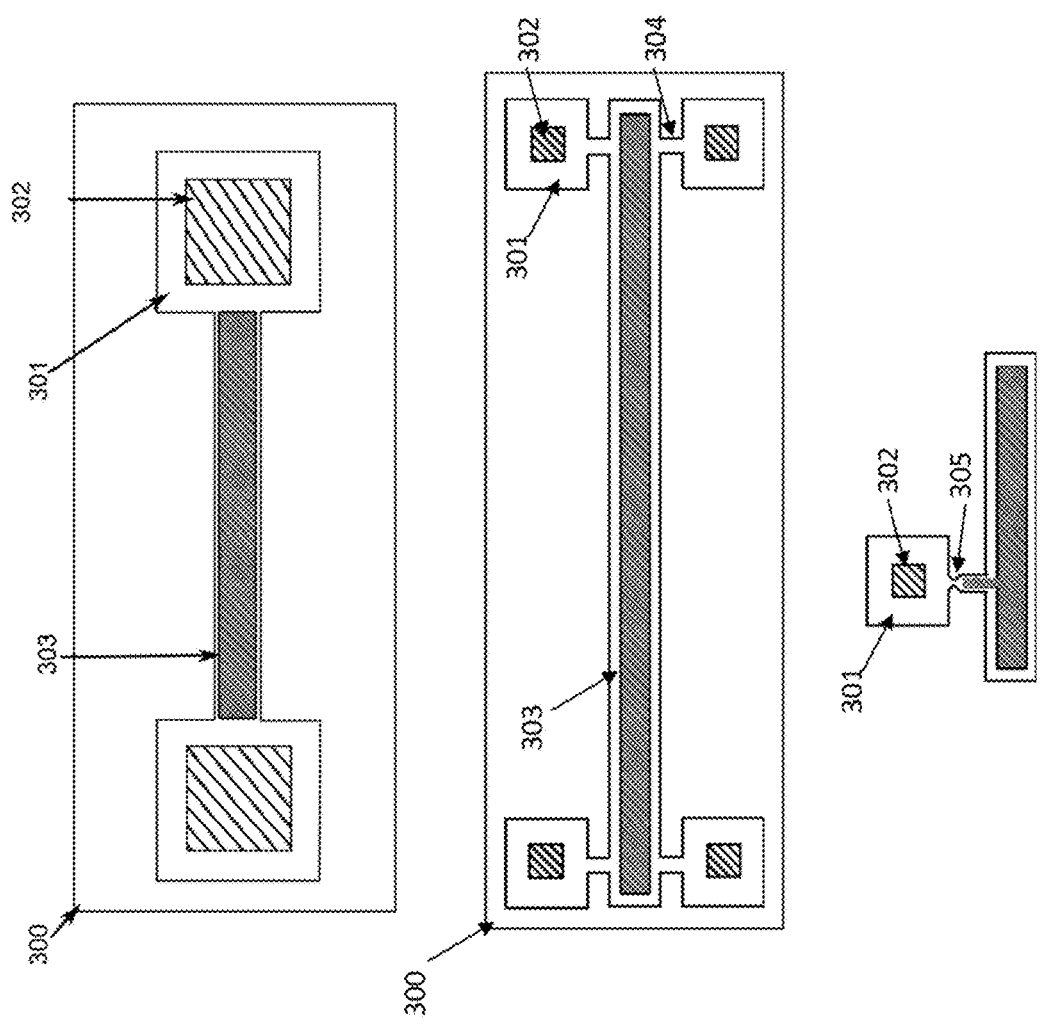
Figure 2E: Anchored PEC Undercut Top View

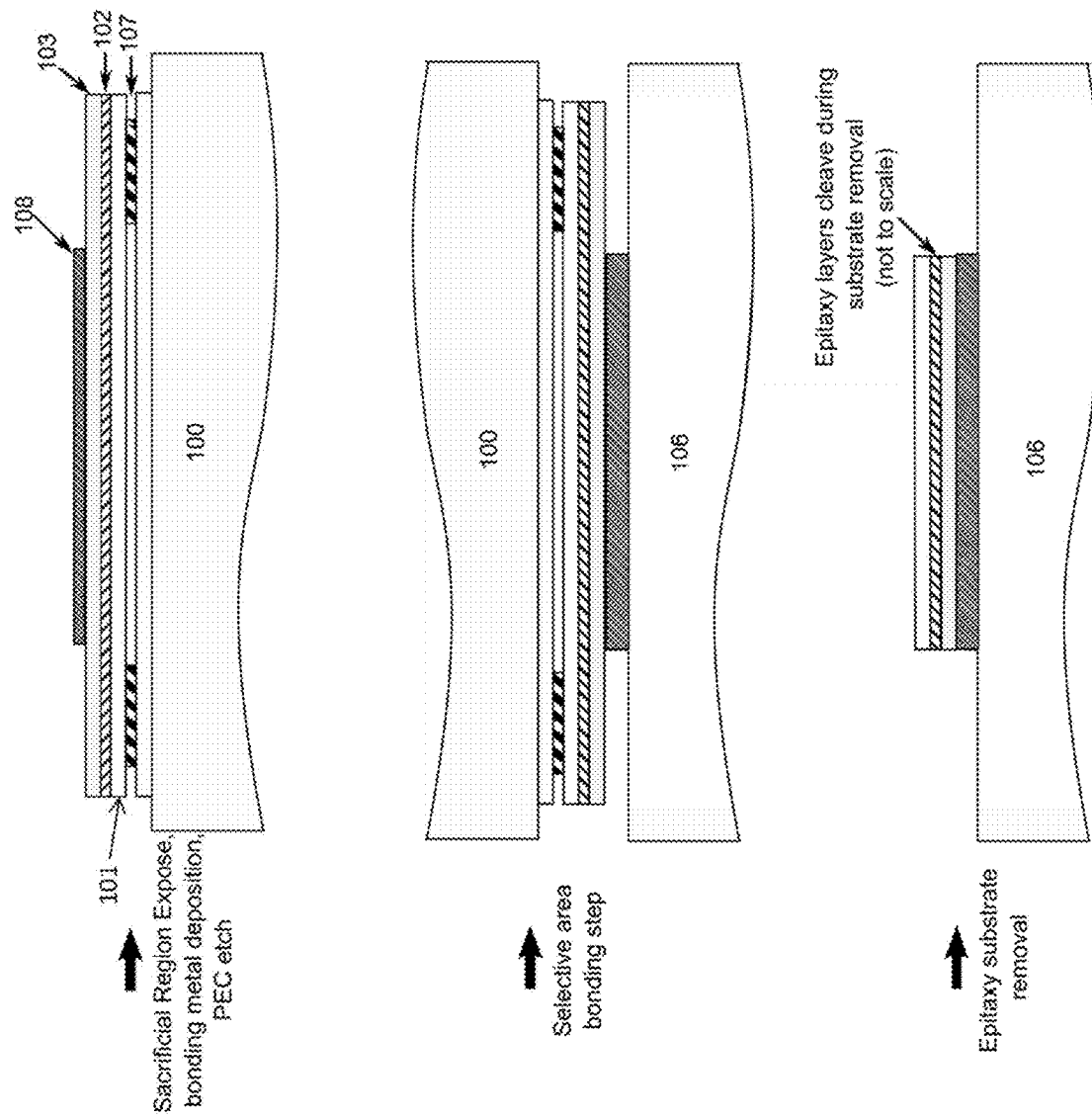

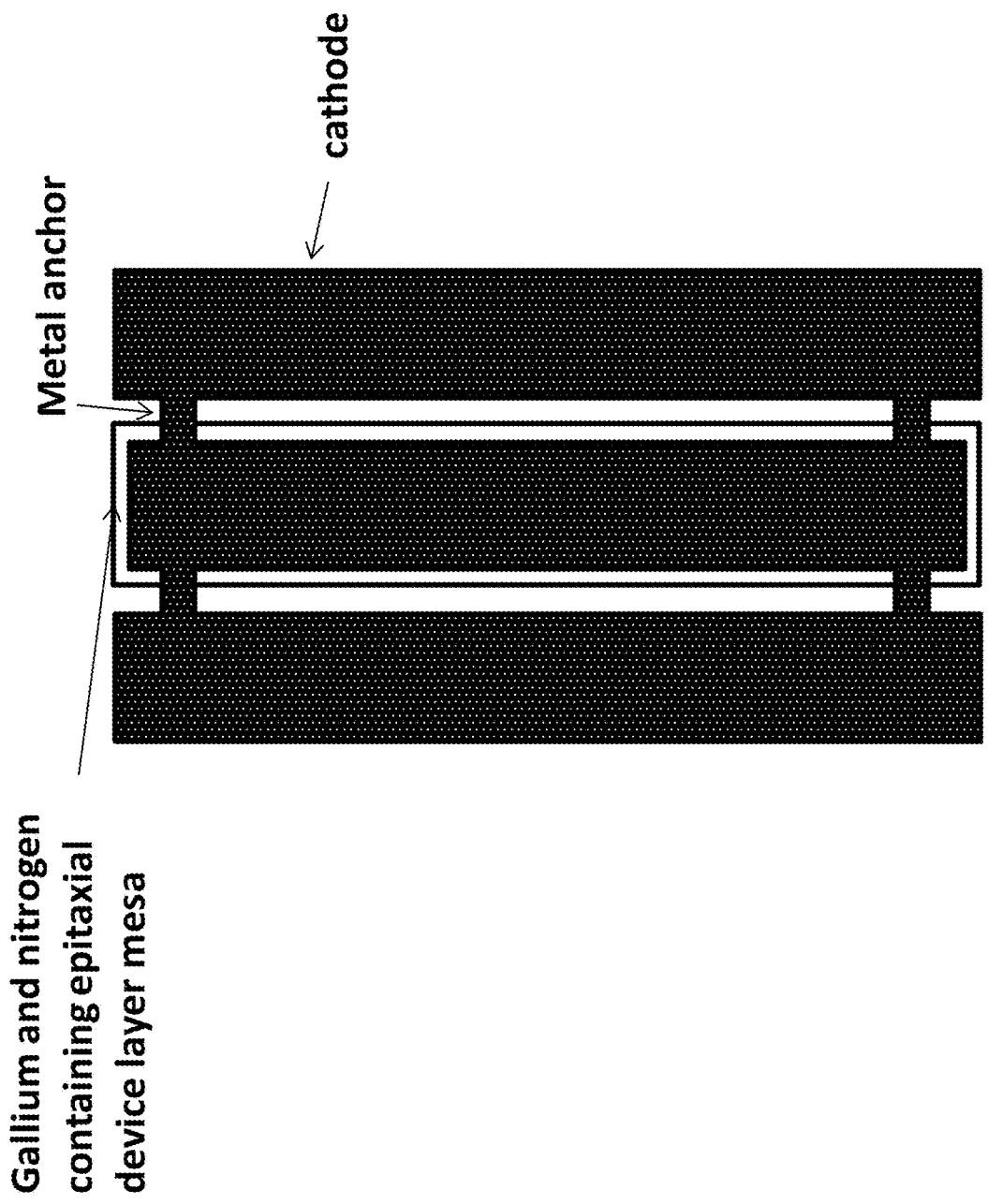
Figure 2G: plan view of transferrable mesa with metal anchors

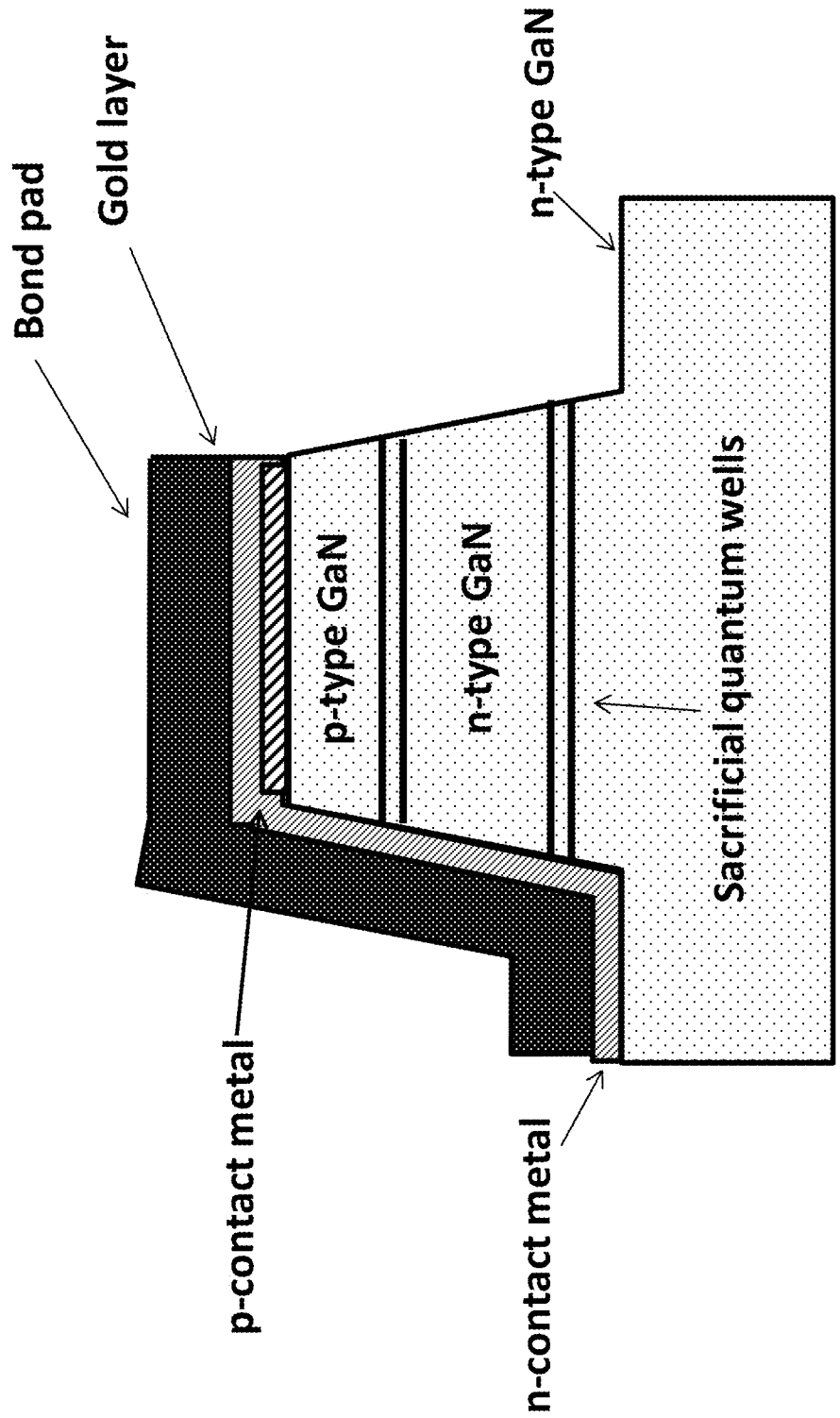
Figure 2H: cross sectional view of metal anchor

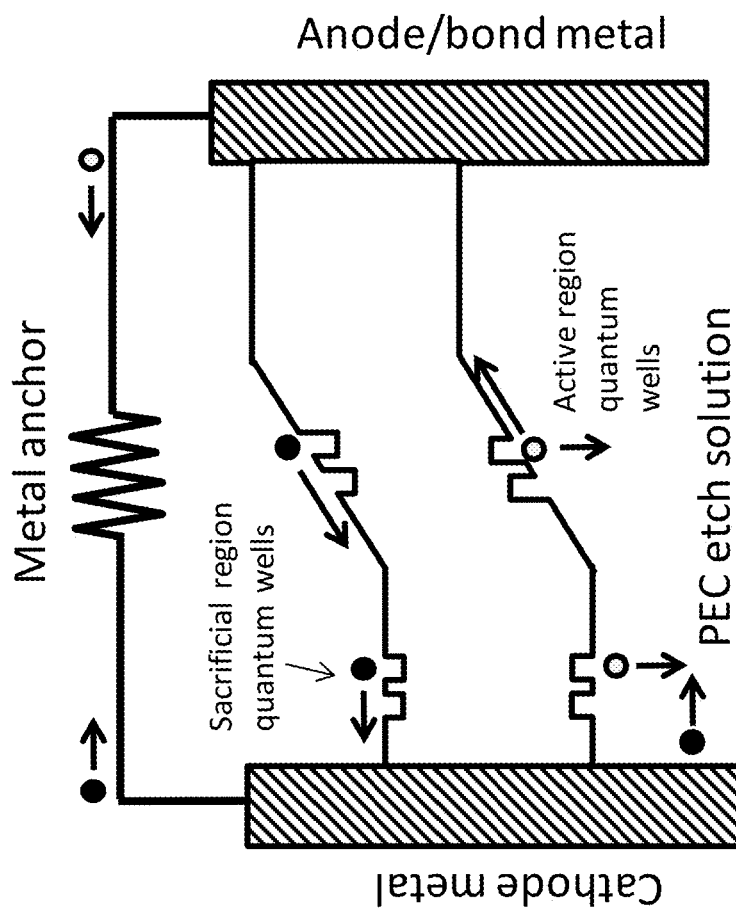
Figure 2I: Schematic of electrical circuit formed during PEC etching with metal anchors.

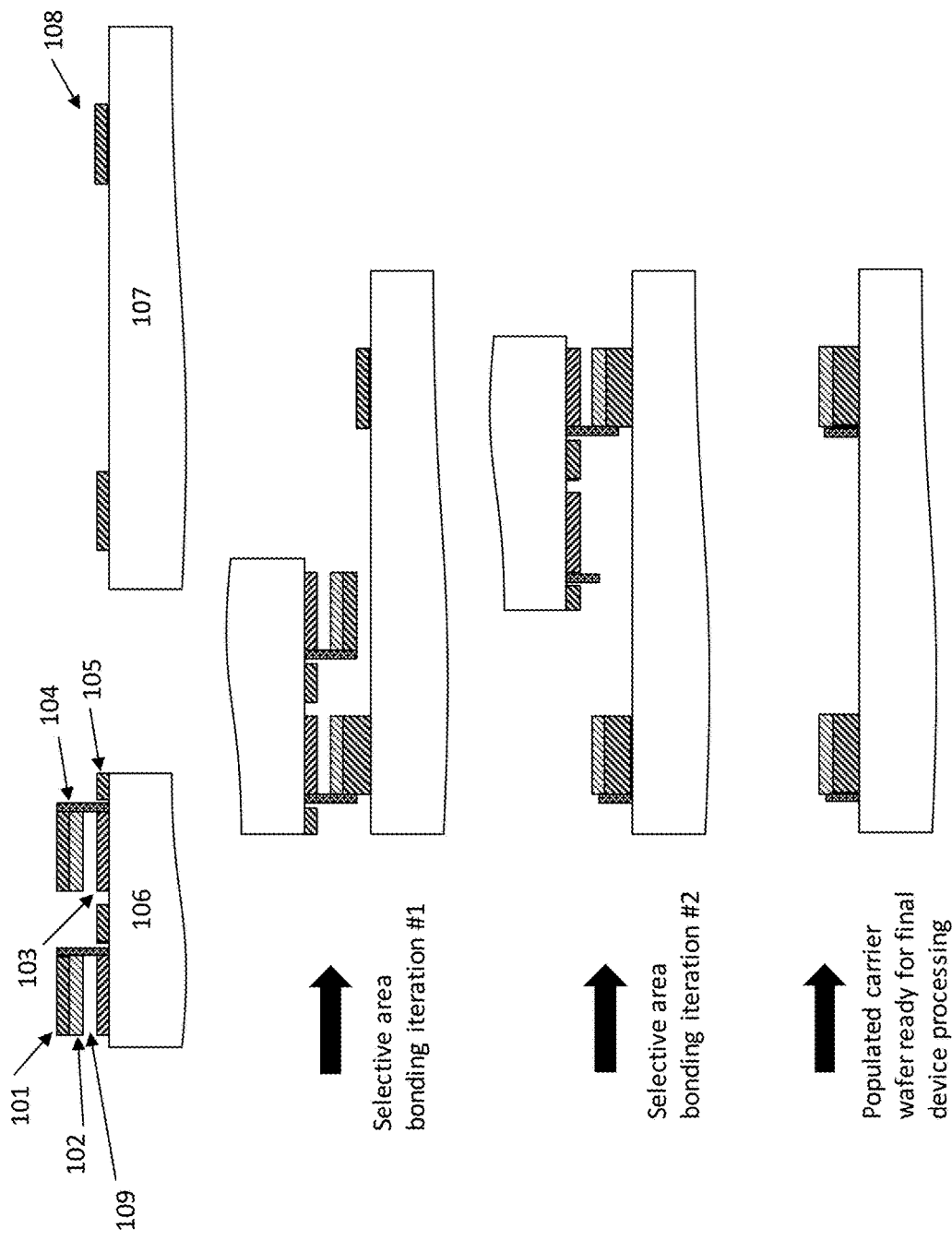
Figure 3A: Side view of die expansion with selective area bonding

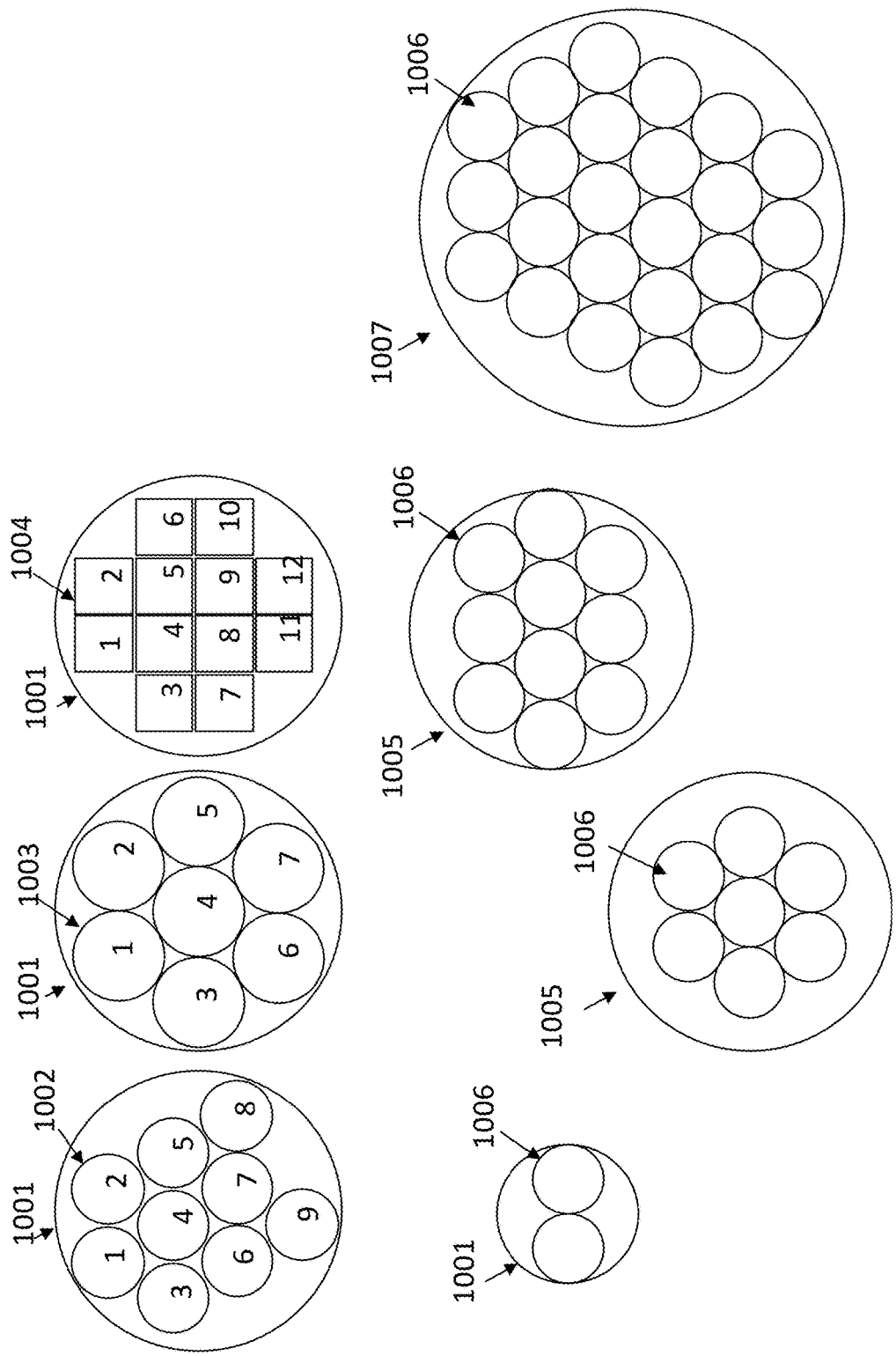
Figure 4A: Transferable regions for various substrate sizes on 100, 200 and 300 mm carrier wafers

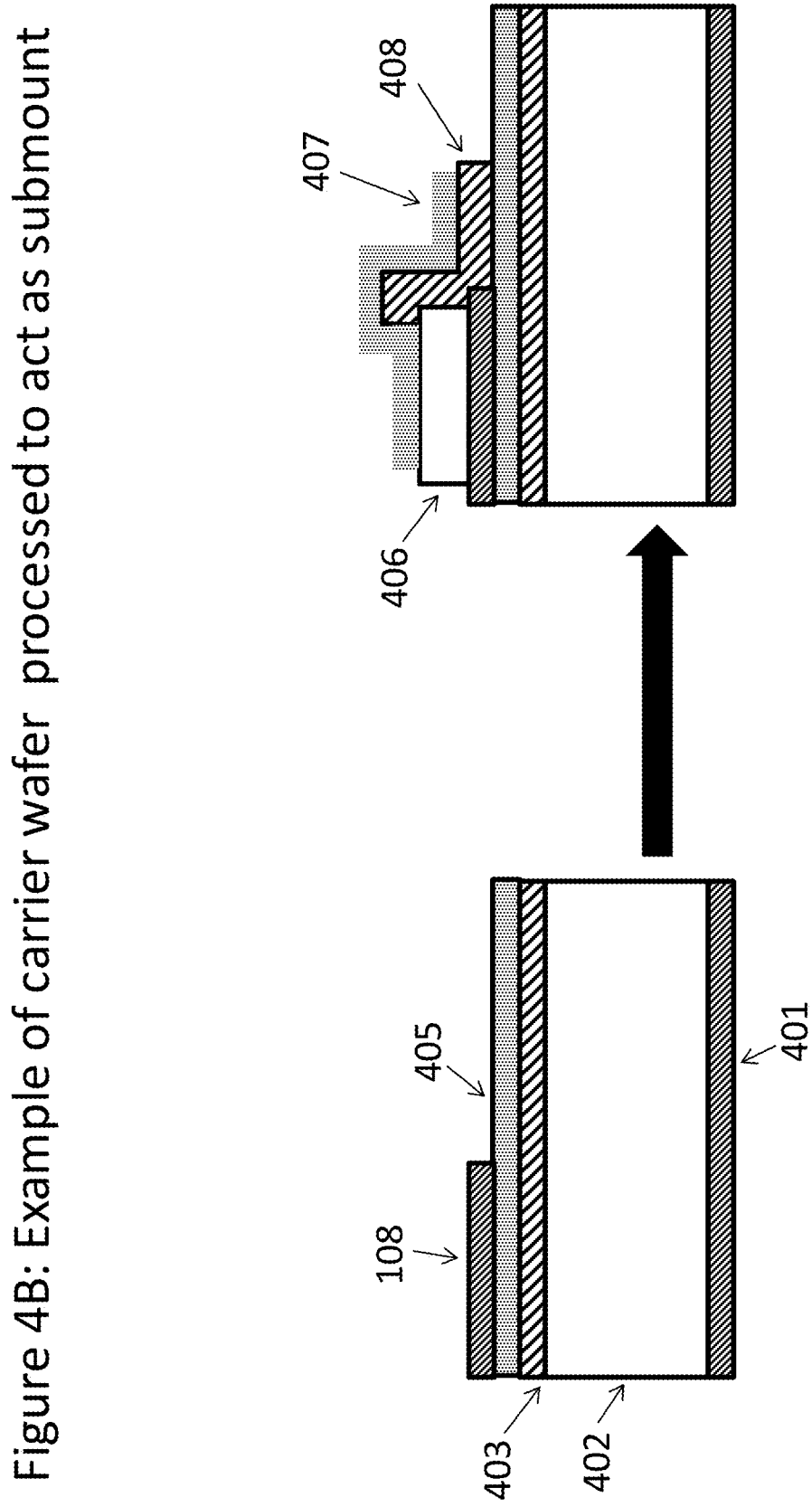
Figure 4B: Example of carrier wafer processed to act as submount

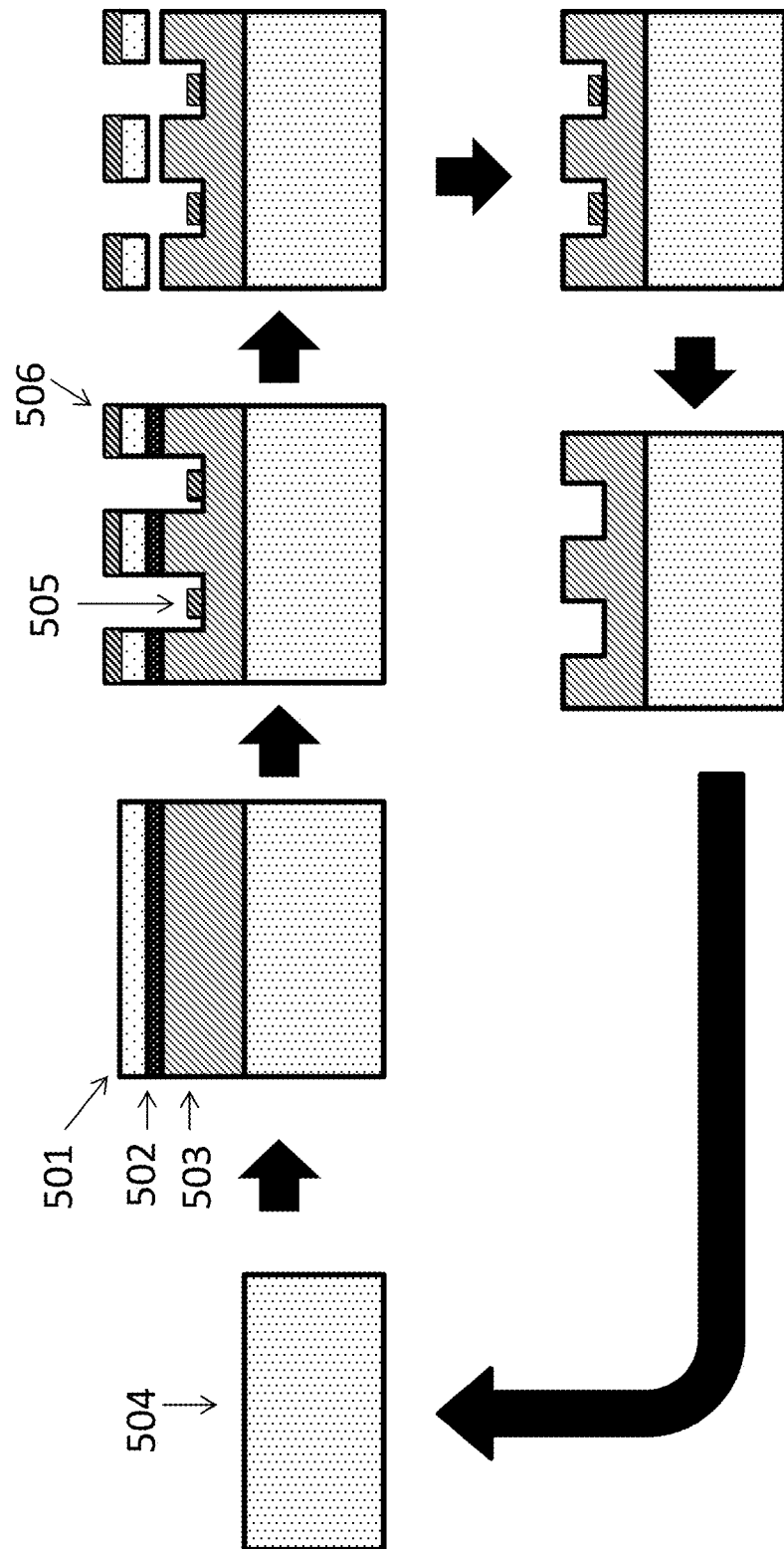
Figure 5. Example process flow of substrate reuse

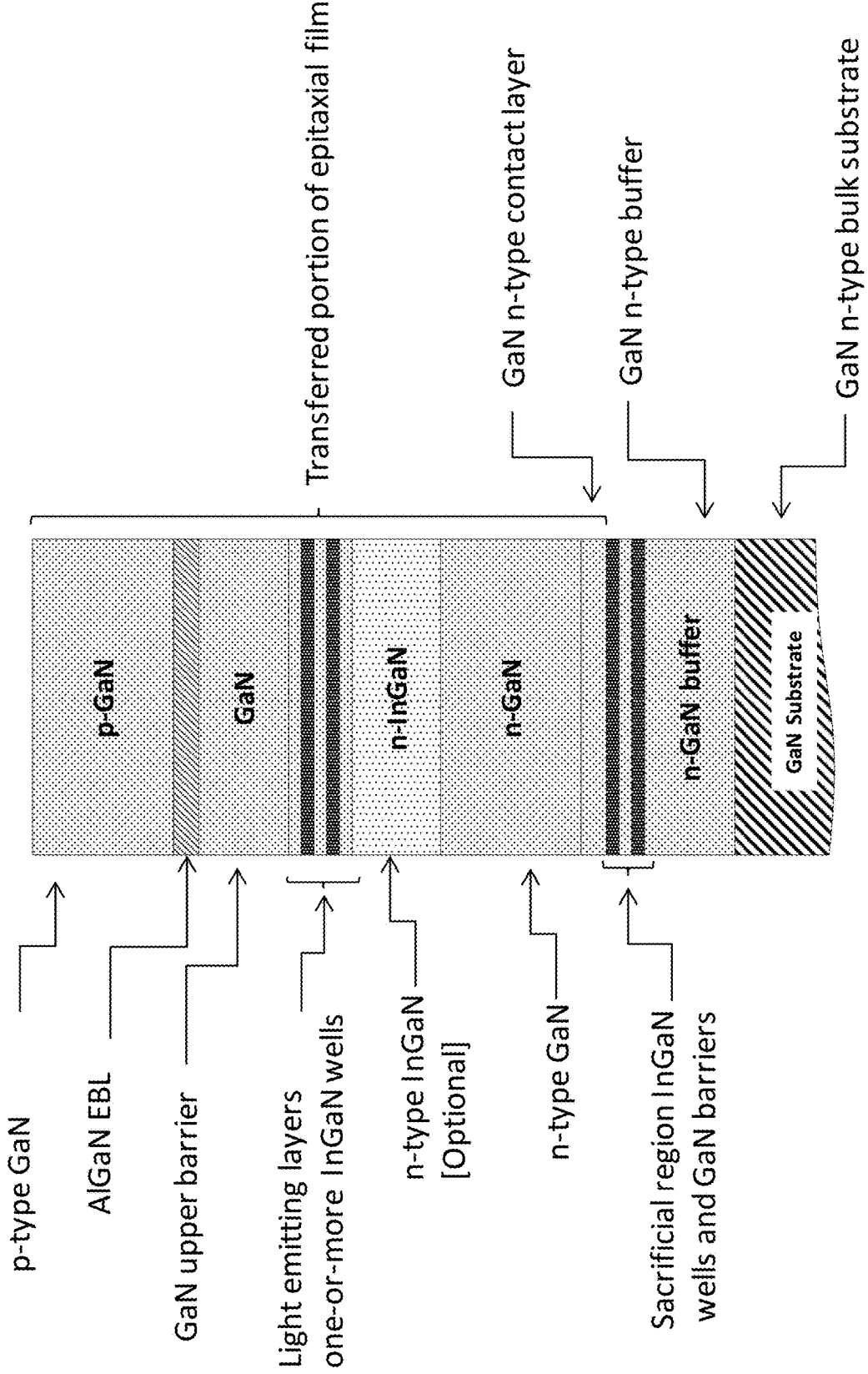
Figure 6A: Schematic of epitaxial structure of LED

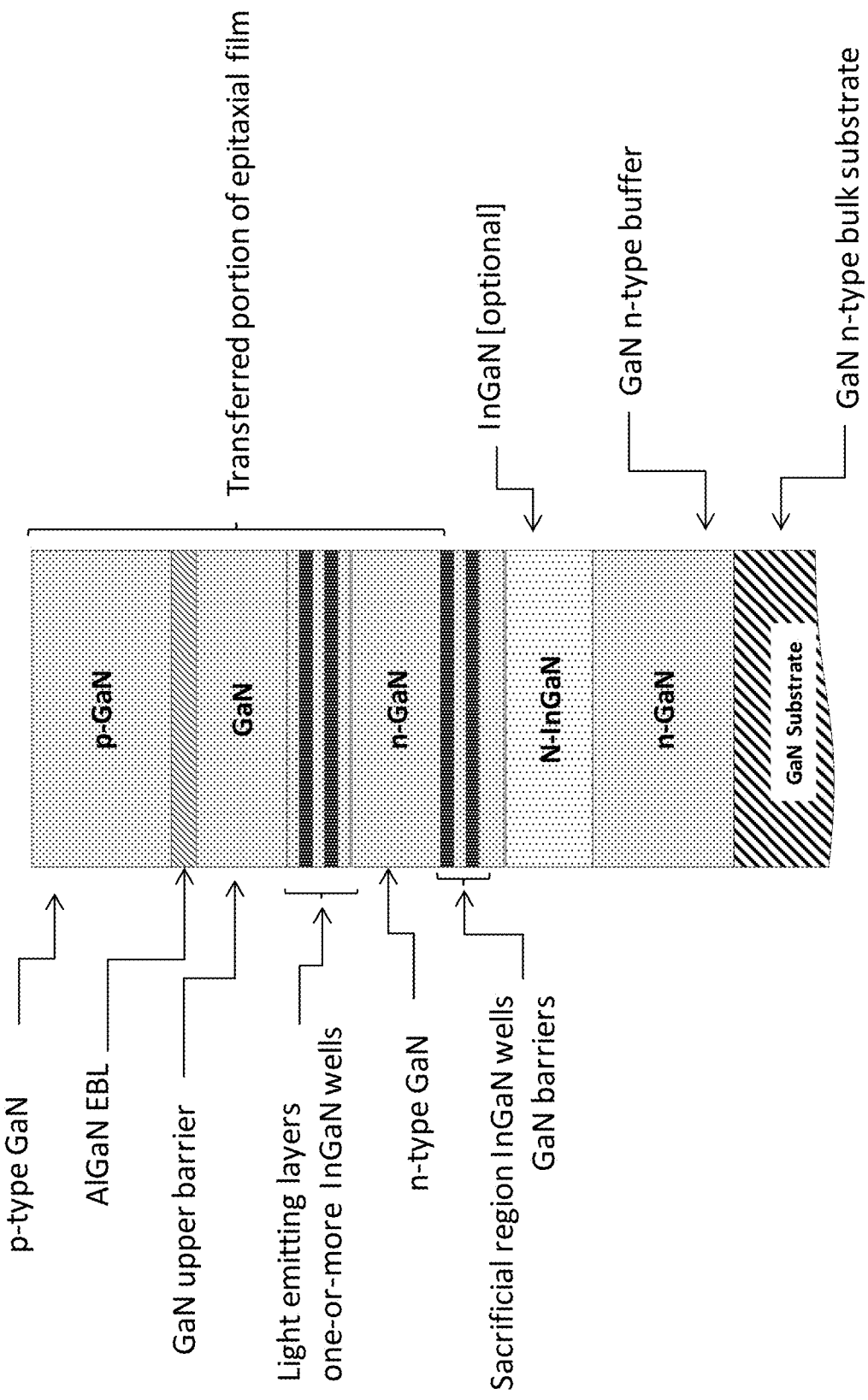
Figure 6B: Schematic of epitaxial structure of LED

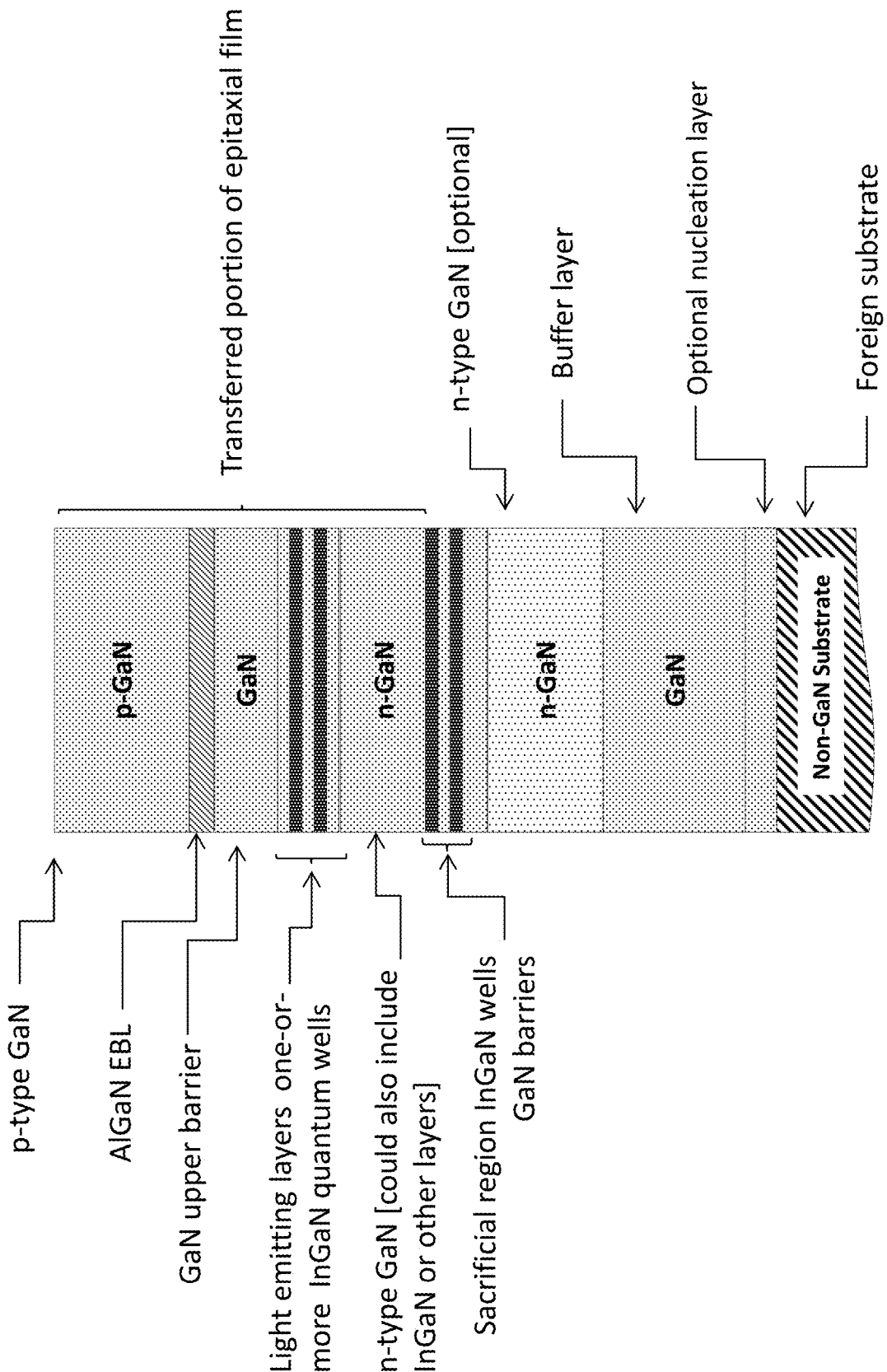
Figure 6C: Schematic of epitaxial structure of LED

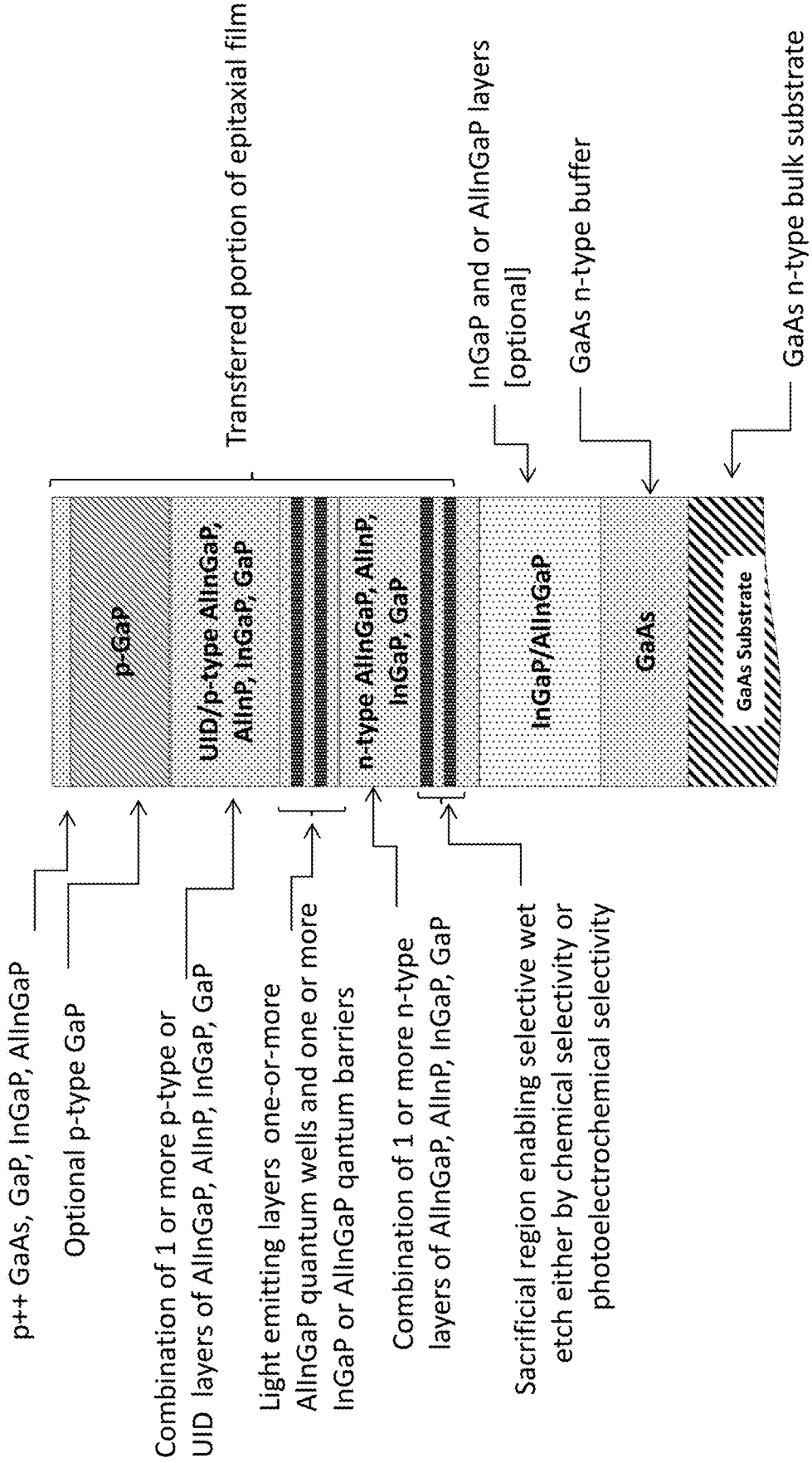
Figure 6D: Schematic of epitaxial structure of LED

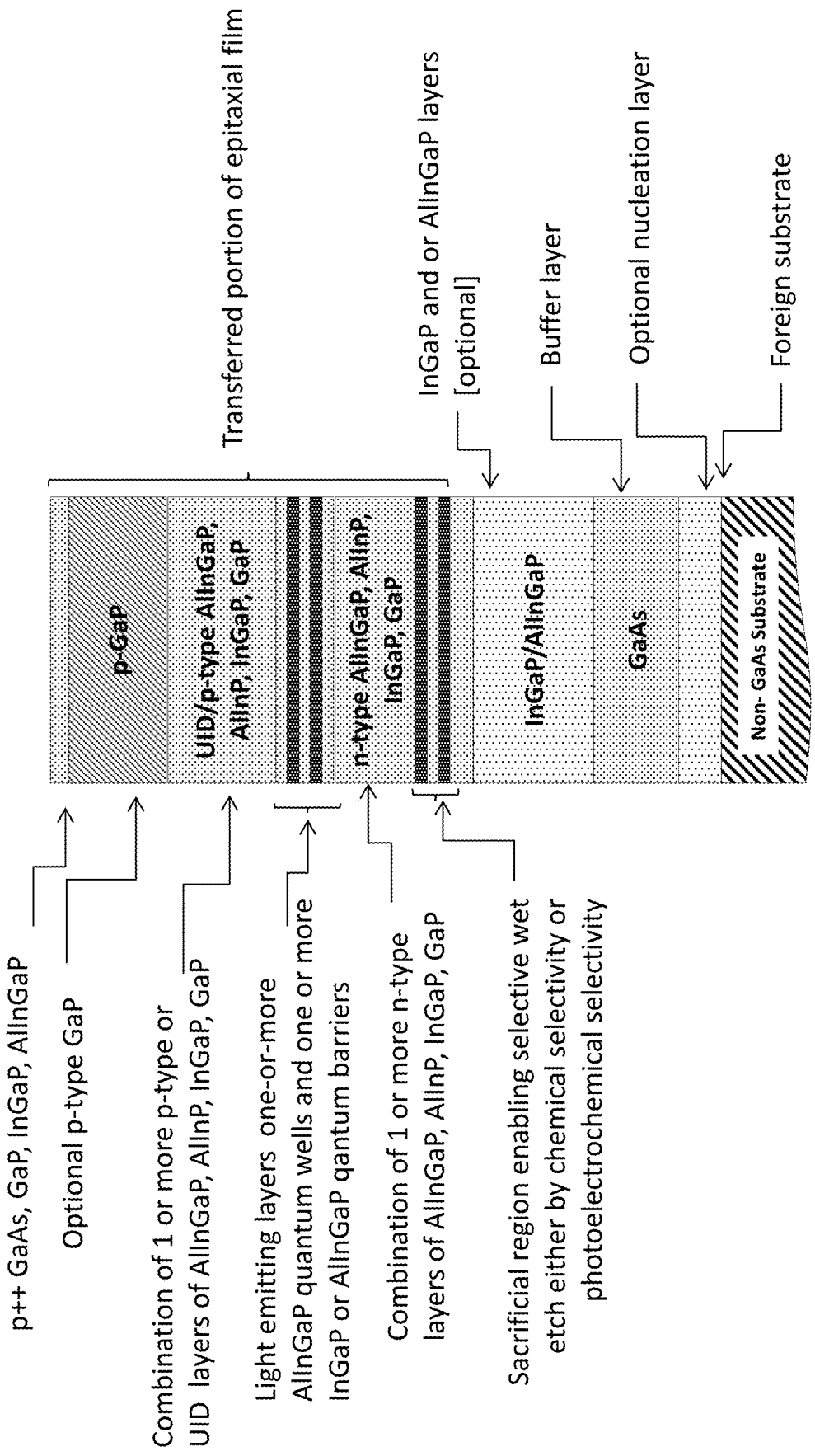
Figure 6E: Schematic of epitaxial structure of LED

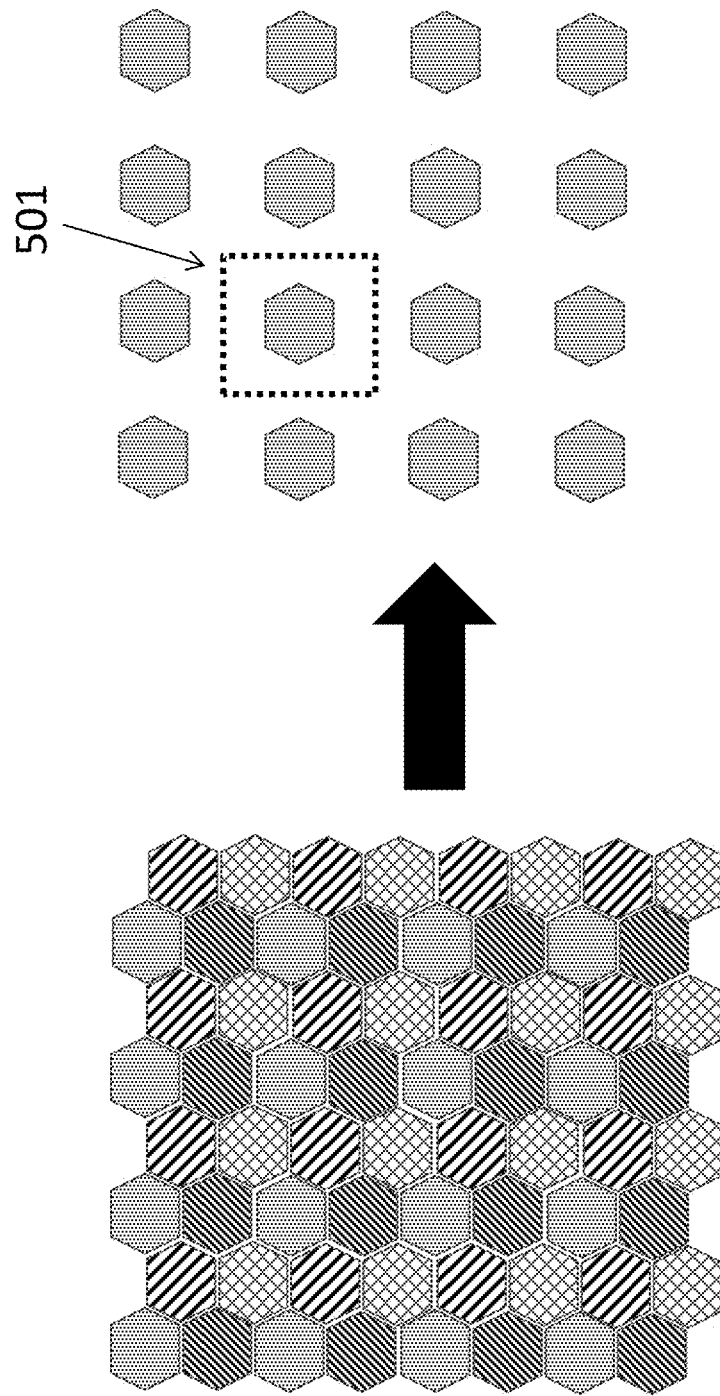
Figure 6F: die expansion of LEDs with non-rectangular shape

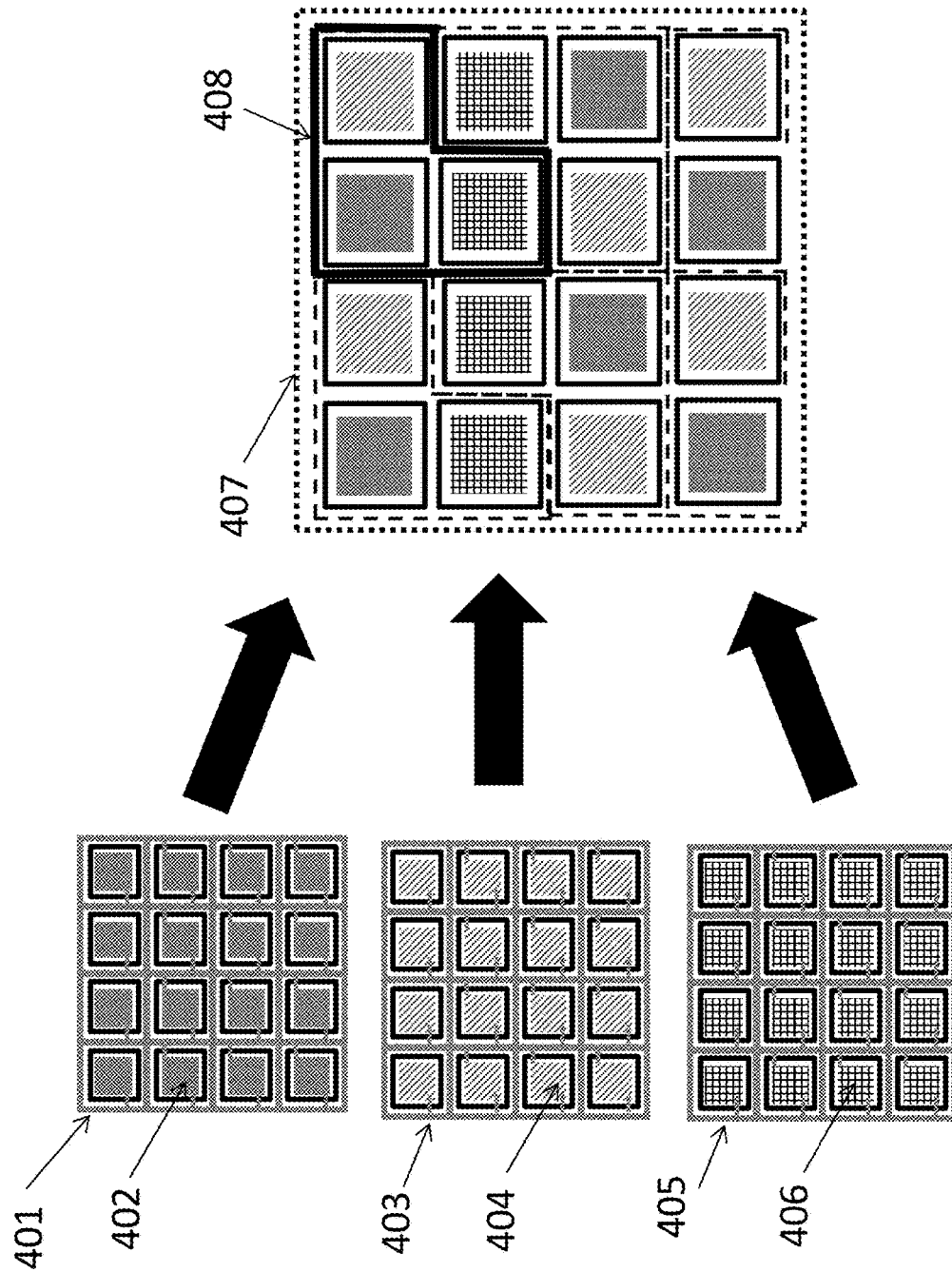
Figure 6G: die expansion of LEDs

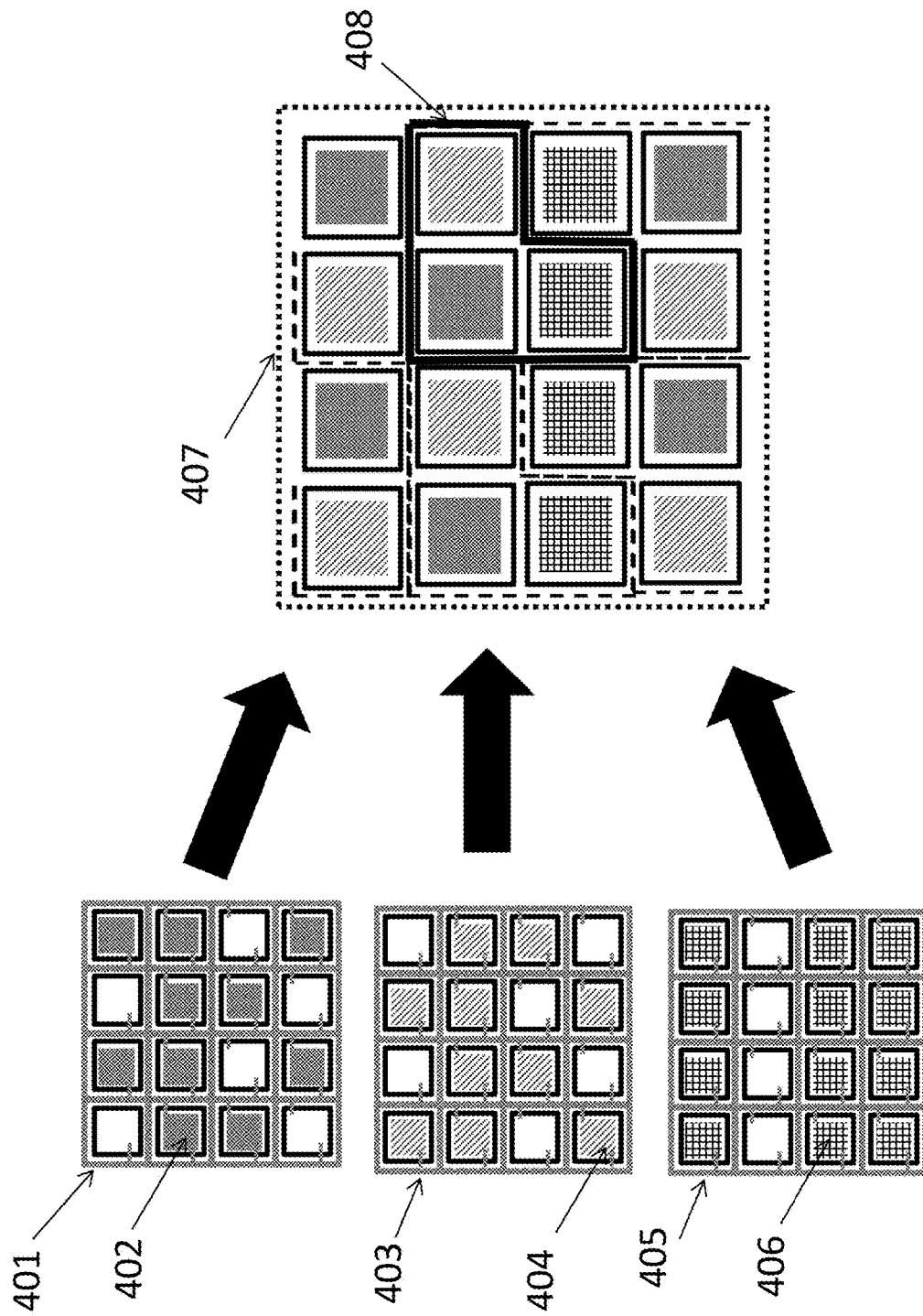

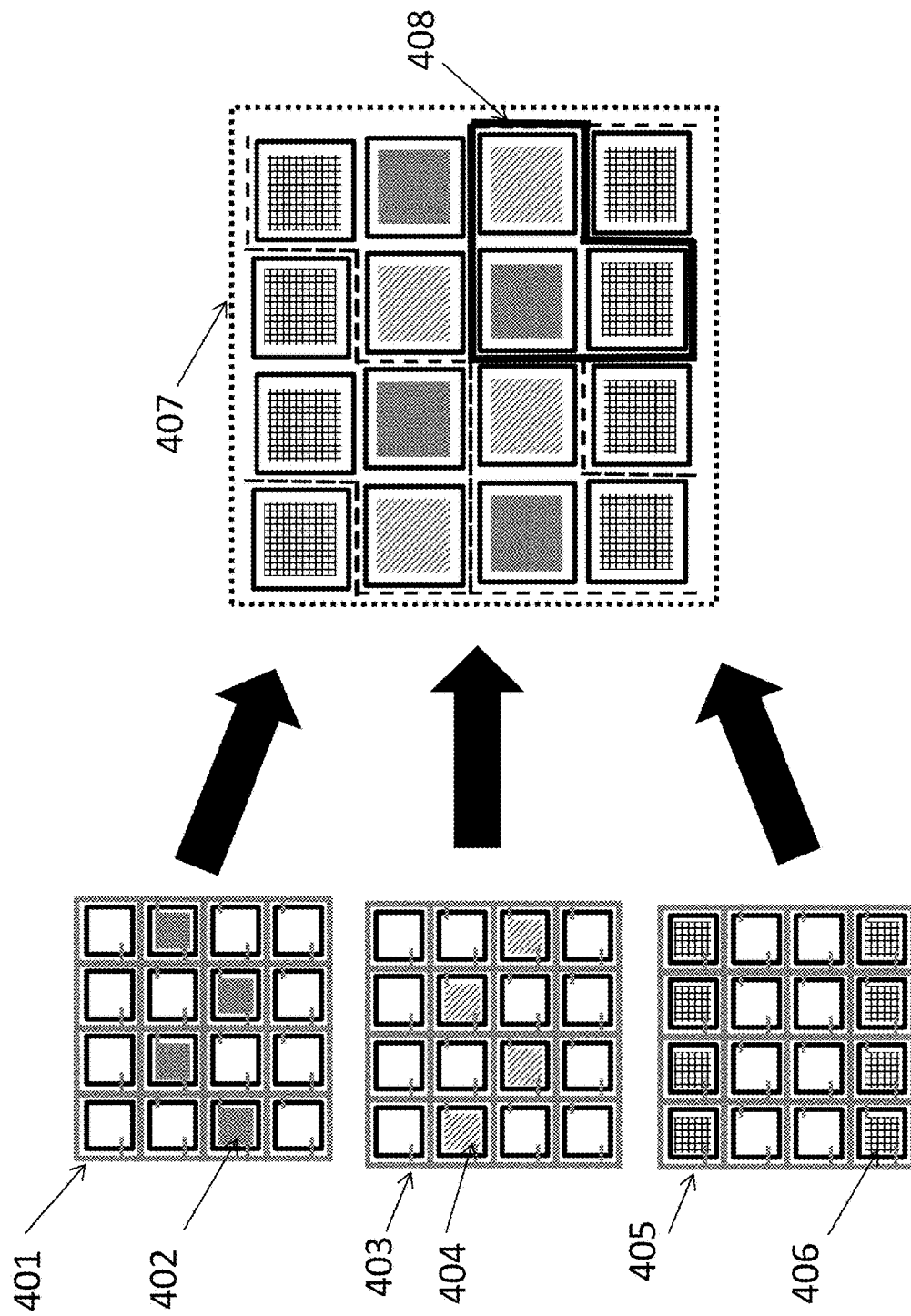
Figure 6I: die expansion of LEDs

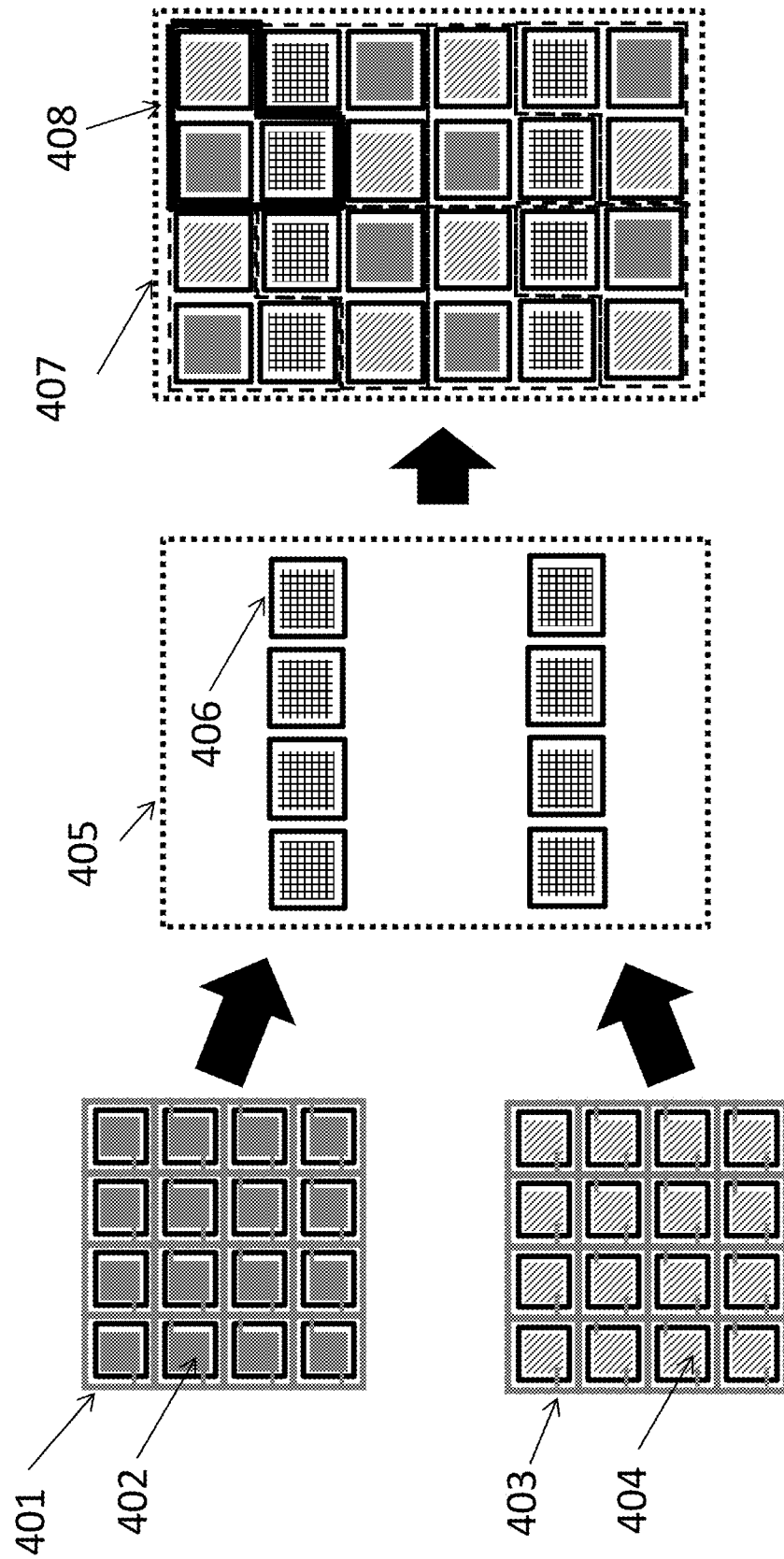

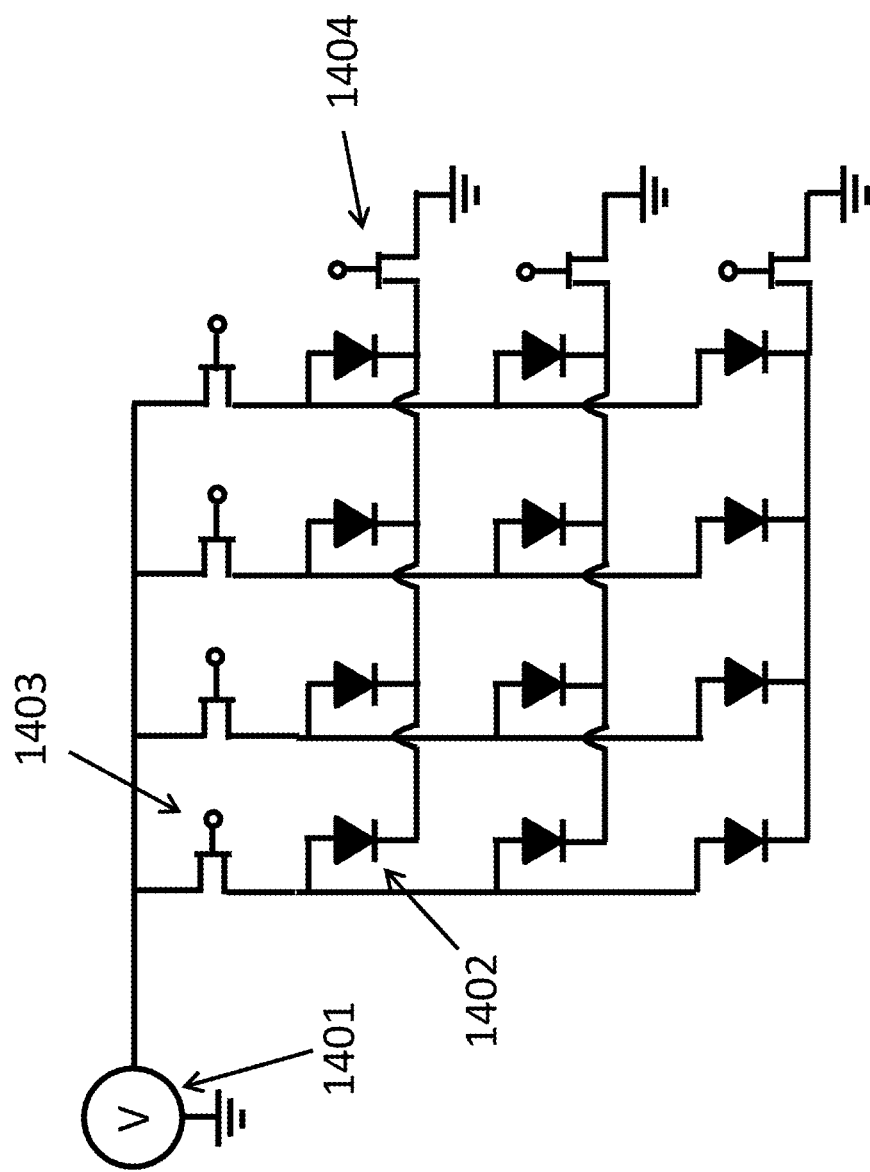
Figure 6K: Example of multiplexing in a transferred micro LED display array

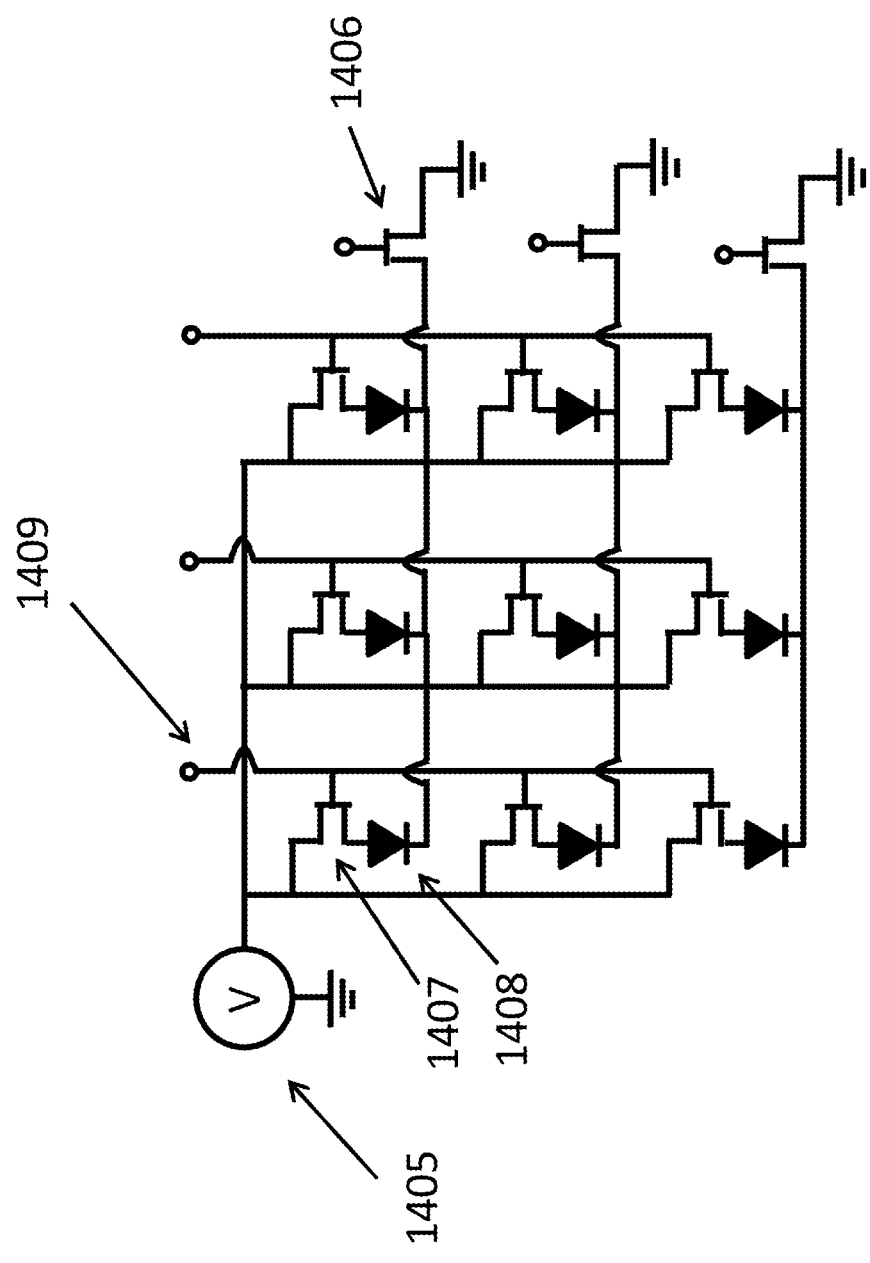
Figure 6L: Example of multiplexing in a transferred micro LED display array

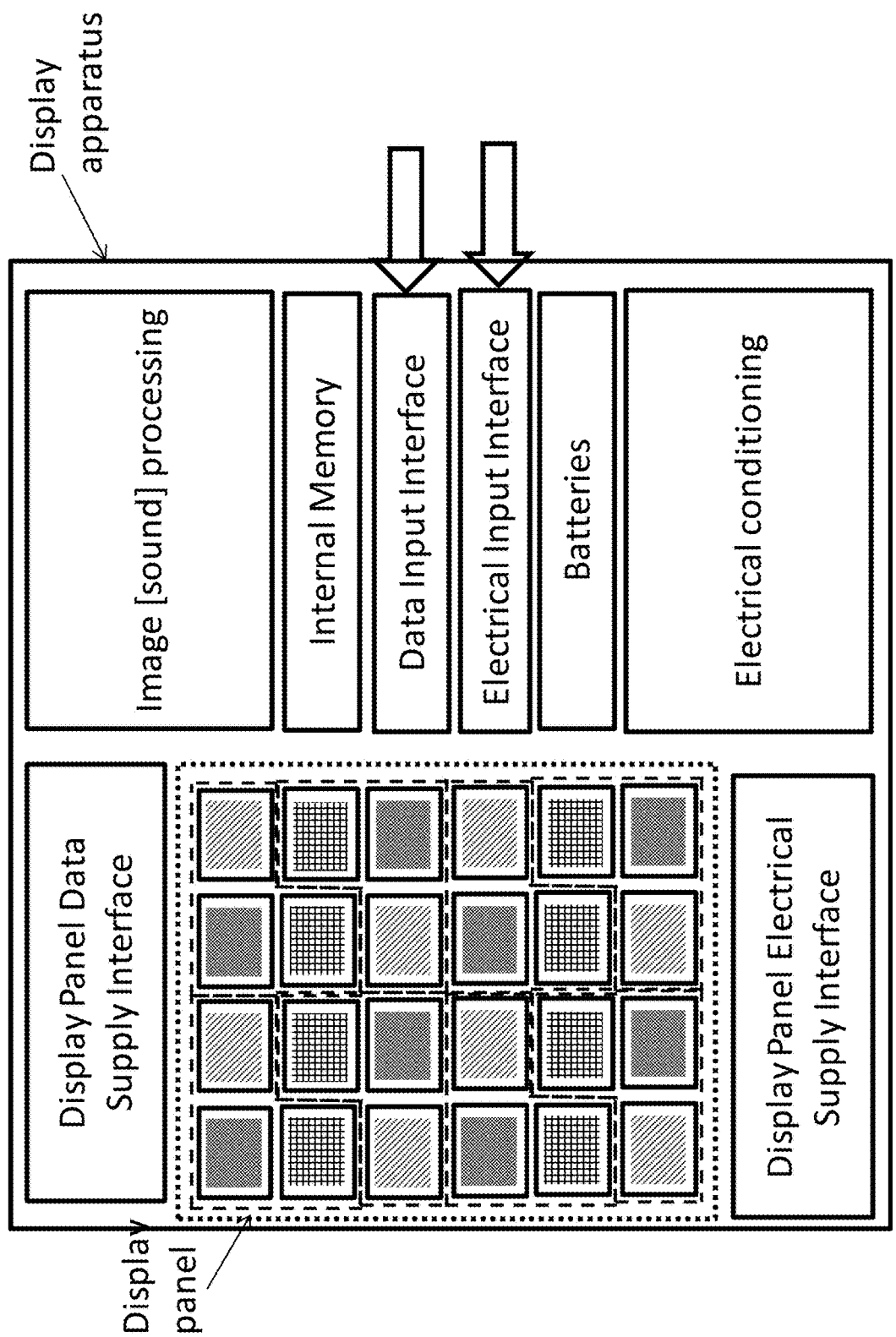
Figure 6M: Display apparatus

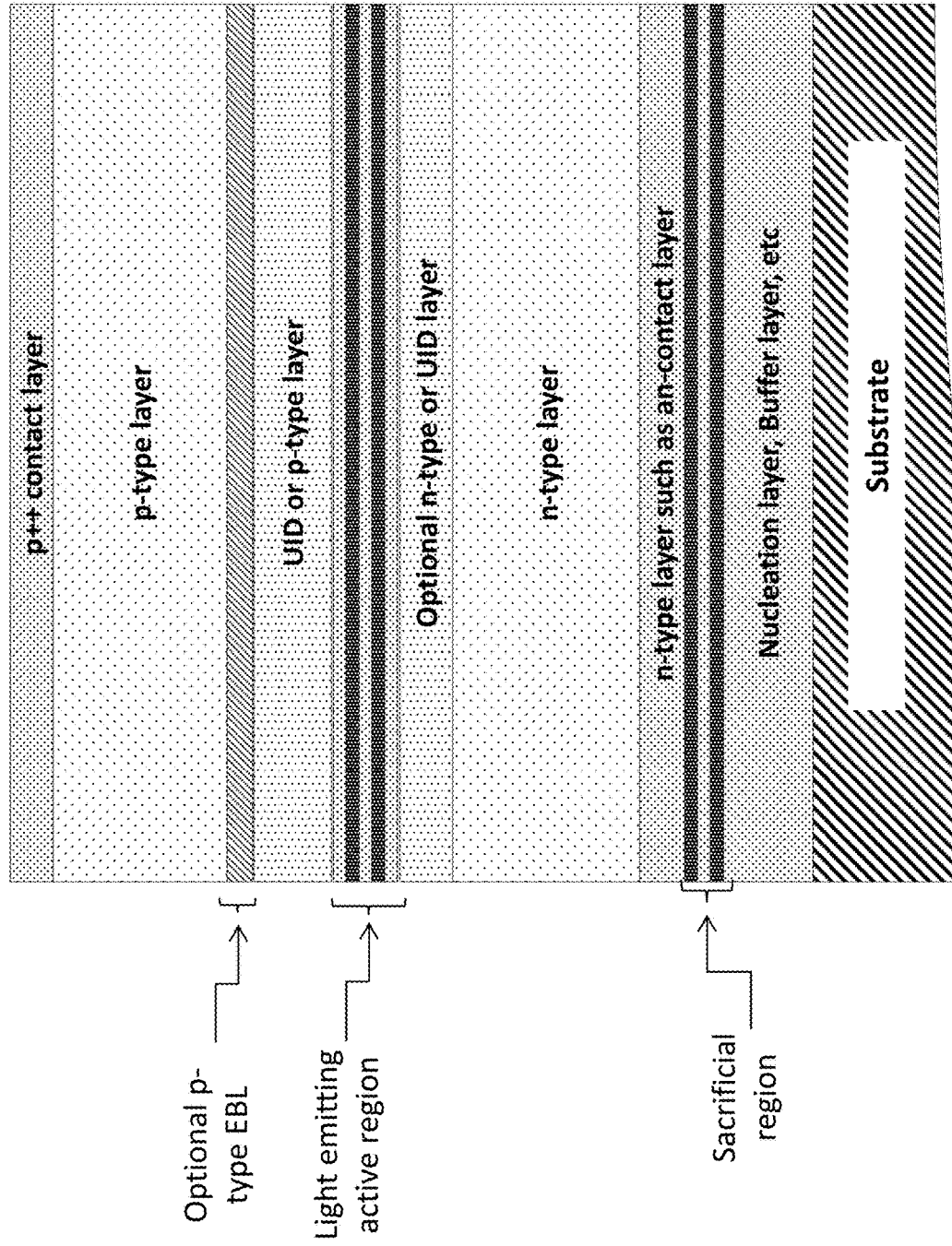
Figure 7A: Example of LED epitaxial structure

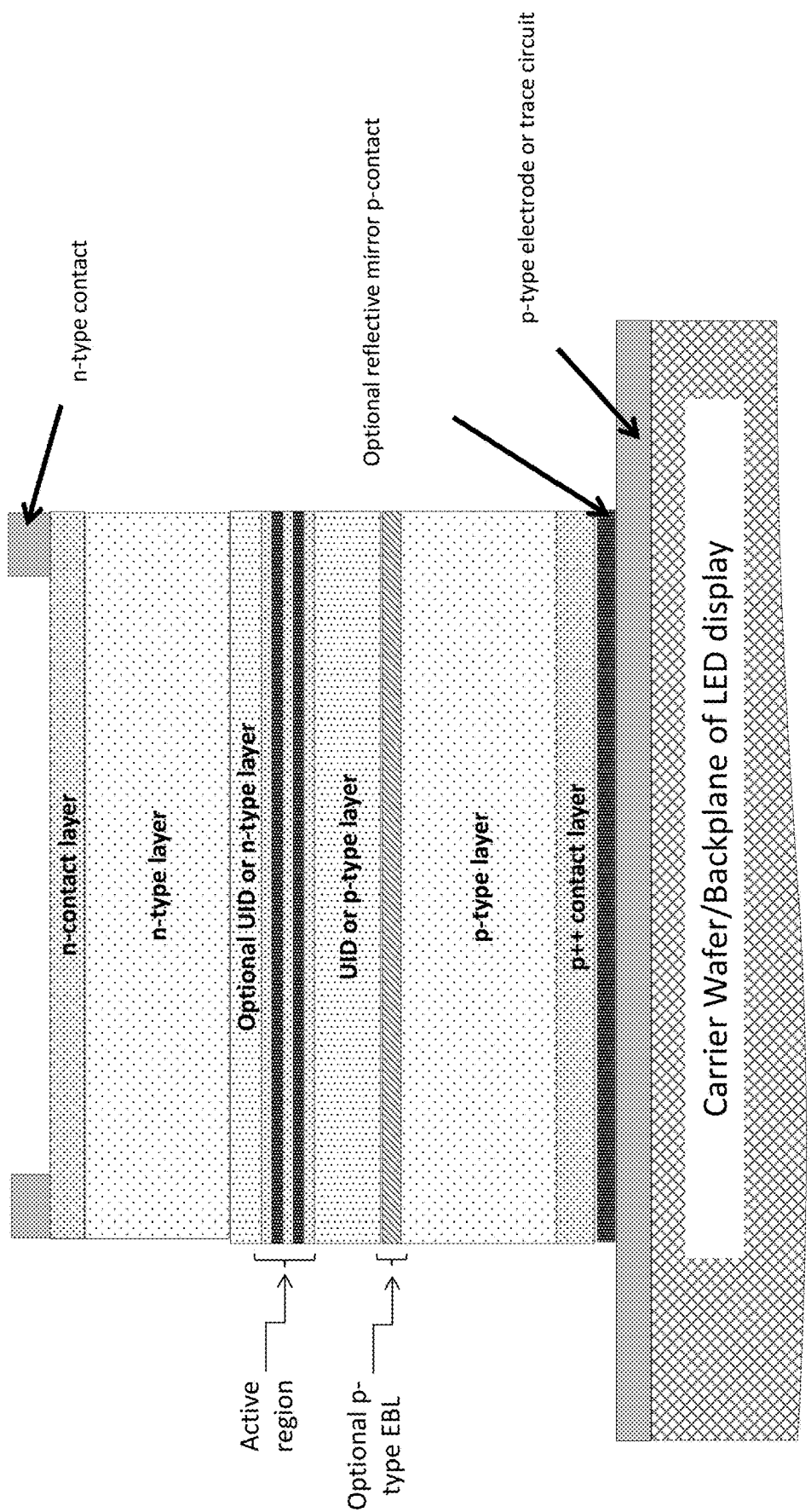
Figure 7B: Example of LED device structure on carrier wafer

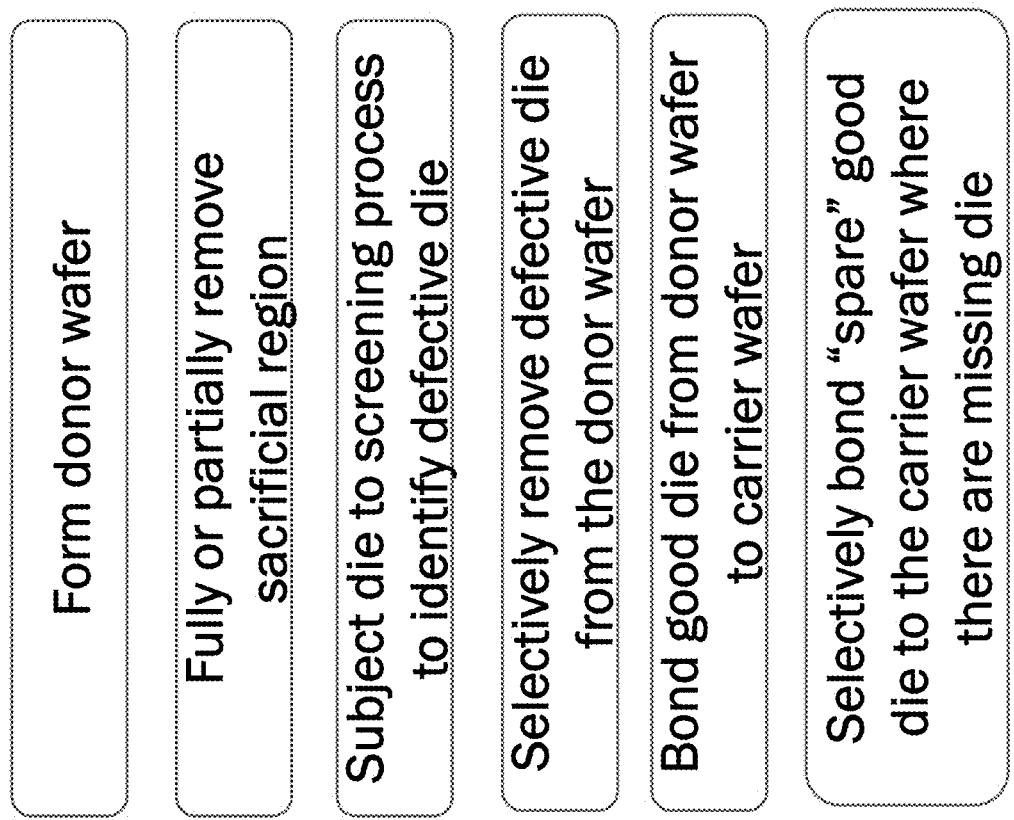
Figure 8A: Screening after removing sacrificial region

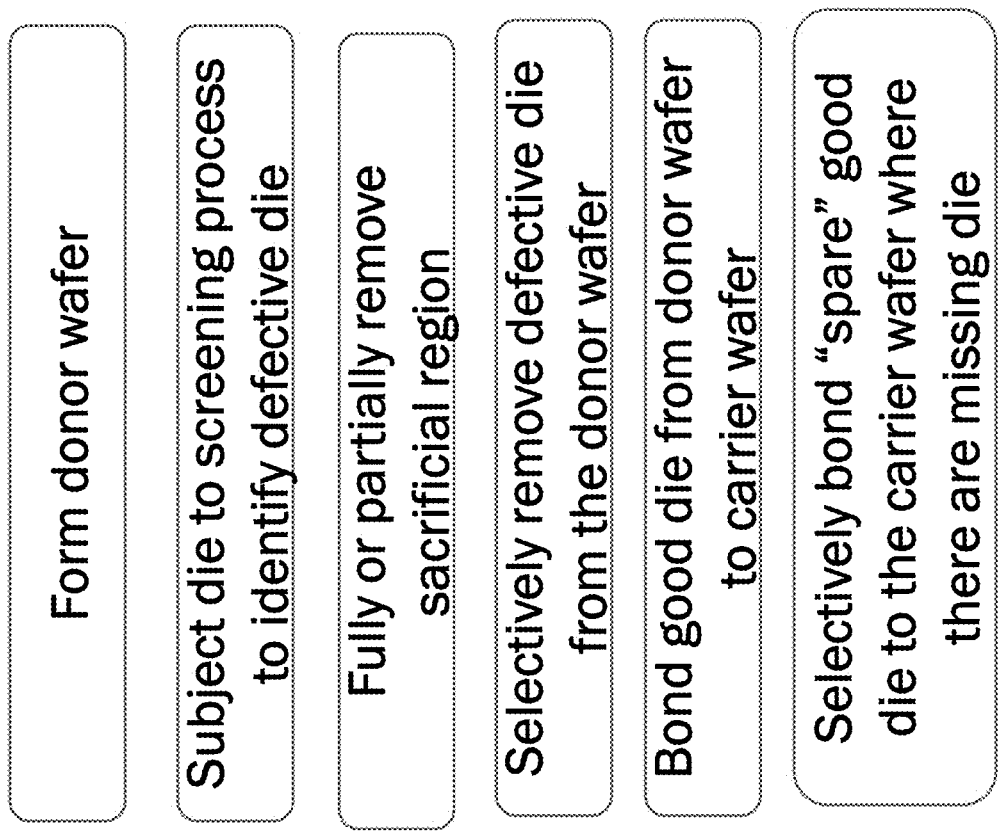
Figure 8B: Screening before removing sacrificial region

Figure 8C: Screening and die repair after transfer

Figures 9A-9D: Selective anchor removal
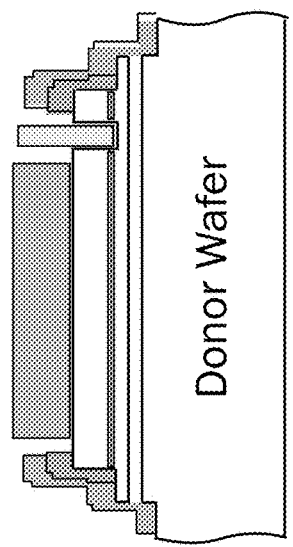
Figure 9A
- p Contact
- n Contact
- Passivation layer
- Anchor metal
- Active Region
- Sacrificial Region
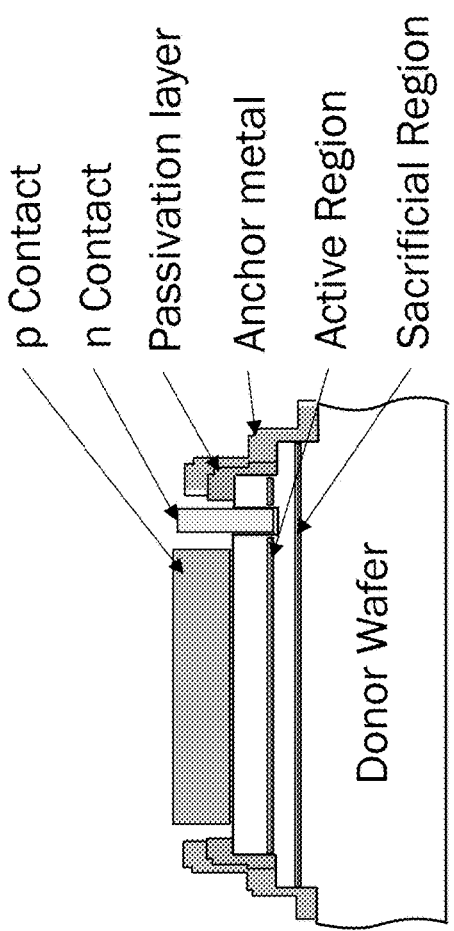
Figure 9B
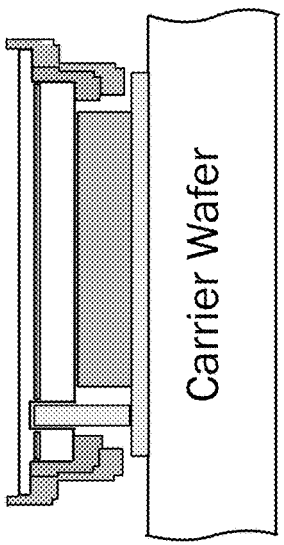
Figure 9D
Figure 9C
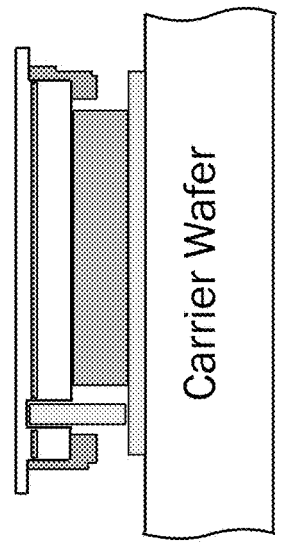

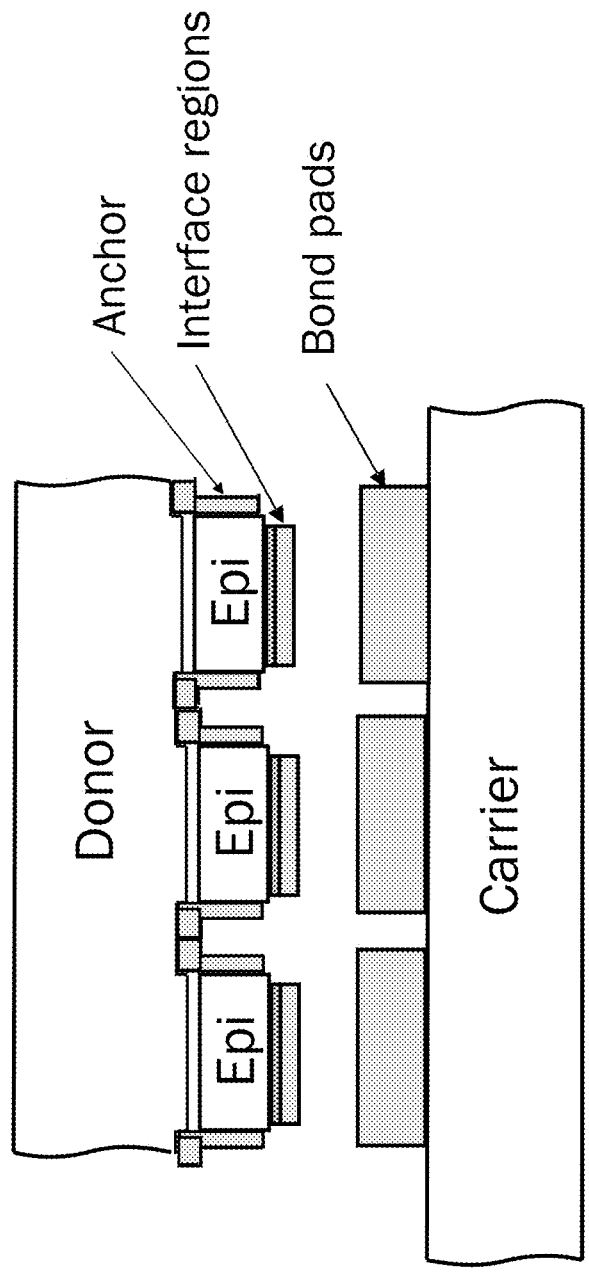
Figure 10: Challenges with bonding die to carrier

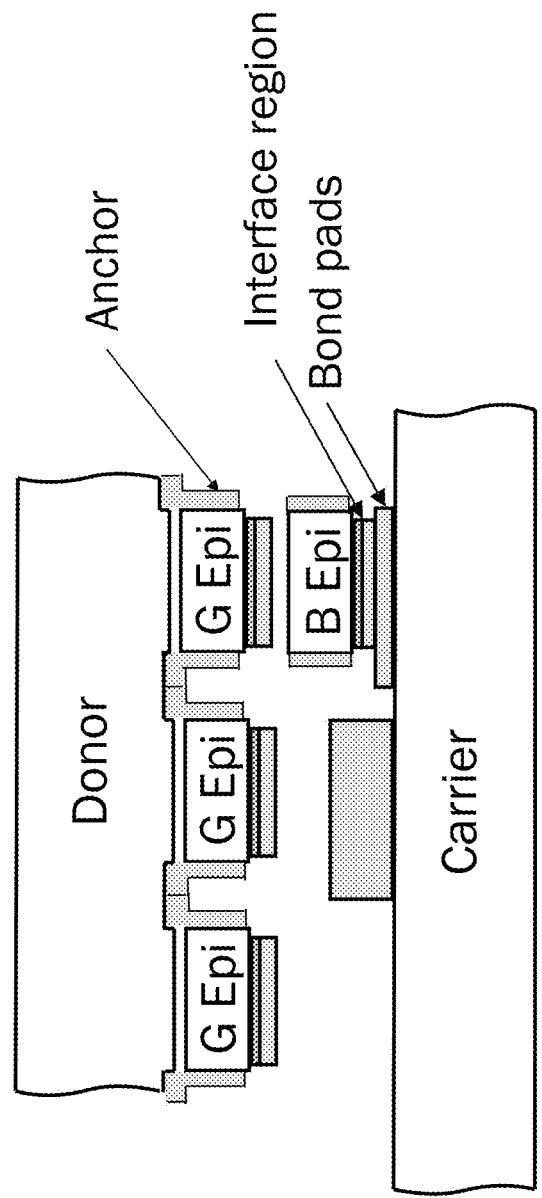
Figure 11: Challenges with bonding die to carrier

Figures 12A-12D: Transfer with spaced die on a donor
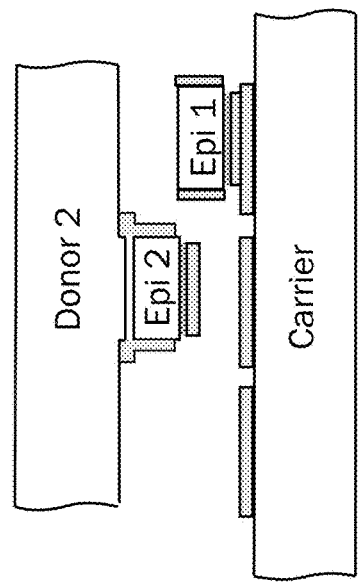
Figure 12A
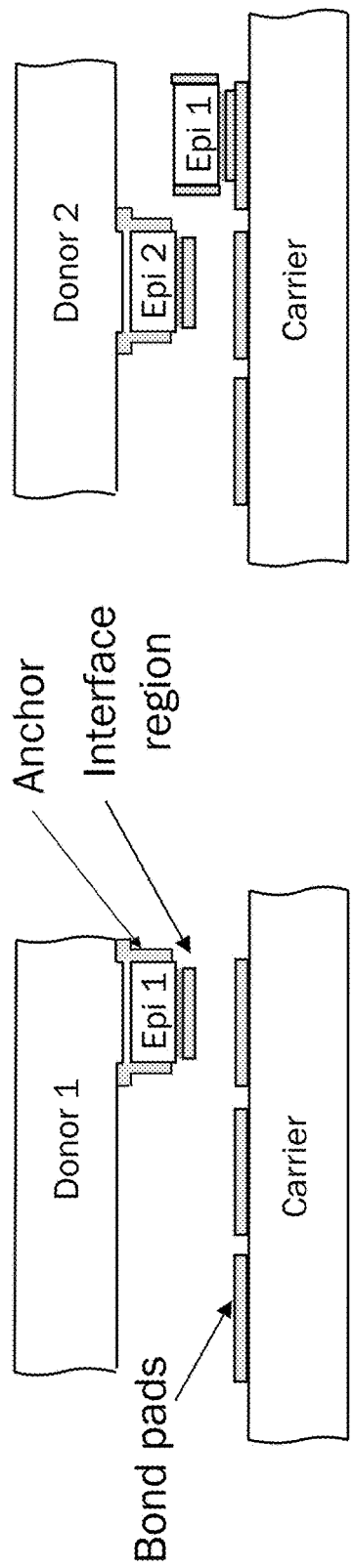
Figure 12B
Figure 12C
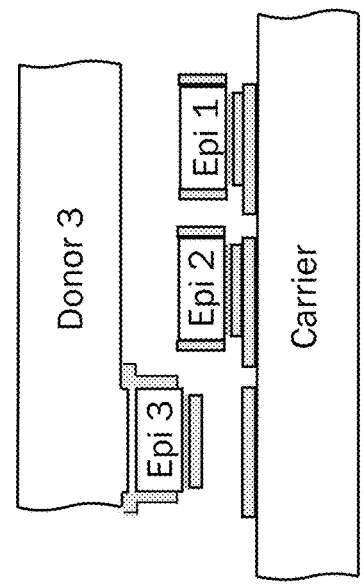
Figure 12D

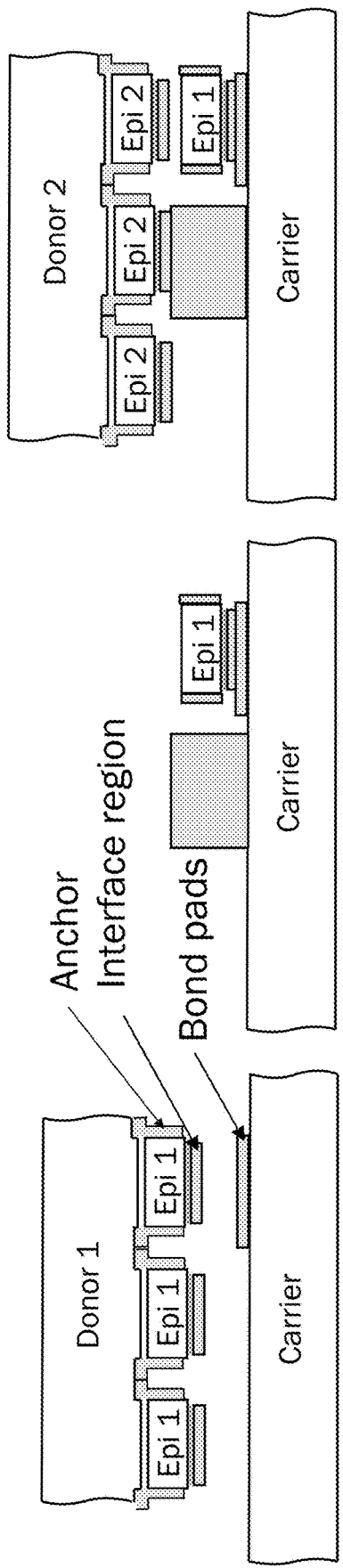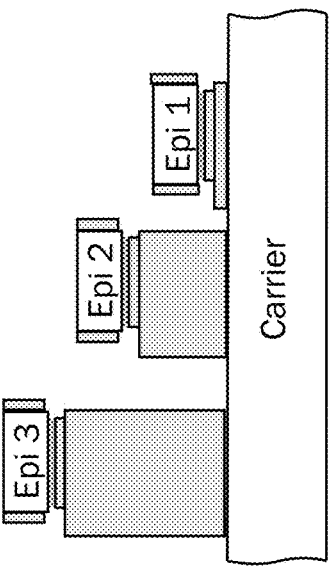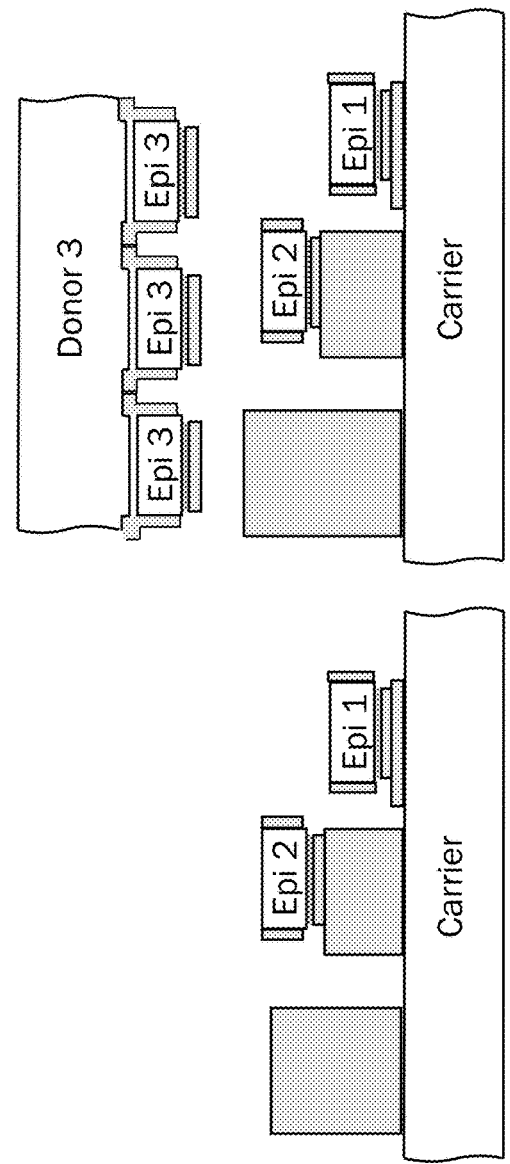
Figures 13A-13F: Vary bond thickness on carrier
Figure 13A
Figure 13B
Figure 13C
Figure 13D
Figure 13E
Figure 13F

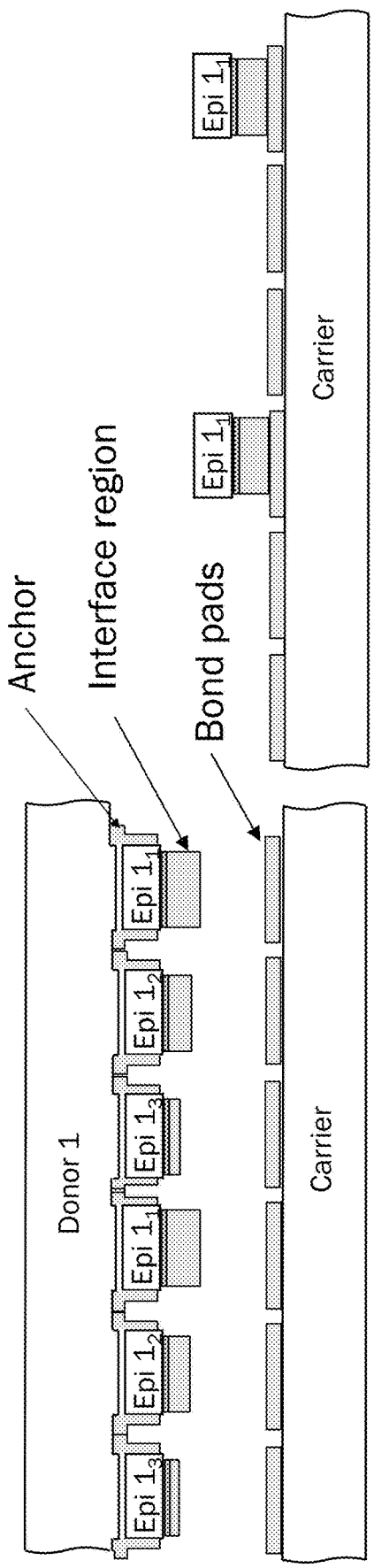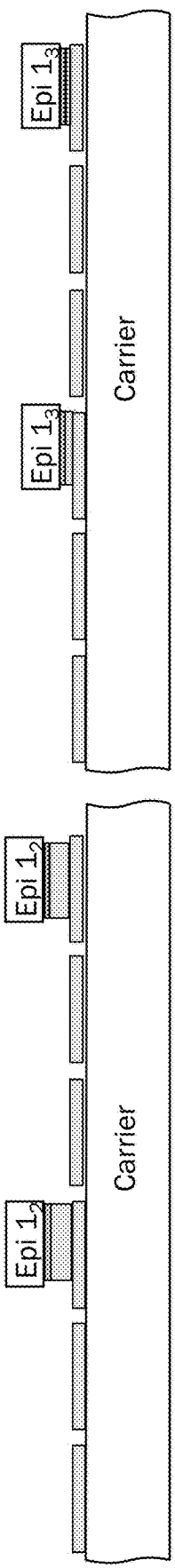
Figures 14A-14D: Vary bond thickness on donor
Figure 14A
Figure 14B
Figure 14C
Figure 14D Figures 15A-15C: Vary bond thickness on donor Figures 15D-15F: Vary bond thickness on donor Figures 15G-15I: Vary bond thickness on donor

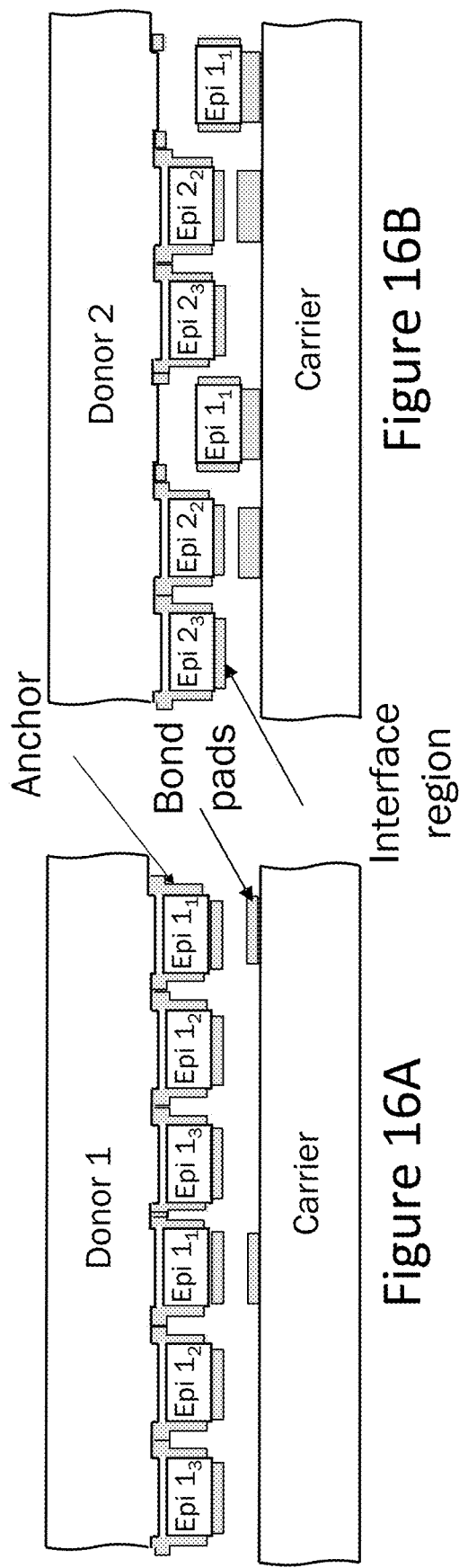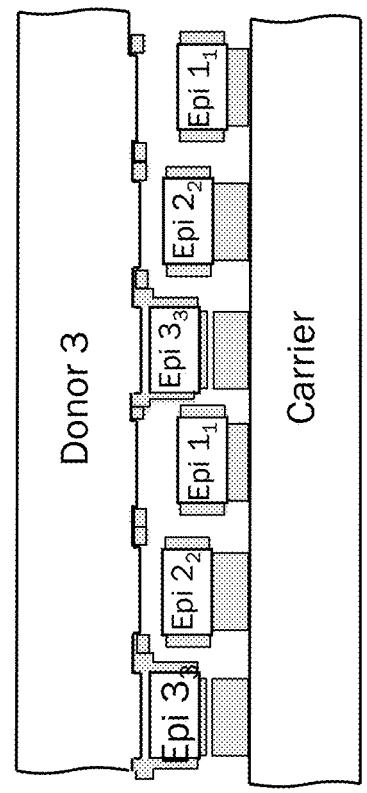
Figures 16A-16C: Vary bond thickness on donor
Figure 16A
Figure 16B
Figure 16C Figures 17A-17C: Transfer using an intermediate substrate
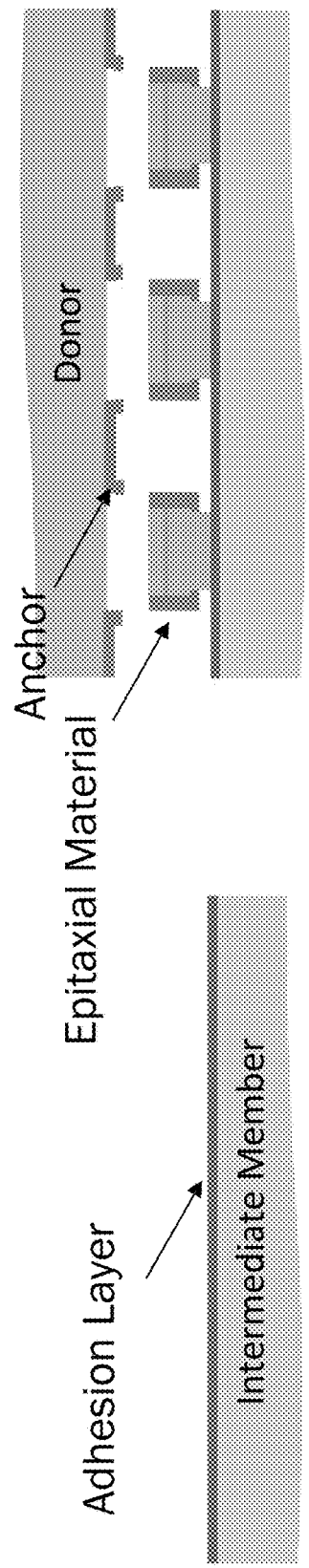
Figure 17B
Figure 17A
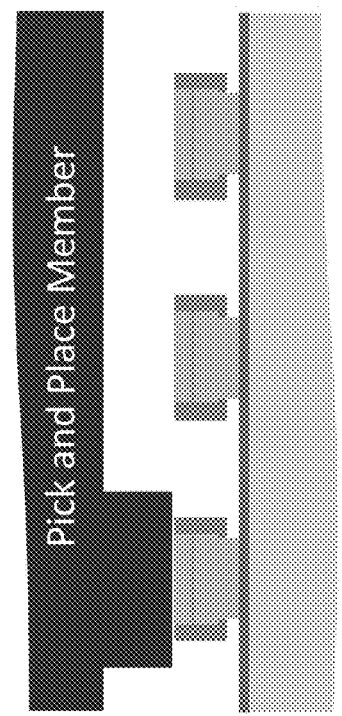
Figure 17C Figures 17D-17F: Transfer using an intermediate substrate
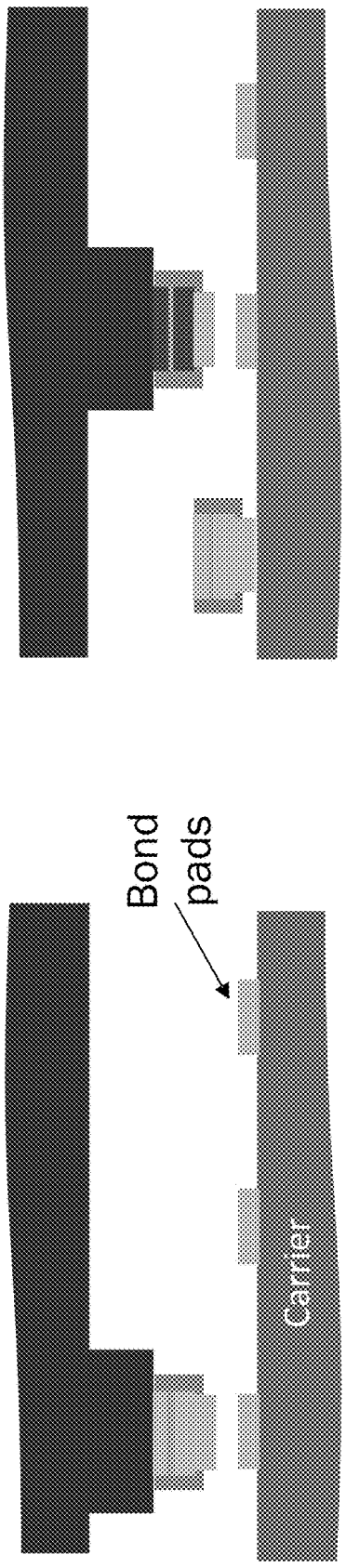
Figure 17D
Figure 17E
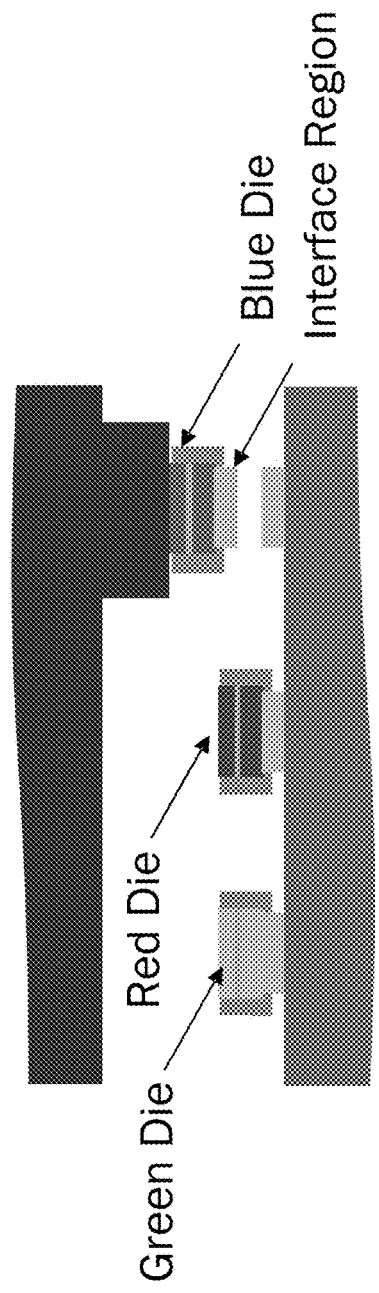
Figure 17F Figures 18A-18C: Sidewall passivation
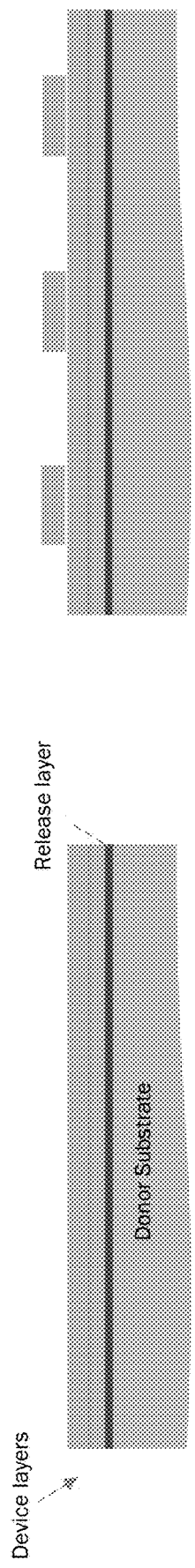
Figure 18A
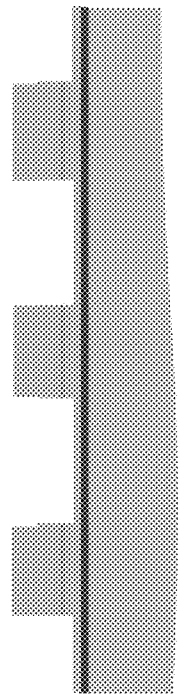
Figure 18B
Figure 18C

Figures 18D-18F: Sidewall passivation
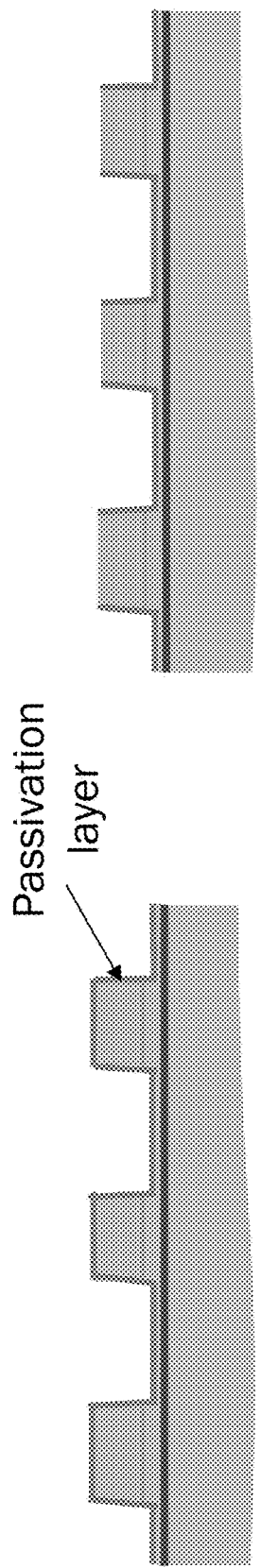
Figure 18D
Figure 18E
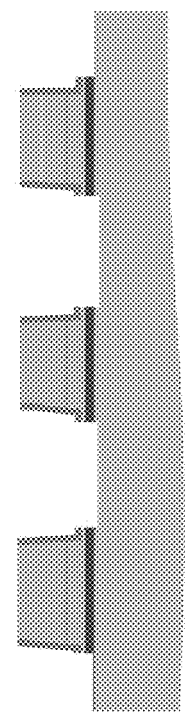
Figure 18F

Figures 18G-18I: Sidewall passivation
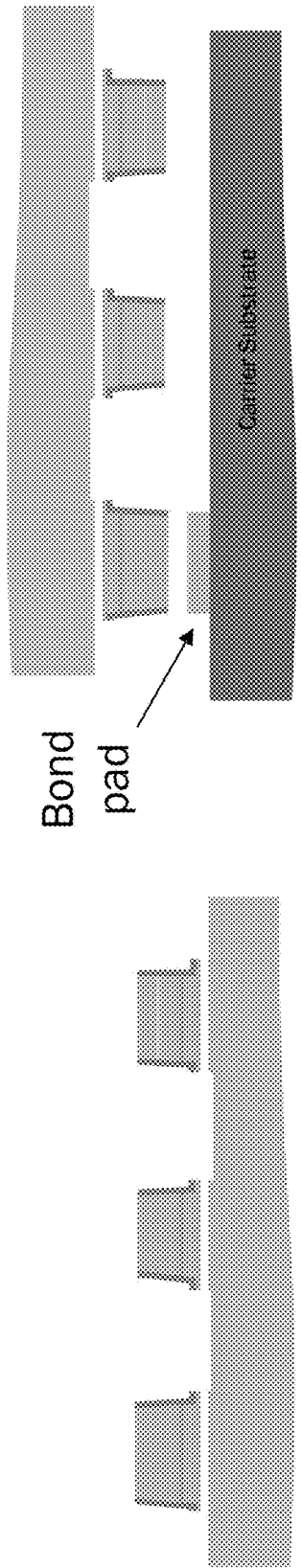
Figure 18G
Bond pad
Figure 18H
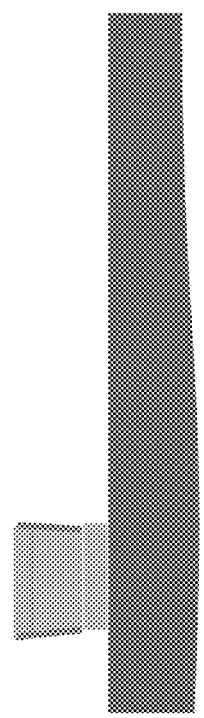
Figure 18I Figures 19A-19B: n and p contacts on same side of chip

METHOD FOR MANUFACTURING A MICRO LED DISPLAY USING PARALLEL MASS TRANSPORT

BACKGROUND

Devices based on wide bandgap III-V semiconductor materials such as gallium nitride (GaN) play a major role in our modern world. They play critical roles in essentially all of our electronic devices and are instrumental in almost all of the machines and apparatus we rely on every day. Examples of such semiconductor devices include light emitting devices such as light emitting diodes and laser diodes, electronic devices such as Schottky diodes, pn diodes, bipolar junction transistor, field effect transistors, metal-oxide-semiconductor field-effect transistor, insulated gate bipolar transistors, high electron mobility transistors, and heterojunction bipolar transistors to name a few, along with light absorbing devices such as solar cells. Forming such GaN devices of the highest performance often requires epitaxial structures with minimum defect density and the highest crystal quality and purity. To achieve the low defect density and high crystal quality it is most optimum to grow the epitaxial device epitaxial layers on a native GaN substrates to form a pseudomorphic epitaxial structure that is relatively free from strain related defects that occur when growing on foreign substrates.

Unfortunately, the synthesis of GaN single crystal substrates has been an extraordinarily difficult task. The highly successful Czochralski method for silicon crystal growth would have impractical process requirements comparable to conditions very deep within the Earth's mantle. Alternative approaches have been investigated for growing GaN bulk substrates, such as hydride vapor phase epitaxy (HVPE) and ammonothermal growth. Additionally it is still a great challenge to scale up bulk GaN growth to larger wafer sizes. GaN substrates are currently available in 2" diameter at high volume and recent announcements have revealed availability in 4" in the near future, which is still drastically smaller than more mature substrate technologies such as 12" single crystal silicon. At the current GaN wafer diameter and prices, the native substrate option is not economically feasible for realizing semiconductor devices in many applications, specifically light emitting diode applications and power electronic applications. Given the obstacles in GaN native substrate manufacturing, there has been substantial effort devoted to the epitaxy on foreign substrate materials. Common choices for GaN heteroepitaxy include sapphire, silicon carbide, and silicon. In the past decade, SiC and sapphire substrates have been widely used in nitride LEDs and RF transistors. It should be appreciated that as used herein, the term wafer is not intended to be limiting and may generally refer to a substrate of any geometry unless specified or inferred otherwise.

Light emitting diodes (LED) based on gallium nitride are lighting the world around us. An LED is a two-lead semiconductor light source. It is a basic pn-junction diode, which emits electromagnetic radiation when activated. The emission from an LED is spontaneous and is typically in a Lambertian pattern. When a suitable voltage is applied to the leads, electrons are able to recombine with electron holes within the device, releasing energy in the form of photons. This effect is called electroluminescence, and the color of the light (corresponding to the energy of the photon) is determined by the energy band gap of the semiconductor [1].

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness [1].

The earliest blue and violet GaN-based LEDs were fabricated using a metal-insulator-semiconductor structure due to a lack of p-type GaN. The first p-n junction GaN LED was demonstrated by Amano et al. using the LEEBI treatment to obtain p-type GaN in 1989 [2]. They obtained the current-voltage (I-V) curve and electroluminescence of the LEDs but did not record the output power or the efficiency of the LEDs. Nakamura et al. demonstrated the p-n junction GaN LED using the low-temperature GaN buffer and the LEEBI treatment in 1991 with an output power of 42 uW at 20 mA. The first p-GaN/n-InGaN/n-GaN DH blue LEDs were demonstrated by Nakamura et al. in 1993 [3]. The LED showed a strong band-edge emission of InGaN in a blue wavelength regime with an emission wavelength of 440 nm under a forward biased condition. The output power and the EQE were 125 uW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm [4]. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps [1].

LEDs have many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

The manufacturing of light emitting diodes from GaN related materials is dominated by the heteroepitaxial growth of GaN on foreign substrates such as Si, SiC and sapphire. However, GaN substrates are costly and not widely available in large diameters.

SUMMARY

Embodiments of the invention provide methods for fabricating micro LED devices and displays. Typically, these devices are fabricated using an epitaxial deposition of semiconductor device layers on a gallium and nitrogen containing substrate followed by processing steps on the epitaxial substrate and overlying epitaxial material. By using a selective etch process such as a photo electrochemical (PEC) etch combined with a bonding process at least a portion of the epitaxial material is transferred to the carrier wafer. Subsequently, the carrier wafer with the bonded epitaxial material is subjected to subsequent processing steps to form semiconductor devices including optical devices such as light emitting diodes. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, flat panel displays, curved or flexible panel displays, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like. In other embodiments the semiconductor devices are fully or partially formed in the epitaxial material before transfer to a carrier wafer or to an integrated circuit. What follows is a general description of the typical configuration and fabrication of these devices.

In one embodiment, the present invention is applied to the manufacturing of a display device. Specifically, the technology is used to make a highly efficient, cost effective, and high-performance display based on micro-LEDs by transferring multiple color small LEDs to a common carrier such that the multiple color LEDs form individual pixels, which can be individually addressed to adjust the color and brightness of the pixel. Existing display devices based on liquid crystal technology are highly inefficient due to the use of multiple polarizers, color filters, light guides, and the need to electrically drive both the liquid crystal element and the backlighting element such as LEDs. Such displays typically result in single digit electrical to optical energy efficiency values and require complicated fabrication technologies with many elements leading to high cost. Advances have been made in organic LED [OLED] display technology over the past several years. However, OLED displays suffer from poor OLED efficiency, lower brightness, manufacturing challenges, and reliability barriers.

The present invention breaks the barriers associated with currently available display technology. Specifically, by patterning arrays of micro-LEDs into multiple donor wafers with different emission colors and then selectively transferring these LEDs onto a carrier or host wafer a 2-dimensional matrix of individual pixels comprising multiple color LEDs, such as red, green, and blue LEDs, can be configured. For example, a first donor wafer comprised of a gallium and arsenic substrate can be fabricated to form an array of red emitting LED structures, a second donor wafer comprised of a gallium and nitrogen substrate can be fabricated to form an array of green emitting LED structures, and a third donor wafer comprised of a gallium and nitrogen substrate can be fabricated to form an array of blue emitting LED structures can be formed. Subsequently, the donor wafers can then be subjected to the transfer process described in this invention wherein only a fraction of the LED structures are transferred to a carrier wafer. In some embodiments the carrier wafer is comprised of a gallium and nitrogen containing substrate or a gallium and arsenic containing substrate, or an alternative substrate and comprises micro LEDs with one of the emission colors formed directly on the carrier wafer.

The carrier wafer is designed to receive the different color LEDs into pixel domains. The micro LEDs can be formed in various shapes such as circles, squares, rectangles, triangles, pentagons, hexagons, octagons, or any geometrical shape possible. In some embodiments, the largest dimension of the LED emission areas could be smaller than 1 mm, smaller than 200 um, smaller than 100 um, smaller than 50 um, smaller than 20 um, smaller than 10 um, or smaller than 5 um. The carrier wafer is comprised with an interconnect network configured to enable addressability of the micro LEDs in the pixels to generate high resolution display images. Any relevant interconnect schemes, configurations, processes could be taken from existing display technologies such as LCD or OLED, or even from other technologies such as imaging technologies like focal plane arrays (FPA) and applied to the present invention.

For the purposes of the present invention, the term microLED is not intended to limit the size dimensions of the LED devices or die. The embodiments described herein apply to all sizes including dimensions that may be associated with conventional LEDs, mini LEDs, micro LEDs, or other categories of LEDs. For the purposes of this application, the term microLED, microLED display panel, or other references is inclusive of devices, components, and systems comprised of LED devices that could be any size. For example, the LED die according to some embodiments could be characterized by a diameter or a largest dimension of its surface emission area less than about 3 mm, less than about 1 mm, less than about 500 microns, less than about 100 micron, less than about 50 microns, less than about 25 microns, less than about 10 microns, or even less than about 5 microns.

The present invention enables a highly manufacturable and cost efficient process for producing micro LED based displays not readily possible with prior art. Specifically, the current invention allows for a wafer level transfer process from a donor LED wafer to a common carrier wafer forming the display panel. Since it is a wafer level process, thousands, tens of thousands, or hundreds of thousands of LEDs can be transferred in one process step [depending on wafer size and pixel pitch] and hence avoiding one-by-one pick and place techniques. This advantage can enable high throughput for low cost and high alignment tolerances for tight packing of the LEDs. Moreover, since it is a selective transfer process from the donor to the carrier and the pitch of the LEDs from the donor wafer to the carrier wafer can be expanded using the anchor technology, a much higher density of LEDs can be formed on the single color donor wafers than the final density of that single color as expanded on the carrier wafer to form the display panel. For example, a red donor wafer, green donor wafer, and blue donor wafer may be prepared with an LED pitch of X. At the transfer step to the first carrier wafer only ⅓ of the LEDs are transferred to the carrier wafer at a pitch of X/3 such that the resulting donor wafer has a repeating array of red, green, and blue LEDs that spaced from each other by X, but spaced from their next nearest neighbor with the same color by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In an example, the present invention provides a method for manufacturing a gallium and nitrogen containing semiconductor devices with low cost and/or improved performance. The method includes providing a gallium and nitrogen containing substrate having a surface region and forming epitaxial material overlying the surface region, the epitaxial material comprising a sacrificial release region and a specific layer stack of high quality epitaxial material designed for the semiconductor device to be fabricated in. For example, in a light emitting device such as and LED the stack would have at least one n-type gallium and nitrogen containing layer, an active region comprising at least one active gallium and nitrogen containing layer overlying the one or more n-type 1 gallium and nitrogen containing layers, and one or more p-type gallium and nitrogen containing layers overlying the active region. The method includes patterning and then etching the epitaxial material to form a plurality of mesa regions corresponding to dice, each of the dice corresponding to at least one semiconductor device, such as an LED, characterized by a first pitch between a pair of dice, the first pitch being larger than, equal to, or less than a design width. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

In accordance with an embodiment, a method for manufacturing a light emitting diode based display panel device includes providing at least one carrier wafer; providing a first substrate having a first surface region; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing region configured to emit electromagnetic radiation at a first blue wavelength, and a p-type gallium and nitrogen containing region; patterning the first gallium and nitrogen containing epitaxial material and forming first mesas to form a first plurality of dice arranged in a first array, each die corresponding to at least one light emitting diode device and being arranged by a first pitch between adjacent die in the first array; forming a first interface region overlying the first gallium and nitrogen containing epitaxial material; subjecting the first release material to a first energy source to fully or partially remove the first release material, the first release material disposed between the first substrate and the first gallium and nitrogen containing epitaxial material; subjecting at least a first portion of the first plurality of dice to a screening process to identify defective die of the first plurality of dice; bonding the first interface region of at least a first fraction of the first plurality of dice to the at least one carrier wafer to form first bonded structures, while maintaining the first release material fully or partially removed from the first bonded structures; releasing at least the first fraction of the first plurality of dice provided on the first substrate to transfer the first fraction of the first plurality of dice to the at least one carrier wafer as first transferred dice; wherein the first transferred dice do not include any of the defective die of the first plurality of dice identified by the screening process; and wherein each pair of the first transferred dice is configured with a second pitch between each pair of the first transferred dice, the second pitch being equal to or greater than the first pitch; and processing the at least one carrier wafer with at least the first fraction of the first plurality of dice to form the light emitting diode based display panel device operable at least at the first blue wavelength, the first blue wavelength having a range of range of about 420 nm to 480 nm.

In an embodiment, the method also includes providing a second substrate having a second surface region; forming a second release material overlying the second substrate; forming a second epitaxial material overlying the second surface region, the second epitaxial material comprising at least an n-type gallium and nitrogen containing region, a second light emitting gallium and nitrogen containing region configured to emit electromagnetic radiation at a second green wavelength, and a p-type gallium and nitrogen containing region; patterning the second epitaxial material and forming second mesas to form a second plurality of dice arranged in a second array, each die corresponding to at least one light emitting diode device and being arranged by a third pitch between adjacent die in the second array; forming a second interface region overlying the second epitaxial material; subjecting the second release material to a second energy source to completely or partially remove the second release material, the second release material disposed between the second substrate and the second epitaxial material; subjecting at least a second portion of the second plurality of dice to the screening process to identify defective die of the second plurality of dice; bonding the second interface region of at least a second fraction of the second plurality of dice to the at least one carrier wafer to form second bonded structures, while maintaining the second release material completely or partially removed from the second bonded structures; releasing at least the second fraction of the second plurality of dice provided on the second substrate to transfer the second fraction of the second plurality of dice to the at least one carrier wafer as second transferred dice; wherein the second transferred dice do not include any of the defective die of the second plurality of dice identified by the screening process; and wherein each pair of the second transferred dice is configured with a fourth pitch between each pair of the second transferred dice, the fourth pitch being equal to or greater than the third pitch; and processing the at least one carrier wafer with at least the first fraction of the first plurality of dice and the second fraction of the second plurality of dice to form the light emitting diode based display panel device operable at least at the first blue wavelength and at the second green wavelength, the second green wavelength having a range of about 500 nm to 550 nm.

In some embodiments, the method may also include, providing a third substrate having a third surface region; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third red wavelength; and a p-type gallium, indium, phosphorous, nitrogen, aluminum, arsenic, or combinations thereof containing region; patterning the third epitaxial material and forming third mesas to form a third plurality of dice arranged in a third array, each die corresponding to at least one light emitting diode device and being arranged by a fifth pitch between adjacent die in the third array; forming a third interface region overlying the third epitaxial material; subjecting the third release material to a third energy source to fully or partially remove the third release material, the third release material disposed between the third substrate and the third epitaxial material; subjecting at least a third portion of the third plurality of dice to the screening process to identify defective die of the third plurality of dice; bonding the third interface region of at least a third fraction of the third plurality of dice to the at least one carrier wafer to form third bonded structures, while maintaining the third release material fully or partially removed from the third bonded structures; releasing at least the third fraction of the third plurality of dice provided on the third substrate to transfer the third fraction of the third plurality of dice to the at least one carrier wafer as third transferred dice; wherein the third transferred dice do not include any of the defective die of the third plurality of dice identified by the screening process; and wherein each pair of the third transferred dice is configured with a sixth pitch between each pair of the third transferred dice, the sixth pitch being equal to or greater than the fifth pitch; and processing the at least one carrier wafer with at least the first fraction of the first plurality of dice, the second fraction of the second plurality of dice, and the third fraction of the third plurality of dice to form the light emitting diode based display panel device operable at least at the first blue wavelength, the second green wavelength, and the third red wavelength, the third red wavelength having a range of about 620 nm to 700 nm.

In another embodiment, the method also includes selectively removing the defective die of the first plurality of dice from the first substrate before bonding the first interface region of the first fraction of the first plurality of dice to the at least one carrier wafer; selectively removing the defective die of the second plurality of dice from the second substrate before bonding the second interface region of the second fraction of the second plurality of dice to the at least one carrier wafer; and/or selectively removing the defective die of the third plurality of dice from the third substrate before bonding the third interface region of the third fraction of the third plurality of dice to the at least one carrier wafer.

In another embodiment, the method also includes selectively removing the defective die of the first plurality of dice from the first substrate after fully or partially removing the first release material; selectively removing the defective die of the second plurality of dice from the second substrate after fully or partially removing the second release material; and/or selectively removing the defective die of the third plurality of dice from the third substrate after fully or partially removing the third release material.

In another embodiment, the first portion of the first plurality of dice are subjected to the screening process after subjecting the first release material to the first energy source to fully or partially remove the first release material; the second portion of the second plurality of dice are subjected to the screening process after subjecting the second release material to the second energy source to fully or partially remove the second release material; and/or the third portion of the third plurality of dice are subjected to the screening process after subjecting the third release material to the third energy source to fully or partially remove the third release material.

In another embodiment, the screening process includes at least one of a visual inspection, an optical inspection, an electrical test, or an optoelectrical test.

In another embodiment, the method also includes selectively removing the defective die of the first plurality of dice from the first substrate and selectively attaching good first dice to the first substrate in place of the defective die of the first plurality of dice, the good first die being part of the first fraction of the first plurality of dice that are transferred to the at least one carrier wafer; selectively removing the defective die of the second plurality of dice from the second substrate and selectively attaching good second dice to the second substrate in place of the defective die of the second plurality of dice, the good second die being part of the second fraction of the second plurality of dice that are transferred to the at least one carrier wafer; and/or selectively removing the defective die of the third plurality of dice from the third substrate and selectively attaching good third dice to the third substrate in place of the defective die of the third plurality of dice, the good third die being part of the third fraction of the third plurality of dice that are transferred to the at least one carrier wafer.

In another embodiment, the method also includes selectively removing the defective die of the first plurality of dice from the first substrate and selectively attaching good first dice to the at least one carrier wafer at locations on the at least one carrier wafer where the defective die of the first plurality of dice would have been bonded if not removed from the first substrate; selectively removing the defective die of the second plurality of dice from the second substrate and selectively attaching good second dice to the at least one carrier wafer at locations on the at least one carrier wafer where the defective die of the second plurality of dice would have been bonded if not removed from the second substrate; and/or selectively removing the defective die of the third plurality of dice from the third substrate and selectively attaching good third dice to the at least one carrier wafer at locations on the at least one carrier wafer where the defective die of the third plurality of dice would have been bonded if not removed from the third substrate.

In another embodiment, the light emitting diode based display panel device is an RGB light-emitting-diode display panel device; and the first fraction of the first plurality of dice, the second fraction of the second plurality of dice, and the third fraction of the third plurality of dice are arranged in a two dimensional array with repeating red-green-blue light emitting diode devices forming pixels.

In another embodiment, the first substrate is comprised of a gallium and nitrogen containing material, a silicon material, a sapphire material, or a silicon carbide material; and wherein the second substrate is comprised of a gallium and nitrogen containing material, a silicon material, a sapphire material, or a silicon carbide material; and wherein the third substrate is comprised of a gallium and nitrogen containing material, a gallium and arsenide containing material, a silicon material, a sapphire material, or a silicon carbide material.

In another embodiment, at least the first release material or the second release material is selected from a gallium containing material or a gallium and nitrogen containing material, and/or wherein the third release material is selected from a gallium, aluminum, nitrogen, arsenic, indium, or phosphorous containing material.

In another embodiment, the first energy source, the second energy source, or the third energy source includes an etching process to fully or partially remove the first release material, second release material, or third release material, respectively.

In another embodiment, the first energy source, the second energy source, or the third energy source includes a PEC etch that comprises KOH, HCl, or $HNO_3$.

In another embodiment, the first energy source, second energy source, or the third energy source includes a PEC etch; wherein the PEC etch selectively removes the respective first release material, second release material, or third release material, while leaving an anchor region intact to support a respective die before bonding the respective interface region to the carrier wafer, and the anchor region separates after the bonding; wherein the anchor region is comprised of metal, semiconductor, dielectric, oxide, polymer, or a combination thereof.

In another embodiment, the third epitaxial material comprises InGaP, AlInGap, GaN, and/or InGaN.

In another embodiment, the at least one carrier wafer is selected from a silicon wafer, a sapphire wafer, a glass wafer, glass ceramics wafer, a quartz wafer, a high purity fused silica wafer, a silicon carbide wafer, an aluminum nitride wafer, a germanium wafer, an aluminum oxynitride wafer, a gallium arsenide wafer, a diamond wafer, a gallium nitride wafer, an indium phosphide wafer, a flexible member, a circuit board member, a silicon wafer with CMOS circuitry, silicon on insulator (SOI) wafer, or a gallium nitride on silicon wafer.

In another embodiment, the first interface region, the second interface region, and the third interface region each comprise a metal, a semiconductor, a dielectric, an oxide, a glass, or a polymer.

In another embodiment, the at least one carrier wafer includes a micro LED display panel.

In another embodiment, the method also includes, on the first substrate: etching the first gallium and nitrogen containing epitaxial material and stopping the etch before reaching the first release material; forming a first passivation layer to cover exposed portions of the first gallium and nitrogen containing epitaxial material; and etching portions of the first gallium and nitrogen containing epitaxial material to expose sidewalls of the first release material and form the first mesas; on the second substrate: etching the second gallium and nitrogen containing epitaxial material and stopping the etch before reaching the second release material; forming a second passivation layer to cover exposed portions of the second gallium and nitrogen containing epitaxial material; and etching portions of the second gallium and nitrogen containing epitaxial material to expose sidewalls of the second release material and form the second mesas; on the third substrate: etching the third epitaxial material and stopping the etch before reaching the third release material; forming a third passivation layer to cover exposed portions of the third epitaxial material; and etching portions of the third epitaxial material to expose sidewalls of the third release material and form the third mesas.

In another embodiment, the method also includes, on the first substrate: forming first anchor regions extending along first sidewalls of the first gallium and nitrogen containing epitaxial material, the first anchor regions supporting the first plurality of dice after fully or partially removing the first release material; and removing the first anchor regions after bonding the first interface region to the at least one carrier wafer; on the second substrate: forming second anchor regions extending along second sidewalls of the second gallium and nitrogen containing epitaxial material, the second anchor regions supporting the second plurality of dice after fully or partially removing the second release material; and removing the second anchor regions after bonding the second interface region to the at least one carrier wafer; on the third substrate: forming third anchor regions extending along third sidewalls of the third epitaxial material, the third anchor regions supporting the third plurality of dice after fully or partially removing the third release material; and removing the third anchor regions after bonding the third interface region to the at least one carrier wafer.

In another embodiment, a second height of the second fraction of the second plurality of dice is greater than a first height of the first fraction of the first plurality of dice; and a third height of the third fraction of the third plurality of dice is greater than the second height of the second fraction of the second plurality of dice.

In accordance with another embodiment, a method for manufacturing a light emitting diode based display panel device includes providing at least one carrier wafer; providing a first substrate having a first surface region; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing active region configured to emit electromagnetic radiation at a first wavelength, and a p-type gallium and nitrogen containing region; patterning the first gallium and nitrogen containing epitaxial material and forming first mesas to form a first plurality of dice arranged in a first array, each die corresponding to at least one light emitting diode device and being arranged by a first pitch between adjacent die in the first array; forming first interface regions overlying the first gallium and nitrogen containing epitaxial material; subjecting the first release material to a first energy source to fully or partially remove the first release material; forming first bond pads on the at least one carrier wafer; bonding the first interface regions of a first fraction of the first plurality of dice to the first bond pads on the at least one carrier wafer to form first bonded structures, while maintaining at least a second fraction of the first plurality of dice on the first substrate unbonded to the first bond pads, wherein the first fraction of the first plurality of dice are characterized by first physical features different from second physical features of the second fraction of the first plurality of dice; releasing the first fraction of the first plurality of dice provided on the first substrate to transfer the first fraction of the first plurality of dice to the at least one carrier wafer as first transferred dice; wherein each pair of the first transferred dice is configured with a second pitch between each pair of the first transferred dice, the second pitch being equal to or greater than the first pitch; thereafter bonding the first interface regions of the second fraction of the first plurality of dice to the first bond pads on the at least one carrier wafer to form second bonded structures; and releasing the second fraction of the first plurality of dice provided on the first substrate to transfer the second fraction of the first plurality of dice to the at least one carrier wafer as second transferred dice; wherein each pair of the second transferred dice is configured with the second pitch between each pair of the second transferred dice.

In an embodiment, the method also includes providing a second substrate having a second surface region; forming a second release material overlying the second substrate; forming a second gallium and nitrogen containing epitaxial material overlying the second surface region, the second gallium and nitrogen containing epitaxial material comprising at least an n-type gallium and nitrogen containing region, a second light emitting gallium and nitrogen containing active region configured to emit electromagnetic radiation at a second wavelength, and a p-type gallium and nitrogen containing region; patterning the second gallium and nitrogen containing epitaxial material and forming second mesas to form a second plurality of dice arranged in a second array, each die corresponding to at least one light emitting diode device and being arranged by a third pitch between adjacent die in the second array; forming second interface regions overlying the second gallium and nitrogen containing epitaxial material; subjecting the second release material to a second energy source to completely or partially remove the second release material; bonding the second interface regions of a third fraction of the second plurality of dice to the first bond pads on the at least one carrier wafer to form third bonded structures, while maintaining at least a fourth fraction of the second plurality of dice on the second substrate unbonded to the first bond pads, wherein the third fraction of the second plurality of dice are characterized by third physical features different from fourth physical features of the fourth fraction of the second plurality of dice; releasing the third fraction of the second plurality of dice provided on the second substrate to transfer the third fraction of the second plurality of dice to the at least one carrier wafer as third transferred dice; wherein each pair of the third transferred dice is configured with a fourth pitch between each pair of the third transferred dice, the fourth pitch being equal to or greater than the third pitch; thereafter bonding the second interface regions of the fourth fraction of the second plurality of dice to the first bond pads on the at least one carrier wafer to form fourth bonded structures; and releasing the fourth fraction of the second plurality of dice provided on the second substrate to transfer the fourth fraction of the second plurality of dice to the at least one carrier wafer as fourth transferred dice; wherein each pair of the fourth transferred dice is configured with the second pitch between each pair of the fourth transferred dice.

In another embodiment, the method also includes providing a third substrate having a third surface region; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third wavelength; and a p-type gallium, indium, phosphorous, nitrogen, aluminum, arsenic, or combinations thereof containing region; patterning the third epitaxial material and forming third mesas to form a third plurality of dice arranged in a third array, each die corresponding to at least one light emitting diode device and being arranged by a fifth pitch between adjacent die in the third array; forming third interface regions overlying the third epitaxial material; subjecting the third release material to a third energy source to completely or partially remove the third release material; bonding the third interface regions of a fifth fraction of the plurality of third dice to the first bond pads on the at least one carrier wafer to form fifth bonded structures, while maintaining at least a sixth fraction of the third plurality of dice on the third substrate unbonded to the first bond pads, wherein the fifth fraction of the third plurality of dice are characterized by fifth physical features different from sixth physical features of the sixth fraction of the third plurality of dice; releasing the fifth fraction of the third plurality of dice provided on the third substrate to transfer the fifth fraction of the third plurality of dice to the at least one carrier wafer as fifth transferred dice; wherein each pair of the fifth transferred dice is configured with a sixth pitch between each pair of the fifth transferred dice, the sixth pitch being equal to or greater than the fifth pitch; thereafter bonding the third interface regions of the sixth fraction of the third plurality of dice to the first bond pads on the at least one carrier wafer to form sixth bonded structures; and releasing the sixth fraction of the third plurality of dice provided on the third substrate to transfer the sixth fraction of the third plurality of dice to the at least one carrier wafer as sixth transferred dice; wherein each pair of the sixth transferred dice is configured with the second pitch between each pair of the sixth transferred dice; and processing the at least one carrier wafer with at least the first fraction of the first plurality of dice, the second fraction of the second plurality of dice, the third fraction of the third plurality of dice, the fourth fraction of the plurality of dice, and the sixth fraction of the plurality of dice to form a two dimensional matrix of light emitting diode devices to form the light emitting diode based display panel device operable at least at the first wavelength, the second wavelength, and the third wavelength; wherein a repeating pattern of at least one red light emitting diode device operable at the third wavelength, at least one green light emitting diode device operable at the second wavelength, and at least one blue light emitting diode device operable at the first wavelength within the two dimensional matrix of light emitting diode devices forms pixels within the light emitting diode based display panel device.

In another embodiment, the first physical features include a first height of the first fraction of the first plurality of dice, the first height including a height of the first interface region and a height of the first fraction of the first plurality of dice; the second physical features include a second height of the second fraction of the first plurality of dice, the second height including a height of the first interface region and a height of the second fraction of the first plurality of dice; the third physical features include a third height of the third fraction of the second plurality of dice, the third height including a height of the second interface region and a height of the third fraction of the second plurality of dice; the fourth physical features include a fourth height of the fourth fraction of the second plurality of dice, the fourth height including a height of the second interface region and a height of the fourth fraction of the second plurality of dice; the fifth physical features include a fifth height of the fifth fraction of the third plurality of dice, the fifth height including a height of the third interface region and a height of the fifth fraction of the third plurality of dice; and the sixth physical features include a sixth height of the sixth fraction of the third plurality of dice, the sixth height including a height of the third interface region and a height of the sixth fraction of the third plurality of dice.

In another embodiment, the first interface regions of the second fraction of the first plurality of dice are bonded to the first bond pads before the second interface regions of the third fraction of the second plurality of dice are bonded to the first bond pads; and/or the second interface regions of the fourth fraction of the second plurality of dice are bonded to the first bond pads before the third interface regions of the fifth fraction of the third plurality of dice are bonded to the first bond pads.

In another embodiment, a first height of the first fraction of the first plurality of dice is greater than a second height of the second fraction of the first plurality of dice; a third height of the third fraction of the second plurality of dice is greater than a fourth height of the fourth fraction of the second plurality of dice; and/or a fifth height of the fifth fraction of the third plurality of dice is greater than a sixth height of the sixth fraction of the third plurality of dice.

In another embodiment, a first height of the first fraction of the first plurality of dice is less than a second height of the third fraction of the second plurality of dice; and/or a second height of the third fraction of the second plurality of dice is less than a third height of the fifth fraction of the third plurality of dice.

In another embodiment, the first and second light emitting gallium and nitrogen containing active regions are each configured to emit the electromagnetic radiation in at least one of a violet, blue, or green wavelength regime.

In another embodiment, the light emitting diode based display panel device is characterized by an emission surface area, wherein a largest dimension is less than 1,000 µm, less than 500 µm, less than 100, less than 50 µm, less than 10 µm, or less than 5 µm; and wherein light emitting diodes of the light emitting diode based display panel device are characterized a pitch of less than 3,000 µm, less than 1,000 µm, less than 500 µm, less than 100, less than 50 µm, less than 20 µm, or less than 10 µm.

In another embodiment, the first substrate is comprised of a gallium and nitrogen containing material, a silicon material, a sapphire material, or a silicon carbide material; and wherein the second substrate is comprised of a gallium and nitrogen containing material, a silicon material, a sapphire material, or a silicon carbide material; and wherein the third substrate is comprised of a gallium containing material, a silicon material, a sapphire material, or a silicon carbide material.

In another embodiment, the first release material or the second release material is selected from a gallium containing material or a gallium and nitrogen containing material, and/or wherein the third release material is selected from a gallium, aluminum, nitrogen, arsenic, indium, or phosphorous containing material.

In another embodiment, the first energy source, the second energy source, or the third energy source includes an etching process to completely or partially remove the first release material, second release material, or third release material, respectively.

In another embodiment, the first energy source, the second energy source, or the third energy source includes a PEC etch that comprises KOH, HCl, or $HNO_3$.

In another embodiment, the first energy source, the second energy source, or the third energy source includes a PEC etch; wherein the PEC etch selectively removes the respective first release material, second release material, or third release material; wherein the first anchor region is comprised of metal, semiconductor, dielectric, oxide, polymer, or a combination thereof.

In another embodiment, the third epitaxial material comprises InGaP, AlInGap, GaN, and/or InGaN.

In another embodiment, the at least one carrier wafer is selected from a silicon wafer, sapphire wafer, a glass wafer, glass ceramics wafer, a quartz wafer, a high purity fused silica wafer, a silicon carbide wafer, an aluminum nitride wafer, a germanium wafer, an aluminum oxynitride wafer, a gallium arsenide wafer, a diamond wafer, a gallium nitride wafer, an indium phosphide wafer, a flexible member, a circuit board member, a silicon wafer with CMOS circuitry, silicon on insulator (SOI) wafer, or a gallium nitride on silicon wafer.

In accordance with another embodiment, a method for manufacturing a light emitting diode based display panel device includes providing at least one carrier wafer; providing a first substrate having a first surface region; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing active region configured to emit electromagnetic radiation at a first wavelength, and a p-type gallium and nitrogen containing region; patterning the first gallium and nitrogen containing epitaxial material and forming first mesas to form a first plurality of dice arranged in a first array, each die corresponding to at least one light emitting diode device and being arranged by a first pitch between adjacent die in the first array; forming first interface regions of a first thickness overlying at least a first fraction of the first plurality of dice; subjecting the first release material to a first energy source to fully or partially remove the first release material; forming first bond pads of a first thickness on the at least one carrier wafer; bonding the first interface regions of the first fraction of the first plurality of dice to the first bond pads on the at least one carrier wafer to form first bonded structures, while maintaining the first release material fully or partially removed from the first bonded structures; and releasing at least the first fraction of the first plurality of dice provided on the first substrate to transfer the first fraction of the first plurality of dice to the at least one carrier wafer as first transferred dice; wherein each pair of the first transferred dice is configured with a second pitch between each pair of the first transferred dice, the second pitch being equal to or greater than the first pitch; wherein removing the first release material is performed prior to the bonding; and wherein the first energy source fully or partially removes the first release material while leaving a first anchor region intact to support the first plurality of dice before the bonding of the first fraction of the first plurality of dice to the carrier wafer; the first anchor region separating during the releasing.

In an embodiment, the method also includes providing a second substrate having a second surface region; forming a second release material overlying the second substrate; forming a second gallium and nitrogen containing epitaxial material overlying the second surface region, the second gallium and nitrogen containing epitaxial material comprising at least an n-type gallium and nitrogen containing region, a second light emitting gallium and nitrogen containing active region configured to emit electromagnetic radiation at a second wavelength, and a p-type gallium and nitrogen containing region; patterning the second gallium and nitrogen containing epitaxial material and forming second mesas to form a second plurality of dice arranged in a second array, each die corresponding to at least one light emitting diode device and being arranged by a third pitch between adjacent die in the second array; forming second interface regions of a second thickness overlying at least a second fraction of the second plurality of dice; subjecting the second release material to a second energy source to completely or partially remove the second release material; forming second bond pads of a second thickness on the at least one carrier wafer; bonding the second interface regions of the second fraction of the second plurality of dice to the second bond pads on the at least one carrier wafer to form second bonded structures, while maintaining the second release material completely or partially removed from the second bonded structures; wherein a second height of the second fraction of the second plurality of dice is greater than a first height of the first fraction of the first plurality of dice, and/or the second thickness of the second bond pads is greater than the first thickness of the first bond pads; releasing at least the second fraction of the second plurality of dice provided on the second substrate to transfer the second fraction of the second plurality of dice to the at least one carrier wafer as second transferred dice; wherein each pair of the second transferred dice is configured with a fourth pitch between each pair of the second transferred dice, the fourth pitch being equal to or greater than the third pitch; and processing the at least one carrier wafer with at least the first fraction of the first plurality of dice and the second fraction of the second plurality of dice to form a two dimensional matrix of light emitting diode devices to form the light emitting diode based display panel device.

In another embodiment, the method also includes providing a third substrate having a third surface region; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third wavelength; and a p-type gallium, indium, phosphorous, nitrogen, aluminum, arsenic, or combinations thereof containing region; patterning the third epitaxial material and forming third mesas to form a third plurality of dice arranged in a third array, each die corresponding to at least one light emitting diode device and being arranged by a fifth pitch between adjacent die in the third array; forming third interface regions of a third thickness overlying at least a third fraction of the third plurality of dice; subjecting the third release material to a third energy source to completely or partially remove the third release material; forming third bond pads of a third thickness on the at least one carrier wafer; bonding the third interface region of the third fraction of the third plurality of dice to the third bond pads on the at least one carrier wafer to form third bonded structures, while maintaining the third release material completely or partially removed from the third bonded structures; wherein a third height of the third fraction of the third plurality of dice is greater than the second height of the second fraction of the second plurality of dice, and/or the third thickness of the third bond pads is greater than the second thickness of the second bond pads; releasing at least the third fraction of the third plurality of dice provided on the third substrate to transfer the third fraction of the third plurality of dice to the at least one carrier wafer as third transferred dice; wherein each pair of the third transferred dice is configured with a sixth pitch between each pair of the third transferred dice, the sixth pitch being equal to or greater than the fifth pitch; and processing the at least one carrier wafer with at least the first fraction of the first plurality of dice, the second fraction of the second plurality of dice, and the third fraction of the third plurality of dice to form the light emitting diode based display panel device operable at least at the first wavelength, the second wavelength, and the third wavelength; wherein a repeating pattern of at least one red light emitting diode device operable at the third wavelength, at least one green light emitting diode device operable at the second wavelength, and at least one blue light emitting diode device operable at the first wavelength within the two dimensional matrix of light emitting diode devices forms pixels within the light emitting diode based display panel device.

In another embodiment, the first wavelength is a first blue wavelength having a range of range of about 420 nm to 480 nm, the second wavelength is a second green wavelength having a range of about 500 nm to 550 nm, and the third wavelength is a third red wavelength having a range of about 620 nm to 700 nm.

In another embodiment, the second thickness of the second bond pads is greater than the first thickness of the first bond pads, and the second bond pads are formed after the first fraction of the first plurality of dice are transferred to the at least one carrier wafer; and/or the third thickness of the third bond pads is greater than the second thickness of the second bond pads, and the third bond pads are formed after the second fraction of the second plurality of dice are transferred to the at least one carrier wafer.

In another embodiment, the second thickness of the second bond pads is greater than the first thickness of the first pond pads plus a thickness of the first gallium and nitrogen containing epitaxial material; and/or the third thickness of the third bond pads is greater than the second thickness of the second pond pads plus a thickness of the second gallium and nitrogen containing epitaxial material.

In another embodiment, the second height of the second fraction of the second plurality of dice is greater than the first height of the first fraction of the first plurality of dice; and/or the third height of the third fraction of the third plurality of dice is greater than the second height of the second fraction of the second plurality of dice.

In another embodiment, the second thickness of the second interface regions is greater than the first thickness of the first interface regions plus a thickness of the first gallium and nitrogen containing epitaxial material; and/or the third thickness of the third interface regions is greater than the second thickness of the second interface regions plus a thickness of the second gallium and nitrogen containing epitaxial material.

In another embodiment, when the second interface regions of the second fraction of the second plurality of dice are bonded to the second bond pads, areas on the second substrate that do not include any of the second plurality of dice are aligned spatially with areas on the at least one carrier wafer that include at least one of the first plurality of dice; and/or when the third interface regions of the third fraction of the third plurality of dice are bonded to the third bond pads, areas on the third substrate that do not include any of the third plurality of dice are aligned spatially with areas on the at least one carrier wafer that include at least one of the first plurality of dice and/or at least one of the second plurality of dice.

In accordance with another embodiment, a method for manufacturing a light emitting diode based display panel device includes providing at least one carrier wafer; providing a first substrate having a first surface region; providing a first intermediate member; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing active region configured to emit electromagnetic radiation at a first wavelength, and a p-type gallium and nitrogen containing region; patterning the first gallium and nitrogen containing epitaxial material and forming first mesas to form a first plurality of dice arranged in a first array, each die corresponding to at least one light emitting diode device and being arranged by a first pitch between adjacent die in the first array; forming first interface regions overlying the first gallium and nitrogen containing epitaxial material; subjecting the first release material to a first energy source to fully or partially remove the first release material, wherein the first energy source includes a PEC etch; attaching the first interface regions of the first plurality of dice on the first substrate to the first intermediate member; releasing the first plurality of dice from the first substrate to transfer the first plurality of dice to the first intermediate member as first transferred dice; selectively picking up one or more of the first plurality of dice from the first intermediate member to provide first picked up dice, and placing the first picked up dice on the at least one carrier wafer, and bonding the first interface regions of the first picked up dice to the at least one carrier wafer to form first bonded structures; wherein each pair of the first bonded structures is configured with a second pitch between each pair of the first bonded structures, the second pitch being equal to or greater than the first pitch; and repeating the selectively picking up, placing, and bonding steps one or more times to transfer additional die of the first plurality of dice from the first intermediate member to the at least one carrier wafer.

In another embodiment, the method also includes providing a second substrate having a second surface region; providing a second intermediate member; forming a second release material overlying the second substrate; forming a second gallium and nitrogen containing epitaxial material overlying the second surface region, the second gallium and nitrogen containing epitaxial material comprising at least an n-type gallium and nitrogen containing region, a second light emitting gallium and nitrogen containing active region configured to emit electromagnetic radiation at a second wavelength, and a p-type gallium and nitrogen containing region; patterning the second gallium and nitrogen containing epitaxial material and forming second mesas to form a second plurality of dice arranged in a second array, each die corresponding to at least one light emitting diode device and being arranged by a third pitch between adjacent die in the second array; forming second interface regions overlying the second gallium and nitrogen containing epitaxial material; subjecting the second release material to a second energy source to completely or partially remove the second release material, wherein the first energy source includes a PEC etch; attaching the second interface regions of the second plurality of dice on the second substrate to the second intermediate member; releasing the second plurality of dice from the second substrate to transfer the second plurality of dice to the second intermediate member as second transferred dice; selectively picking up one or more of the second plurality of dice from the second intermediate member to provide second picked up dice, and placing the second picked up dice on the at least one carrier wafer, and bonding the second interface regions of the second picked up dice to the at least one carrier wafer to form second bonded structures; wherein each pair of the second bonded structures is configured with a fourth pitch between each pair of the second bonded structures, the fourth pitch being equal to or greater than the third pitch; and repeating the selectively picking up, placing, and bonding steps one or more times to transfer additional die of the second plurality of dice from the second intermediate member to the at least one carrier wafer.

In another embodiment, the method also includes providing a third substrate having a third surface region; providing a third intermediate member; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third wavelength; and a p-type gallium, indium, phosphorous, nitrogen, aluminum, arsenic, or combinations thereof containing region; patterning the third epitaxial material and forming third mesas to form a third plurality of dice arranged in a third array, each die corresponding to at least one light emitting diode device and being arranged by a fifth pitch between adjacent die in the third array; forming third interface regions overlying the third epitaxial material; subjecting the third release material to a third energy source to completely or partially remove the third release material; attaching the third interface regions of the third plurality of dice on the third substrate to the third intermediate member; releasing the third plurality of dice from the third substrate to transfer the third plurality of dice to the third intermediate member as third transferred dice; selectively picking up one or more of the third plurality of dice from the third intermediate member to provide third picked up dice, and placing the third picked up dice on the at least one carrier wafer, and bonding the third interface regions of the third picked up dice to the at least one carrier wafer to form third bonded structures; wherein each pair of the third bonded structures is configured with a sixth pitch between each pair of the third bonded structures, the sixth pitch being equal to or greater than the fifth pitch; and repeating the selectively picking up, placing, and bonding steps one or more times to transfer additional die of the third plurality of dice from the third intermediate member to the at least one carrier wafer to form the light emitting diode based display panel device operable at least at the first wavelength, the second wavelength, and the third wavelength; wherein a repeating pattern of at least one red light emitting diode device operable at the third wavelength, at least one green light emitting diode device operable at the second wavelength, and at least one blue light emitting diode device operable at the first wavelength within a two dimensional matrix of light emitting diode devices forms pixels within the light emitting diode based display panel device.

In an embodiment, the first intermediate member includes a first adhesion layer, the second intermediate member includes a second adhesion layer, and the third intermediate member includes a third adhesion layer, the method further comprising: reducing an adhesion strength of the first adhesion layer before selectively picking up the one or more of the first plurality of dice from the first intermediate member; reducing an adhesion strength of the second adhesion layer before selectively picking up the one or more of the second plurality of dice from the second intermediate member; and/or reducing an adhesion strength of the third adhesion layer before selectively picking up the one or more of the third plurality of dice from the third intermediate member.

In another embodiment, a pedestal shaped die attach collet is used to selectively pick up and place the one or more of the first plurality of dice, the second plurality of dice, and the third plurality of dice.

In another embodiment, the first interface regions of the first plurality of dice are attached to the first intermediate member using at least one of a vacuum, mechanical bonding, or chemical bonding; the second interface regions of the second plurality of dice are attached to the second intermediate member using at least one of a vacuum, mechanical bonding, or chemical bonding; and/or the third interface regions of the third plurality of dice are attached to the third intermediate member using at least one of a vacuum, mechanical bonding, or chemical bonding.

In another embodiment, at least one of the first intermediate member, the second intermediate member, or the third intermediate member is transparent to electromagnetic radiation.

In accordance with another embodiment, a method for manufacturing a light emitting diode based display panel device includes providing at least one carrier wafer; providing a first substrate having a first surface region; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing active region configured to emit electromagnetic radiation at a first wavelength, and a p-type gallium and nitrogen containing region; etching the first gallium and nitrogen containing epitaxial material and stopping the etch before reaching the first release material; forming a first passivation layer to cover exposed portions of the first gallium and nitrogen containing epitaxial material; etching portions of the first gallium and nitrogen containing epitaxial material to expose sidewalls of the first release material and forming first mesas to form a first plurality of dice arranged in a first array, each die having the first passivation layer extending along sidewalls and corresponding to at least one light emitting diode device and being arranged by a first pitch between adjacent die in the first array; forming first bond pads on the at least one carrier wafer; subjecting the first release material to a first energy source to fully or partially remove the first release material; bonding first p-side contacts of at least a first fraction of the first plurality of dice to the first bond pads on the at least one carrier wafer to form first bonded structures, while maintaining the first release material fully or partially removed from the first bonded structure; and releasing the first fraction of the first plurality of dice provided on the first substrate to transfer the first fraction of the first plurality of dice to the at least one carrier wafer as first transferred dice; wherein each pair of the first transferred dice is configured with a second pitch between each pair of the first transferred dice, the second pitch being equal to or greater than the first pitch; wherein the first energy source fully or partially removes the first release material while leaving a first anchor region intact to support the first plurality of dice before the bonding of the first fraction of the first plurality of dice to the carrier wafer; the first anchor region separating during the releasing.

In an embodiment, the method also includes providing a second substrate having a second surface region; forming a second release material overlying the second substrate; forming a second gallium and nitrogen containing epitaxial material overlying the second surface region, the second gallium and nitrogen containing epitaxial material comprising at least an n-type gallium and nitrogen containing region, a second light emitting gallium and nitrogen containing active region configured to emit electromagnetic radiation at a second wavelength, and a p-type gallium and nitrogen containing region; etching the second gallium and nitrogen containing epitaxial material and stopping the etch before reaching the second release material; forming a second passivation layer to cover exposed portions of the second gallium and nitrogen containing epitaxial material; etching portions of the second gallium and nitrogen containing epitaxial material to expose sidewalls of the second release material and forming second mesas to form a second plurality of dice arranged in a second array, each die having the second passivation layer extending along sidewalls and corresponding to at least one light emitting diode device and being arranged by a third pitch between adjacent die in the second array; forming second bond pads on the at least one carrier wafer; subjecting the second release material to a second energy source to completely or partially remove the second release material; bonding second p-side contacts of at least a fraction of the second plurality of dice to the second bond pads on the at least one carrier wafer to form second bonded structures, while maintaining the second release material completely or partially removed from the second bonded structure; and releasing the second fraction of the second plurality of dice provided on the second substrate to transfer the second fraction of the second plurality of dice to the at least one carrier wafer as second transferred dice; wherein each pair of the second transferred dice is configured with a fourth pitch between each pair of the second transferred dice, the fourth pitch being equal to or greater than the third pitch.

In another embodiment, the method also includes providing a third substrate having a third surface region; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third wavelength; and a p-type gallium, indium, phosphorous, nitrogen, aluminum, arsenic, or combinations thereof containing region; etching the third epitaxial material and stopping the etch before reaching the third release material; forming a third passivation layer to cover exposed portions of the third epitaxial material; etching portions of the third epitaxial material to expose sidewalls of the third release material and forming mesas to form a third plurality of dice arranged in a third array, each die having the third passivation layer extending along sidewalls and corresponding to at least one light emitting diode device and being arranged by a fifth pitch between adjacent die in the third array; forming third bond pads on the at least one carrier wafer; subjecting the third release material to a third energy source to completely or partially remove the third release material; bonding third p-side contacts of at least a third fraction of the third plurality of dice to the third bond pads on the at least one carrier wafer to form third bonded structures, while maintaining the third release material completely or partially removed from the third bonded structure; releasing the third fraction of the third plurality of dice provided on the third substrate to transfer the third fraction of the third plurality of dice to the at least one carrier wafer as third transferred dice; wherein each pair of the third transferred dice is configured with a sixth pitch between each pair of the third transferred dice, the sixth pitch being equal to or greater than the fifth pitch; and processing the at least one carrier wafer with at least the first fraction of the first plurality of dice, the second fraction of the second plurality of dice, and the third fraction of the third plurality of dice to form the light emitting diode based display panel device operable at least at the first wavelength, the second wavelength, and the third wavelength; wherein a repeating pattern of at least one red light emitting diode device operable at the third wavelength, at least one green light emitting diode device operable at the second wavelength, and at least one blue light emitting diode device operable at the first wavelength within a two dimensional matrix of light emitting diode devices forms pixels within the light emitting diode based display panel device.

In accordance with yet another embodiment, a method for manufacturing a light emitting diode based display panel device includes providing at least one carrier wafer; providing a first substrate having a first surface region; forming a first release material overlying the first substrate; forming a first gallium and nitrogen containing epitaxial material overlying the first surface region, the first gallium and nitrogen containing epitaxial material comprising at least an n-type gallium and nitrogen containing region, a first light emitting gallium and nitrogen containing active region configured to emit electromagnetic radiation at a first wavelength, and a p-type gallium and nitrogen containing region; patterning the first gallium and nitrogen containing epitaxial material and forming mesas to form a first plurality of dice arranged in a first array, each die corresponding to at least one light emitting diode device and being arranged by a first pitch between adjacent die in the first array; forming a first interface region overlying the first gallium and nitrogen containing epitaxial material; forming first anchor regions extending along first sidewalls of the first gallium and nitrogen containing epitaxial material and along portions of the first substrate; subjecting the first release material to a first energy source to fully or partially remove the first release material while leaving the first anchor regions intact to support the first plurality of dice; bonding the first interface region to the at least one carrier wafer to form a first bonded structure, while maintaining the first release material fully or partially removed from the first bonded structure; and removing the first anchor regions and releasing at least a first fraction of the first plurality of dice provided on the first substrate to transfer the first fraction of the first plurality of dice to the at least one carrier wafer to provide first transferred dice; wherein the first anchor regions separate during the releasing, and each pair of the first transferred dice is configured with a second pitch between each pair of the first transferred dice, the second pitch being equal to or greater than the first pitch.

In an embodiment, the method also includes providing a second substrate having a second surface region; forming a second release material overlying the second substrate; forming a second gallium and nitrogen containing epitaxial material overlying the second surface region, the second gallium and nitrogen containing epitaxial material comprising at least an n-type gallium and nitrogen containing region, a second light emitting gallium and nitrogen containing active region configured to emit electromagnetic radiation at a second wavelength, and a p-type gallium and nitrogen containing region; patterning the second gallium and nitrogen containing epitaxial material and forming mesas to form a second plurality of dice arranged in a second array, each die corresponding to at least one light emitting diode device and being arranged by a third pitch between adjacent die in the second array; forming a second interface region overlying the second gallium and nitrogen containing epitaxial material; forming second anchor regions extending along second sidewalls of the second gallium and nitrogen containing epitaxial material and along portions of the second substrate; subjecting the second release material to a second energy source to completely or partially remove the second release material while leaving the second anchor regions intact to support the second plurality of dice; bonding the second interface region to the at least one carrier wafer to form a second bonded structure, while maintaining the second release material completely or partially removed from the second bonded structure; removing the second anchor regions and releasing at least a second fraction of the second plurality of dice provided on the second substrate to transfer the second fraction of the second plurality of dice to the at least one carrier wafer to provide second transferred dice; wherein the second anchor regions separate during the releasing, and each pair of the second transferred dice is configured with a fourth pitch between each pair of the second transferred dice, the fourth pitch being equal to or greater than the third pitch.

In another embodiment, the method also includes providing a third substrate having a third surface region; forming a third release material overlying the third substrate; forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third wavelength; and a p-type gallium, indium, phosphorous, nitrogen, aluminum, arsenic, or combinations thereof containing region; patterning the third epitaxial material and forming mesas to form a third plurality of dice arranged in a third array, each die corresponding to at least one light emitting diode device and being arranged by a fifth pitch between adjacent die in the third array; forming a third interface region overlying the third epitaxial material; forming third anchor regions extending along third sidewalls of the third epitaxial material and along portions of the third substrate; subjecting the third release material to a third energy source to completely or partially remove the third release material while leaving the third anchor regions intact to support the third plurality of dice; bonding the third interface region to the at least one carrier wafer to form a third bonded structure, while maintaining the third release material completely or partially removed from the third bonded structure; removing the third anchor regions and releasing at least a third fraction of the third plurality of dice provided on the third substrate to transfer the third fraction of the third plurality of dice to the at least one carrier wafer as third transferred dice; wherein the third anchor regions separate during the releasing, and each pair of the third transferred dice is configured with a sixth pitch between each pair of the third transferred dice, the sixth pitch being equal to or greater than the fifth pitch; and processing the at least one carrier wafer with at least the first fraction of the first plurality of dice, the second fraction of the second plurality of dice, and the third fraction of the third plurality of dice to form the light emitting diode based display panel device operable at least at the first wavelength, the second wavelength, and the third wavelength; wherein a repeating pattern of at least one red light emitting diode device operable at the third wavelength, at least one green light emitting diode device operable at the second wavelength, and at least one blue light emitting diode device operable at the first wavelength within a two dimensional matrix of light emitting diode devices forms pixels within the light emitting diode based display panel device.

In accordance with yet another embodiment, a micro LED device includes a carrier substrate selected from a silicon wafer, a sapphire wafer, a glass wafer, a glass ceramics wafer, a quartz wafer, a high purity fused silica wafer, a silicon carbide wafer, an aluminum nitride wafer, a germanium wafer, an aluminum oxynitride wafer, a gallium arsenide wafer, a diamond wafer, a gallium nitride wafer, an indium phosphide wafer, a flexible member, a circuit board member, a silicon wafer with CMOS circuitry, silicon on insulator (SOI) wafer, or a gallium nitride on silicon wafer; an array of pixel elements on the carrier substrate, the array of pixel elements including a plurality of dice comprising red dice, blue dice, and green dice, wherein each of the red dice, the blue dice, and the green dice comprise an epitaxial material different from the carrier substrate, and each of the red dice, the blue dice, and the green dice are coupled to the carrier substrate by a bonding layer; wherein one or more of the plurality of dice is a repaired die having a different bonding structure from the bonding layer and provides a yield of 80 to 100%.

In an example, the present semiconductor device die configured with carrier, which can serve as a submount, can be packaged into a module without any further liftoff process or the like. The process is efficient and uses conventional process technology. Depending upon the embodiment, these and other benefits may be achieved.

In an example, the present invention enables the integration of different semiconductor devices onto a common carrier for integration to increase functionality of the resulting semiconductor chip formed on the carrier wafer.

Various embodiments of this invention can be used to realize one or more of the following benefits for semiconductor devices based on gallium and nitrogen containing epitaxial material;

1. This invention enables wafer process of high quality pseudomorphically grown gallium and nitrogen containing devices on carrier wafers with very large diameter. For example, the gallium and nitrogen containing devices can be processed on 2", 4", 6", 8", 12" or even larger carrier wafers for dramatically reduced wafer fabrication costs compared to processing on native GaN substrates. Since current native GaN substrates are limited to 2" diameter in high volume and are only now being introduced at 4" diameter in low volume such substrates are far behind the scaling roadmap of the more mature silicon, sapphire, silicon carbide and other substrates. This invention enables wafer process of high quality gallium and nitrogen containing devices on carrier wafers of more mature substrate technologies, overcoming the limitations associated with small GaN wafer availability. As an example, LED devices formed on native bulk GaN substrates are limited to 2" or 4" wafer fab, which is not competitive with devices formed on silicon, sapphire, silicon carbide. Of course, in some embodiments for the fabrication of devices such as LEDs the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

2. This invention enables the fabrication of semiconductor devices from high quality low-defect-density gallium and nitrogen epitaxial material pseudomorphically grown on native substrates with drastically reduced consumption of the native substrate such as a GaN substrate, allowing device implementation in applications where very low cost is critical. Using conventional growth and processing techniques on native GaN substrates is cost prohibitive since it requires consumption of the native substrates with each wafer fabrication. These native substrates are orders of magnitude more expensive than more mature substrate technologies such as silicon, sapphire, silicon carbide, gallium arsenide, and indium phosphide. Since this invention provides a method to transfer high-quality gallium and nitrogen containing material from a native gallium and nitrogen containing substrate to a carrier wafer without destruction of the native substrate, the native substrate can be re-used. This invention enables the native GaN substrate to be re-used 10 or more times. As an example, high electron mobility transistors are conventionally formed on silicon wafers, sapphire wafers, or silicon carbide wafers and are comprised of a buffer layer at the substrate interface to mitigate defects resulting from the heteroepitaxial structure. Although this heteroepitaxial approach is not ideal because the defects in the epitaxy can limit the device performance, it does enable the formation of devices with sufficient performance and the required cost structure. However, this invention will enable devices to be fabricated from pseudomorphic epitaxial material for much lower defect density material with a very similar scale and cost structure.

3. This invention enables improved utilization of the high quality gallium and nitrogen containing through a "die expansion" technology. Since this invention enables the high quality gallium and nitrogen containing epitaxial material to be transferred to the carrier wafer at a different [i.e. larger] pitch than the pitch formed on the gallium and nitrogen containing substrate, the epitaxial material can be strategically positioned on the carrier wafer to only occupy regions where it is needed within the final semiconductor device. That is, the epitaxial semiconductor device layers can be sized and positioned only where they are needed within the final semiconductor device architecture. Since many finished semiconductor devices have chip area functioning to support bond pad regions, dissipate heat, help light extraction, etc. wherein active epitaxial material is not required, it is wasteful to use area that is occupied or was occupied by the costly epitaxial material.

4. This invention enables the use of gallium and nitrogen containing nonpolar and semipolar oriented substrates in commercial semiconductor devices. The current small size and high cost of nonpolar and semipolar substrates limits their application to commercially viable semiconductor devices. Through the improved usage of substrate and epitaxial area by die expansion, the transfer of the epitaxy to large carrier wafers for device fabrication, and the ability to re-use the gallium and nitrogen containing substrates, the cost and size challenges can be overcome, enabling proliferation of nonpolar and semipolar based GaN devices in a wide range of applications.

BRIEF DESCRIPTION OF THE DRAWINGS

FIG. 1A is a simplified process flow for epitaxial preparation in an example of the present invention.

FIG. 1B is a simplified process flow for epitaxial preparation in an example using active region protect layers of the present invention.

FIG. 2A is a simplified process flow for bonding and then etching the sacrificial regions in an example of the present invention.

FIG. 2B is a simplified process flow for partially or nearly completely etching the sacrificial region and then bonding wherein the unetched regions act as anchors used for mechanical support to epitaxial mesas in an example of the present invention.

FIG. 2C is a simplified process flow for etching the sacrificial region and then bonding wherein non semiconductor anchor features are used for mechanical support to epitaxial mesas in an example of the present invention.

FIG. 2D is a simplified process flow for etching the sacrificial region and then bonding wherein semiconductor anchor features are used for mechanical support to epitaxial mesas in an example of the present invention.

FIG. 2E is a simplified top-view schematic of semiconductor anchor features providing mechanical support to epitaxial mesas in an example of the present invention.

FIG. 2F is a simplified side-view schematic of process flow for using semiconductor anchor features providing mechanical support to epitaxial mesas in an example of the present invention.

FIG. 2G is a simplified top-view schematic of metal anchor features providing mechanical support to epitaxial mesas in an example of the present invention.

FIG. 2H is a simplified side-view schematic of process flow for using metal anchor features providing mechanical support to epitaxial mesas in an example of the present invention FIG. 2I is a simplified schematic of electrical circuit formed during PEC etching with metal anchors connecting the anode and cathode in an example of the present invention.

FIG. 3A is a simplified side view of a selective area bonding process in an example of the present invention.

FIG. 4A is a simplified schematic diagram illustrating transferring epitaxy device layers from various substrate sizes to 100, 200 and 300 mm carrier wafers in an example of the present invention.

FIG. 4B is a simplified schematic illustrating how the of carrier wafer can be processed to form the submount of the final semiconductor device structure in an example of the present invention.

FIG. 5 is a simplified schematic process flow illustrating substrate re-use in an example of the present invention.

FIGS. 6A-6E are simplified schematics of exemplary epitaxial structures of LED devices according to some embodiments of the present invention.

FIG. 6F is a simplified schematic illustration of die expansion of an LED device epitaxial structure with a non-rectangular shape in an example of the present invention.

FIG. 6G is a simplified schematic illustrating the formation of a micro LED display panel example according to the present invention.

FIG. 6H is a simplified schematic illustrating the formation of a micro LED display panel example according to the present invention.

FIG. 6I is a simplified schematic illustrating the formation of a micro LED display panel example according to the present invention.

FIG. 6J is a simplified schematic illustrating the formation of a micro LED display panel example according to the present invention.

FIG. 6K is a simplified schematic illustrating an example of a multiplexing configuration in a transferred micro LED display array according to this invention.

FIG. 6L is a simplified schematic illustrating an example of a multiplexing configuration in a transferred micro LED display array according to this invention.

FIG. 6M is a simplified schematic illustrating the micro LED display apparatus example according to the present invention.

FIG. 7A is a simplified schematic of an LED epitaxial structure in an example of the present invention.

FIG. 7B is a simplified schematic of an LED epitaxial structure transferred to a carrier wafer in an example of the present invention.

FIGS. 8A-8C are flowcharts of exemplary methods that include screening die during a transfer process in accordance with some embodiments.

FIGS. 9A-9D are simplified cross sectional diagrams illustrating a process of selective anchor removal in accordance with an embodiment.

FIGS. 10-11 are simplified cross sectional diagrams illustrating some of the challenges with bonding die to a carrier wafer in a transfer process.

FIGS. 12A-12D are simplified cross sectional diagrams illustrating a process for transferring die having a large pitch on a donor substrate to a carrier substrate at a smaller pitch in accordance with an embodiment.

FIGS. 13A-13F are simplified cross sectional diagrams illustrating a process for transferring die from a donor substrate to a carrier substrate by varying bond pad thickness on the carrier substrate in accordance with an embodiment.

FIGS. 14A-14D are simplified cross sectional diagrams illustrating a process for transferring die from a donor substrate to a carrier substrate by varying die height in accordance with an embodiment.

FIGS. 16A-16C are simplified cross sectional diagrams illustrating a round robin sequence for transferring die from a donor substrate to a carrier substrate in accordance with an embodiment.

FIGS. 17A-17F are simplified cross sectional diagrams illustrating a process for transferring die from a donor substrate to a carrier substrate using an intermediate member in accordance with an embodiment.

FIGS. 18A-18I are simplified cross sectional diagrams illustrating a process for passivating sidewalls of epitaxial material in accordance with an embodiment.

DETAILED DESCRIPTION

Figure 15A:
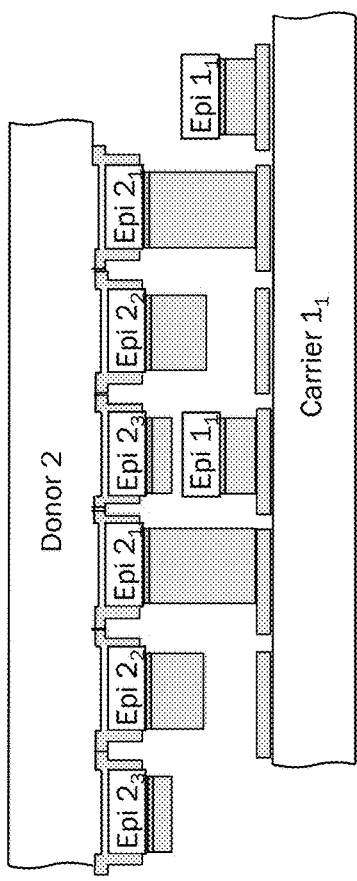
FIGS. 15A-15I are simplified cross sectional diagrams illustrating a process for transferring die from a donor substrate to a carrier substrate by varying die height in accordance with another embodiment.

Embodiments of the invention provide methods for fabricating semiconductor devices based on gallium and nitrogen containing epitaxial materials grown on bulk gallium and nitrogen containing substrates. Typically these devices are fabricated using an epitaxial deposition on a gallium and nitrogen containing substrate followed by processing steps on the epitaxial substrate and overlying epitaxial material. In some embodiments for the fabrication of devices such as LEDs the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. By using a selective etch process such as a photoelectrochemical (PEC) etch combined with a bonding process at least a portion of the epitaxial material is transferred to one or more carrier wafers. Subsequently, the carrier wafer with the bonded epitaxial material is subjected to processing steps to form semiconductor devices including optical devices such as light emitting diodes. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, flat panel displays, curved or flexible panel displays, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like. What follows is a general description of the typical configuration and fabrication of these devices.

The invention involves a semiconductor device wafer composed of one or more sacrificial layers and one or more device layers overlying the surface region of a substrate wafer. The substrate wafer comprising a bulk gallium and nitrogen containing material such as GaN, but can be others. In the example of a GaN substrate, the GaN substrate can be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the substrate surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

Current state of the art is to use bulk GaN substrates produced by growth of reduced defect density boules either by hydride vapor phase epitaxy or ammonothermal growth. In both cases relatively large (e.g. typically two inch diameter or greater) GaN c-plane substrates can be produced which have relatively low density of uniformly distributed defects. Growth on c-plane wafers is advantageous to growth on non-polar and semi-polar oriented GaN wafers only in the aspect that two-inch and greater diameter c-plane wafers are currently available and non-polar and semi-polar orientations are generally restricted in size due to their being crosscut from c-plane oriented boules.

Polar c-plane GaN wafers with no offcut are oriented primarily with the surface normal parallel to the [0001] direction of the wurtzite crystal lattice. The wafer may have an offcut, where the surface normal of the wafer is tilted towards one or a combination of the <11-20> or <10-10> directions. For an arbitrary offcut direction one would normally specify the tilt towards orthogonal pairs of directions found in the <11-20> and <10-10> families. For example, [10-10] and [1-210] are orthogonal and might be used to specify an arbitrary offcut. In general, offcuts will be predominantly towards only one of the <11-20> or <10-10> directions, with only relatively small deviations. For example, a c-plane wafer may have an offcut between 0.1 and 10 degrees towards the [10-10] direction or it may have an offcut between 0.1 and 10 degrees towards the [11-20] direction. Though larger and smaller offcuts would be possible, a wafer with an offcut less than 0.1 degrees would be considered to be nominally on-axis.

Wafer offcut is important because it will determine both the density of atomic steps on the wafer surface as well as the termination of the step edges. Because an arbitrarily oriented surface of a crystal is likely to have a high surface energy, a crystal will tend to form an approximation of an inclined face using a collection of low energy planes. In general, an offcut c-plane wafer would result in a stepped surface comprised of [0001] step surfaces and step-edges composed of prismatic planes (i.e. (11-20) or (10-10)). Due to anisotropy in the crystal structure the number and configuration of dangling bonds at (11-20) step edges will be different from those at a (10-10) step edge. Since the direction and magnitude of the offcut controls the density and orientation of the step edges, a large amount of control over the chemical character of the substrate can be affected by offcut. Many growth processes such as chemical ordering, incorporation of volatile species and formation of stacking faults can be linked to the way atoms incorporate at the edges of steps. Therefore, proper selection of substrate offcut is critical to achieving the best epitaxial film quality.

Though c-plane wafers are larger than non-polar and semi-polar oriented wafers and offer a cost advantage, they have a severe drawback is in some semiconductor devices that result from internal fields originating from spontaneous and piezo induced polarization fields. In light emitting devices that use quantum wells, the internal polarization field result in a spatial separation of electron and hole states within the quantum wells that negatively impacts the radiative recombination efficiency. Using narrow wells has been the approach taken in both LED and laser devices based on polar GaN. In LEDs, the narrow quantum wells lead to high carrier density, which exacerbates the droop phenomenon that leads to the nonlinear light output versus current input of LEDs, and ultimately limits the efficiency. By using nonpolar or semipolar GaN substrate orientations for LEDs and laser diodes, these internal fields can be reduced and improved performance is possible. Similarly, in electronic devices there are aspects wherein having reduced internal fields or reduced polarization fields, semiconductor electronic devices with improved performance can be formed.

The limited currently available size and increased cost of nonpolar and semipolar substrates limits their practicality for deployment in commercial semiconductor devices. A powerful breakthrough enabled by this present invention is the use of nonpolar or semipolar substrates at a low cost since die expansion can be used, substrates can be re-used, and the overlying epitaxy of small wafers can be transferred onto larger carrier wafers for device fabrication. In a specific embodiment, the gallium nitride substrate member is a bulk GaN substrate characterized by having a semipolar or nonpolar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$.

Of course, in some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

Another advantage offered by the present invention is the ability to access either the Ga-face or the N-face of the gallium and nitrogen containing epitaxial device layers for device fabrication and contact formation. For example, if the epitaxial layers are grown on a Ga-face substrate the epitaxial layers will be formed terminating with a Ga-face surface. After the epitaxy is transferred to the carrier wafer for process the N-face will be exposed for process. The N-face may provide an advantage to the device such as an improved contact property or an improved behavior for the semiconductor layers. In the case where it is desirable to do the device fabrication with the Ga-face on the surface, semiconductor process steps may be performed on the epitaxial wafers prior to transfer to the carrier wafer. The order of the epitaxial stack can be arranged to provide the most benefit to the device.

Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is used to fully or partially remove the one or more sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the one or more sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

The preparation of the epitaxy wafer is shown in FIG. 1A. A substrate 100 is overlaid by a buffer layer 101, a selectively removable sacrificial layer 107, an buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 1A is a top down etch to expose the sacrificial layers, followed by a bonding metal deposition as shown in FIG. 1A. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall, as shown in FIG. 1B. The device layers 102 are exposed using an etch and an etch resistant protect layer 104 is deposited overlaying the edges of the device layers such that they are not exposed to the etch chemicals. The sacrificial layer is then exposed by an etch of vias. A bonding layer 108 is deposited and a selective etch process is used to remove the sacrificial layers. In some embodiments the bonding layer is deposited after the selective etch. This workflow is advantageous when the device layers are susceptible to damage from the etch process used to remove the sacrificial layer. With the sacrificial region exposed a bandgap selective PEC etch is used to undercut the mesas. At this point, the selective area bonding process shown in FIG. 1B is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In one embodiment wherein the semiconductor device comprises active light emitting layers such as LEDs, PEC etching is achieved without the use of an active region protecting layer by electrically shorting the p-side of the LED pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example, an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercially available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the oxide surface. For example, the exposed surface of the gallium containing material may be treated to form a thin layer of gallium oxide, which being chemically similar to the oxide bonding surface will bond more readily. Furthermore, the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with one or more of acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, glass, gallium arsenide, sapphire, silicon carbide, diamond, gallium nitride, AlN, polycrystalline AlN, indium phosphide, germanium, quartz, copper, gold, silver, aluminum, aluminum oxynitride, stainless steel, or steel.

In another embodiment, the carrier wafer is selected based on size and cost. For example, ingle crystal silicon wafers are available in diameters up to 300 mm or 12 inch and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

In one embodiment of this invention, the bonding of the semiconductor device epitaxial material to the carrier wafer process can be performed prior to the selective etching of the sacrificial region and subsequent release of the gallium and nitrogen containing substrate. FIG. 2A is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 2A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer.

FIGS. 2A-2I, as well as the other figures in this application, are for illustrative purposes only and the physical dimensions and proportions are not intended to be exact for an LED, The device layers can be comprised of many configurations suited for the specific semiconductor device. For example, an LED device structure would be comprised of one or more n-type gallium and nitrogen containing layers, an active region comprised of one or more quantum well layers, and one or more p-type gallium and nitrogen layers. The epitaxial material is subjected to processing steps such as metal and dielectric deposition steps, lithography, and etching steps to form mesa regions with a bond region on the top. The carrier wafer 108 which is patterned with bond pads 107 is brought into contact with the bond layers 105 using a precision alignment process. After the bonding process is complete, the sacrificial etch is carried out. The selective etch of the sacrificial layer releases the mesas from the substrate.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In an example, FIG. 2B is a schematic representation of the "etch then bond" process flow where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photo-electrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing substrate prior to the bonding step wherein they are releases from the gallium and nitrogen containing substrate and transferred to the carrier wafer.

Anchor regions are special features that can be designed into the photo masks which attach the undercut device layers to the gallium and nitrogen containing substrate, but which are too large to themselves be undercut, or which due to the design of the mask contain regions where the sacrificial layers are not removed or these features may be composed of metals or dielectrics that are resistant to the etch. In some embodiments, the anchor regions may be formed using passivating dielectric layers. A reflective coating on top of the dielectric layers may assist with light extraction. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. FIG. 2C is a schematic representation of the "etch then bond" process flow where the mesas are retained on the substrate by deposition of an etch resistant material acting as an anchor by connecting the mesas to the substrate. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photo-electrochemical etch process for selectively removing the sacrificial layer. A layer of etch resistant material 107, which may be composed of metal, ceramic, polymer or a glass, is deposited such that it connects to both the mesa and the substrate. The selective etch process is carried out such that the sacrificial layer is fully removed and only the etch-resistant layer 107 connects the mesa to the substrate FIG. 2D is a simplified schematic representation of the "etch then bond" process flow where the mesas are retained on the substrate by use of an anchor composed of epitaxial material. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer. The anchor is shaped such that during the etch, a small portion of the sacrificial layer remains unetched 108 and creates a connection between the undercut mesa and the substrate wafer.

In one embodiment the anchors are positioned either at the ends or sides of the undercut die such that they are connected by a narrow undercut region of material. FIG. 2E shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

FIG. 2E shows a top-view schematic of an example of a transferable mesa of GaN epitaxial material with a metal anchor bridging between the bond metal on the top of the mesa and the cathode metal in the etched field. FIG. 2F presents a cross-sectional view of an example of a transferable semiconductor device layer mesa at the location of a metal anchor. Here the mesa is formed by dry or wet chemical etching, and for an example of an LED structure includes the one or more p-type GaN layers, the light emitting layers, and the one or more n-type GaN layers, the sacrificial layer, and a portion of the n-type GaN epitaxial layer beneath the sacrificial layer. A p-contact metal is first deposited on the p-type GaN in order to form a high quality electrical contact with the p-type GaN. A second metal stack is then patterned and deposited on the mesa, overlaying the p-contact metal. The second metal stack consists of an n-contact metal, forming a good electrical contact with the n-type GaN beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

FIG. 2G is a schematic representation of charge flow in a device using a metal anchor during PEC etching of the sacrificial layer. It is possible to selectively etch the sacrificial layer even if the pump light is absorbed by the active region. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal anchors where they recombine. The flat band conditions in the sacrificial region result in a buildup of holes that result in rapid etching of the sacrificial layers.

The use of metal anchors as shown have several advantages over the use of anchors made from the epitaxial device material. The first is density of the transferrable mesas on the donor wafer containing the epitaxial semiconductor device layers and the gallium and nitrogen containing bulk substrate or on the foreign substrate in the case of hetereopitaxy. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example, the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate or foreign substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

FIG. 3A is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 3A, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 3A. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 3A. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 micron and about 500 microns wide or between about 500 micron and about 3000 microns wide and between about 100 and about 3000 µm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, semiconductor LED devices or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

In some embodiments, multiple semiconductor device die are transferred to a single carrier wafer and placed within close proximity to each other. Dice in close proximity are preferably within one millimeter of each other but could be other.

In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

A most important breakthrough of this technology is enabling the die expansion technology as described above. By enabling the gallium and nitrogen containing epitaxial layer dice to be transferred to the carrier wafer at a larger pitch the expensive gallium and nitrogen containing substrate and epitaxial device layers can be more efficiently utilized. Additionally, a larger area will be required on the carrier wafer than the area of the gallium and nitrogen containing substrate. For example, in a fix expansion configuration, a carrier wafer with 4 times larger area will be required to receive all of the transferred device dice. This is powerful feature for GaN devices formed on GaN substrates since currently bulk GaN substrates are commercially available in 2" diameter with recent announcements of 4" diameter sampling. These wafer diameters are relatively small compared to the well-established silicon substrate technology, which are currently available at diameters up to 12". For example, a 12" substrate has 36 times the substrate area of a 2" GaN substrate and 9 times the substrate area of a 4" GaN substrate, which are not yet available in high volume. This drastically larger area enables device processing with orders of magnitude more die per wafer to provide massive reductions in manufacturing costs.

FIG. 4A is an illustration of bondable area for various substrate dimensions on a 100 mm diameter carrier wafer 1001. In this configuration die expansion is happening in one dimension only. The number of transfers possible is fixed by the size and shape of the substrate relative to the carrier.

Several examples are shown, including 25.4 mm diameter wafers 1002, 32 mm diameter wafers 1003 and 2×2 cm² substrates 1004. Other combinations of 50 mm diameter substrates 1006 and various carrier wafers are shown: 100 mm 1001, 200 mm 1005 and 300 mm 1007.

Selection of the carrier wafer with high thermal conductivity (e.g. greater than about 150 K/mW) can offer many advantages including enabling a lower device operation temperature, which typically improves device performance. In addition, a high thermal conductivity submount may also allow for the use of full thickness carrier wafers (e.g. >about 300 microns) with low thermal resistance, therefore no thinning of the carrier wafer is required. In another embodiment of the invention bar and die singulation is achieved with a sawing process. Sawing is a well-established process used for the singulation of LEDs and other semiconductor devices.

In one example where high thermal conductivity is desired, SiC is used as both a carrier and a submount. SiC is available in wafer diameters up to about 150 mm from multiple vendors with high thermal conductivities ranging from about 360-490 W/mK depending on the crystal polytype and impurities. FIG. 4B (12) shows a schematic of the cross section of a SiC wafer 402 used as both a carrier wafer and a submount for a resulting semiconductor device. Before transfer of the device material the SiC wafer is fabricated with a bonding layer 401 for attachment to the semiconductor device package. The opposing face of the SiC wafer is fabricated with a thin, electrically insulating layer 403, electrically conductive traces and wire-bond pads 405 and an electrically conductive bonding media 108. The device material is then transferred to the carrier via previously described processes. Electrical isolation layers 408 are fabricated on the wafer using standard lithographic processes and electrical contacts and wire bond pads 407 are made to the top-side of the semiconductor device. The electrical isolation layers are important to ensure that the semiconductor devices are electrically isolated from the package or heat sink. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401.

After completion of fabrication of the semiconductor devices on the carrier wafer, the carrier wafer will be diced into semiconductor devices in a die singulation process. In one embodiment of the invention, the die singulation is achieved with a sawing process. Sawing is a well-established process used for the singulation of LEDs and other semiconductor devices. For example, DISCO saws can be used. DISCO's dicing saws cut semiconductor wafers (Si, GaAs, etc.), glass, ceramic, and a wide variety of other materials at a level of precision measured in micrometers.

In another embodiment of the invention the die singulation is achieved by a scribing and breaking process. For example, a diamond or laser scribing process may be used wherein the carrier wafer is subjected a scribing. In the case of a laser scribing process, a UV laser may be used induce a scribe profile in the carrier substrate. The carrier substrate is then subjected to a breaking process.

In another embodiment of the invention the die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment the carrier wafer is a device wafer itself. In one example, the carrier wafer is a silicon wafer and comprised of Si Complementary metal-oxide-semiconductor (CMOS) devices such as transistors.

Another advantage is that this invention transfers the epitaxial material comprising the semiconductor device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. Since it is both substrate size and substrate cost associated with many types of semiconductor devices formed on bulk gallium and nitrogen containing substrates preventing mainstream adoption, this technology overcomes this barrier and can enable mainstream adoption of highly cost sensitive devices such as LEDs and power electronic devices. Relative to more mature substrate technologies such as silicon, sapphire, and silicon carbide, GaN substrates are both small and expensive. This in itself is prohibitive to the realization of cost competitive LED and electronic power devices using conventional methods on bulk GaN substrates. By enabling both die expansion and substrate re-use, this invention breaks those barriers and allows for the fabrication of high performance LED devices and power devices at a competitive cost. Moreover, it enables the fabrication of GaN-based LEDs at a fraction of the cost of LEDs fabricated with conventional technologies where die expansion and substrate re-use are not possible.

In this invention the substrate can be recycled by reconditioning the surface to an epi-ready state using a combination of one or more of lapping, polishing and chemical mechanical polishing. Substrate recycling would require removal of any variation in wafer height remaining from the transfer process. FIG. 5 is an illustration of a substrate re-use process. According to this embodiment, an epitaxial substrate 504 is provided. An epitaxial process is carried out where a buffer-layer 503 is deposited with a thickness between 1 and 50 microns. The buffer layer consists of the same material as the substrate. The buffer layer is overlaid by the selectively removable sacrificial layer 502 and the device layers 501. The epitaxial wafer is then processed in accordance with embodiments of this invention including deposition of a cathode layer 505 and a bond layer 506. The selective etch and bond process is carried out such that the device mesas are transferred from the substrate. The substrate now consists of the original substrate, the buffer layer which is now patterned with mesas and trenches and the cathode layer. The cathode layer is optionally removed with etches. Finally, the buffer layer is removed by lapping, polishing and chemical mechanical polishing (CMP) such that the semiconductor substrate surface is returned to an equivalent condition as before the epitaxial growth. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process.

Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (<about 10 nm) roughness. Final cleaning steps may include use of a surfactant to remove residual slurry as well as cleans to remove contaminants such as exposure to acidic solutions (for example HCl, HCl:HNO$_3$, HF and the like) and exposure to solvents (for example isopropanol, methanol and acetone). In some embodiments the buffer layer thickness is chosen such that the substrate thickness is not reduced after lapping and CMP. In other embodiments the substrate is allowed to thin during successive reclamations. We estimate a substrate could be recycled more than 10 times without significant change in thickness. In some embodiments, the epitaxial layers include thick buffers that are subsequently removed by the recycling process, thereby leaving the net thickness of the substrate unchanged or even enabling the thickness to increase.

With the basics of the invention describing the transfer of the gallium and nitrogen containing device layers from the bulk gallium and nitrogen containing substrate to a carrier wafer using a PEC undercut and bonding technology described that enables die expansion, leveraging of large carrier wafer size for fabrication, re-use of native gallium and nitrogen containing substrates, and integration of multiple functionality semiconductor devices, specific examples of device layers and the resulting devices can now be described. This invention can be extended to many and almost all semiconductor devices so the descriptions provided here are merely examples and there could be many others.

Of course, in some embodiments of the present invention the gallium and nitrogen containing epitaxial device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

In an embodiment of this invention, the epitaxial device layers comprise an AlInGaN light emitting diode (LED). AlInGaN LEDs contain n-type and p-type cladding layers surrounding light emitting layers. The p-GaN is typically kept thin with p-GaN thicknesses typically on the order of 100-300 nm and preferably on the order of 0.5 to 1.5 times the wavelength in GaN of the light emitted from the LED. The p-contact metal is usually either highly reflective, such as Ag or Al, a diffusion Bragg reflector (DBR), or in the case where light is extracted through the p-GaN surface, the p-contact is formed from a transparent conductive oxide [i.e., ITO or ZnO] such that adequate current spreading is achieved in the relatively resistive but thin p-GaN. The n-type cladding is normally thicker than the p-type. Often the surface of the n-type GaN is roughened or the interface between the n-type GaN and a heteroepitaxial substrate (as in the case of GaN grown on sapphire) is roughened so as to scatter light out of the crystal.

AlInGaN LEDs are typically more efficient as the operational current density is reduced. In order to produce useful amounts of light with high efficiency, LED die tend to be relatively large compared to other devices such as laser diodes. State of the art LEDs often have areas bigger than 1 mm2, and at industry standard operating currents of 350, 750 and 1000 mA operate at current densities of 35, 75 and 100 A/cm2. These current densities are 1-2 orders of magnitude lower than typical operational current densities for state of the art high-power blue-light-emitting GaN laser diodes. Due to the large amount of epitaxial material used in LEDs it is highly advantageous for manufacturers to utilize as high a fraction of the epitaxial material as possible from each wafer, and unlike a conventional laser diode the majority of the device area is light emitting. In typical AlInGaN LED manufacturing processes, the die are singulated from the epitaxial device wafer by thinning and either cleaving or sawing the wafer. The dice are then transferred to a submount using a serial pick-and-place process. The submount is typically formed from a wafer or tile of electrically insulating material, can be patterned with bond pads and electrical interconnects, acts as a mechanical support for the LED die, provides a means of electrical access to the die, supports primary optics and encapsulation materials which are in general formed from silicone and often supports accessory semiconductor devices such as diodes providing protection from electrostatic discharge damage.

In an embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical (PEC) etch process where the sacrificial InGaN is optically pumped with wavelengths of light shorter than 450 nm. Overlaying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is an active region consisting of one or more InGaN quantum wells with thickness between 1.5 and 10 nm separated by barriers of substantially wider bandgap. Typically the barriers will be formed from GaN. Overlaying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3. The n-type InGaN buffer is typically included to improve the internal quantum efficiency of the LED. Many explanations are given for the mechanism behind this improvement, including relaxation of strain in the active region quantum wells, a surfactant effect of the indium resulting in advantageous surface morphology during active region growth and alteration of the electric fields in the active region.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that described above wherein the GaN substrate would be replaced by the foreign substrate such as sapphire, SiC, or silicon. Further, in many embodiments of heteroepitaxial growth a nucleation layer would be included on the foreign substrate underlying the buffer layer.

In another embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical etch process where the sacrificial InGaN is optically pumped with wavelengths of light shorter than 450 nm. Overlying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an active region consisting of one or more InGaN quantum wells with thickness between 1.5 and 10 nm separated by barriers of substantially wider bandgap. Typically the barriers will be formed from GaN. Overlying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that described above wherein the GaN substrate would be replaced by the foreign substrate such as sapphire, SiC, or silicon. Further, in many embodiments of heteroepitaxial growth a nucleation layer would be included on the foreign substrate underlying the buffer layer.

In an embodiment, blue and green LEDs based on gallium and nitrogen containing epitaxial materials could be provided by heteroepitaxial growth of on a substrate that is not gallium nitride. These heteroepitaxial substrates may include sapphire, SiC, gallium oxide, spinel, lanthanum aluminate, magnesium oxide, and silicon among others. The orientation of these gallium and nitrogen containing epitaxial films may be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the film surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

In an example embodiment, a gallium and nitrogen containing epitaxial film is deposited via heteroepitaxial growth on a sapphire substrate. The sapphire substrate is first overlaid with a nitrogen containing nucleation layer. Typically the nucleation layer material is GaN, though it may also be AlN or AlGaN and may also contain a layer provided by converting part of the sapphire wafer surface. For example, the surface of the sapphire wafer could be converted from $Al_2O_3$ to AlN or $AlO_xN_y$ (where x+y=1) by exposing the sapphire substrate to ammonia at high temperatures in the MOCVD reactor. The nucleation layer is grown relatively cold, at a temperature below 700 degrees Celsius. Relatively cold growth is used to produce a high density of individual GaN crystals on the substrate surface. Each crystal of the nucleation layer is partially or fully strain-relaxed, which is accommodated by a network of misfit dislocations that form at the interface between the nucleation layer and the substrate. The substrate is then annealed in the MOCVD reactor at elevated temperature typically above 1000 degrees Celsius. The anneal is intended to refine the grain structure of the nucleation layer by desorbing material such that smaller grains are fully desorbed. After the anneal, a gallium and nitrogen containing "buffer" or "coalescence" layer is grown. The buffer layer is grown under conditions promoting lateral growth of gallium and nitrogen containing crystals preferentially to vertical growth. This results in the coalescence of the individual crystals into a continuous and fully dense film covering the sapphire surface. When individual crystals coalesce into a continuous film the misfit dislocations that relieve strain turn upwards at the boundaries between the individual crystals and form a network of threading dislocations that extend through the thickness of the epitaxial film. Threading dislocation density of the resulting gallium and nitrogen containing film is dependent on three factors: minimizing the number of crystals in the nucleation layer and thereby limiting the amount of interface between coalescing crystals, selecting conditions for nucleation layer growth and anneal that minimize misorientation of the nitrogen containing crystals relative to the heteroepitaxial substrate crystal orientation, and selection of buffer layer growth conditions that cause threading dislocations to bend such that as the epitaxial layers are grown thicker threading dislocations have the opportunity to intersect and either combine or annihilate such that the total threading dislocation density is reduced. By using such techniques, it is possible to achieve threading dislocation densities in the range of 1E7~1E8 $cm^{-2}$.

The fully coalesced epitaxial layer is then overlaid with a gallium and nitrogen containing buffer layer where dislocation density is further reduced and surface morphology improved; i.e. made smoother. The buffer layer is overlaid by a sacrificial layer as previously described to be used in the selective removal of the epitaxial device layers from the heteroepitaxial substrate.

In some embodiments, the nucleation and buffer layers are used to chemically passivate the heteroepitaxial substrate. For example, in growth on silicon and SiC it is possible for a gallium-rich environment to result in dissolution of the substrate yielding degradation of the substrate surface morphology as well as subsequent unintentional doping of the heteroepitaxial layers with silicon or carbon. In an example, a nucleation layer of AlN grown under highly nitrogen rich conditions is used as a nucleation layer on Si and SiC substrates to prevent gallium from accessing the substrate surface.

In some cases, the heteroepitaxial gallium and nitrogen containing device layers are highly strained. This can be caused either by growth on a heteroepitaxial substrate with a very large difference in lattice constant relative to GaN or, as is the case silicon when the thermal expansion coefficient of the heteroepitaxial substrate is small relative to GaN and related alloys. In this case, while the heteroepitaxial films may be sufficiently lattice matched to the substrate during growth, after growth is complete and the epitaxial wafer is cooled to room temperature, the gallium and nitrogen containing epitaxial films reduce in lattice constant more than the substrate, which places the films under a large tensile stress. Such large tensile stresses can result in film cracking. In an embodiment, a heteroepitaxial film is grown on silicon such that it is under compressive strain during growth. The compressive strain is chosen such that the film is under a small strain or no strain after cooling to room temperature. In an example, a AlGaN nucleation layer is used or a thick AlGaN buffer layer is grown and partially or fully relaxed and overlaid with a GaN layer. Because the relaxed AlGaN layer has a smaller lattice constant than GaN, the GaN film is grown under compression, such that upon cooldown the net tensile strain imposed by the mismatch in coefficient of thermal expansion with the silicon substrate is partially or fully canceled by the compressive strain of the GaN film.

In another embodiment of this invention the LED device wafer does not contain separate n-InGaN buffer layers and InGaN sacrificial layers. Rather the InGaN buffer layer and the sacrificial layer are the same. In this case either the composition of the InGaN buffer is increased such that it absorbs the pump light for PEC etching, or the wavelength of the PEC etch pump light is shortened to a wavelength absorbed by the n-InGaN buffer.

In an embodiment the LED is fabricated with both a p-contact metal and an n-contact metal before transfer. The carrier wafer has two sets of bond pads that correspond to the on-die p-type bond pad and on-die n-type bond pad respectively. To form the on-die n-type bond pad, a via is etched through the p-type and active region layers exposing the n-type layer. In this depiction, the removed sacrificial layer is shown between the mesa layers and the epitaxial substrate. Metal anchors would be used in this embodiment. The heights of the on-carrier bond-pads are chosen to accommodate the difference in height on wafer of the p-type and n-type on-wafer bond pads and accommodate for any plastic deformation of the bond pad. Bonding alignment tolerances using modern flip-chip bonders is on the order of several microns or less, which is adequate for aligning these types of vias in relatively large area LED mesas. Bonding in this way is advantageous because it allows for immediate on-wafer testing of devices after transfer, exposes the entire n-type GaN surface to allow for roughening to enhance light extraction and does not require any opaque metal features on the n-type GaN surface that might block light. The p-type contact would act as a reflector, and as such must be formed from a material with low absorption of the emitted light. The preferred metal is silver, which has the highest reflectivity in the visible range of light wavelengths. Aluminum could be used but would not form a good electrical contact to p-type GaN by itself. Aluminum would need to be combined with a transparent conductive oxide (TCO) such that the TCO formed a transparent contact to the p-type GaN and the aluminum formed the electrical contact to the TCO as well as the reflective surface. A DBR reflector may also be used. The n-type contact metal can be anything that forms a good electrical contact to n-type GaN, such as Al, Ti, Ni, among others. Ideally the contact would be highly reflective. While the active region is absent in the regions occupied by the n-contacts, laterally guided light may interact with the n-contact metal. Reducing the absorption of this light is therefore highly important for achieving high extraction efficiencies.

In another embodiment the LED is fabricated without an n-contact metal before transfer. The carrier wafer has only one set of bond pads per die corresponding to the on-wafer p-side bond pad. The p-type, active region and n-type layers are only exposed at the edges. Metal anchors would be used in this embodiment. The surface of the n-type layer is exposed. In this embodiment, a transparent or semi-transparent n-type contact would be deposited on the n-type surface in order to make electrical contact to the LED while enabling light to escape from the top of the device. Possible contact materials would be semi-transparent annealed Ni/Au and transparent conducting oxides such as ZnO, indium tin oxide (ITO), gallium oxide, GaZnO, InZnO, AlZnO, AlInGaZnO, among others. The n-contacts may also be formed from high aspect ratio metal features that are limited in area but efficiently and uniformly inject electrons into the n-type material such that the active region is uniformly illuminated. Electrical contact is made to the n-contact material using either inter-connect metal lines deposited with lithography or by wire bonding.

The LED structures are prepared with a lithographically defined etch forming mesas on the epitaxial wafer and exposing the sacrificial layers at the mesa sidewalls. P-type contact metals are deposited on top of the mesas and n-type contact metals are deposited in the trenches between mesas. Metal interconnects are deposited, which connect electrically the p-type and n-type contact metals. These interconnects both electrically short the active region pn-junction, thereby inhibiting PEC etching as described above, and function as non-etchable anchors that retain the mesas on the epitaxial wafer after sacrificial layers are fully removed by the selective PEC etch. The metal stack consists of the p-contact metal and bond pad, the metal anchors and the cathode and n-contact metal. The p-contact and bond pad overlay the LED device mesa, which has a square shape. The mesas may be of the typical dimension of 1×1 mm2 found in many state-of-the-art high-power LEDs, while the trenches between wafers may only be 50 microns or less wide. It is clear that, after singulation of the carrier wafer, a single LED will be bonded to a chip at least four times the area of an individual mesa. The trench area between mesas on the epitaxial wafer will be similar to the kerf loss from sawing or dicing the wafer with a laser, therefore there is little improvement in epitaxial material utilization from transferring the die in this way. There are, however, other advantages. For example, the transfer can be carried out in a highly parallel way, with all die on a wafer transferred in a few (e.g. less than 10) bonding operations depending on the relative decrease of die density from substrate to carrier. This is an improvement over the typical pick-an-place method of transferring die to carrier wafers, which is a serial process. This advantage becomes more significant as the die area is reduced. In an example, one may wish to operate an LED at a fixed current density using a fixed device area. In some applications one may wish the surface brightness of the device to be limited, such that it is advantageous to use a plurality of die with a total area equivalent to the target area but with large spacing between die on the submount such that the average surface brightness is reduced. A similar configuration could be advantageous for the elimination of waste heat in heat-sinks. Many small die widely spaced may be cooled more efficiently than a single die operated at the same power due to the finite thermal conductivity of the LED packaging. It is obvious that in a pick-and-place based die transfer model the number of transfer operations required scales with the number die. This invention is therefore advantageous in that the number of transfer operations scales only with the change in die density from substrate to carrier wafer.

FIG. 6A presents a schematic of an example LED epitaxial structure grown on a bulk GaN substrate. Such an approach can be applied to the blue emitting LED, green emitting LED, and even the red emitting LED, or other color emitting LEDs having a wavelength range of from about 375 nm to about 700 nm. In this example, the gallium and nitrogen containing substrate could be n-type or unintentionally doped. Overlying the substrate may be one or more buffer layers that could be formed from GaN, InGaN, AlGaN, or some combination thereof. Overlying the buffer layer may be a sacrificial region which could contain, for example, one or more InGaN layers separated by barrier layers. The sacrificial region and the entire epi structure allows high selectivity removal in a subsequent step, such as removal by selective chemical etching or photoelectrical chemical etching. Overlying the sacrificial region may be n-type or unintentionally doped layers, or a combination, such as n-type GaN, InGaN, or AlGaN layers, which could also include superlattices. Overlying the n-type or UID layers may be a light emission region configured with InGaN light emission layers such as quantum wells. In some embodiments, the light emission region is comprised of one or more quantum wells with a thickness ranging from about 1 nm to about 10 nm or 20 nm, and with a composition tuned for the proper peak wavelength emission such as blue in the 400 mm to 480 nm range, green in the 500 nm to 560 nm range, or red in the 620 nm to 700 nm range. The quantum well layers may be separated by barrier layers that may be comprised or GaN or InGaN with a thickness of about 1 nm to about 20 nm. In some embodiments, quantum dot layers, quantum wire layers, or other quantum structures may be used for light emission. Overlying the light emission region may be a GaN or InGaN layer that could be UID or p-type, or could be a combination thereof. Overlying these layers may be an electron blocking layer comprised of AlGaN or InAlGaN, and overlying the electron blocking layer may be a p-type layer or combination of p-type layers including p-type GaN, InGaN, and/or AlGaN. Overlying the p-type or p-type layers may be a p++ layer configured with high p-type doping for forming a p-type electrical contact. In some embodiments, growth on porous GaN buffer layers or other types of porous layers may be incorporated in the epi structure to improve the light emission properties of the resulting LED structure.

FIG. 6B presents a schematic of an example LED epitaxial structure grown on bulk GaN. Such an approach can be applied to the blue emitting LED, green emitting LED, and even the red emitting LED, or other color emitting LEDs having a wavelength range of from about 375 nm to about 700 nm. The difference of FIG. 6B from the structure according to FIG. 6A is the inclusion of 1 or more additional layers underlying the sacrificial region. In the example shown in FIG. 6B, an InGaN layer is included below the sacrificial region, but this may be other types of layers or combinations of layers such as superlattices. The inclusion of such layers may improve the crystal quality of the epitaxial stack and/or improve the sacrificial region etch characteristics.

FIG. 6C presents a schematic of an example LED epitaxial structure grown on a foreign, non-bulk GaN substrate. Such an approach can be applied to the blue emitting LED, green emitting LED, and even the red emitting LED, or other color emitting LEDs having a wavelength range of from about 375 nm to about 700 nm. In this example, the substrate could be silicon, sapphire, silicon carbide, germanium, templates such as GaN on sapphire or GaN on silicon templates, or other substrates. In this example structure, there may be an optional nucleation layer overlying the foreign substrate. The nucleation layer may be formed from one or more of a GaN, AlGaN, AlN, InGaN, or other material layer. Overlying the optional nucleation layer may be a buffer region comprised of or more layers made from GaN, AlN, InGaN, AlGaN or other materials. The region may contain superlattices with combinations that may be designed to reduce defects and/or improve surface quality resulting from heteroepitaxial growth. Techniques with porous GaN may be employed. Overlying the buffer layer may be an optional layer such as a GaN smoothing layer. Overlying the optional layer over the buffer layer would be a sacrificial region. The sacrificial region may be comprised of one or more InGaN layers separated by barrier layers. The sacrificial region and entire epi structure allows high selectivity removal in a subsequent step, such as removal by selective chemical etching or photoelectrical chemical etching. Overlying the sacrificial region may be n-type or unintentionally doped layers, or a combination, such as n-type GaN, InGaN, or AlGaN layers, which could also include superlattices. Overlying the n-type or UID layers may be the light emission region configured with InGaN light emission layers such as quantum wells. In some embodiments, the light emission region may be comprised of one or more multiple wells with a thickness ranging from about 1 nm to about 10 nm or 20 nm, and with a composition tuned for the proper peak wavelength emission such as blue in the 400 mm to 480 nm range, green in the 500 nm to 560 nm range, or red in the 620 nm to 700 nm range. The quantum well layers may be separated by barrier layers that could be comprised from GaN or InGaN with a thickness of about 1 nm to about 20 nm. In some embodiments, quantum dots layers, quantum wire layers, or other quantum structures may be used for light emission. Overlying the light emission region may be a GaN or InGaN layer that could be UID or p-type, or could be a combination thereof. Overlying these layers may be an electron blocking layer comprised of AlGaN or InAlGaN, and overlying the electron blocking layer may be a p-type layer or combination of p-type layers including p-type GaN, InGaN, and/or AlGaN. Overlying the p-type or combination of p-type layers may be a p++ layer configured with high p-type doping for forming a p-type electrical contact. In some embodiments, growth on porous GaN buffer layers or other types of porous layers may be incorporated in the epi structure to improve the light emission properties of the resulting LED structure.

FIG. 6D presents a schematic of an example red LED epitaxial structure grown on a GaAs substrate. Such an approach can be applied to the red emitting LED having a wavelength range of from about 620 nm to about 700 nm. The gallium and arsenic containing substrate may be n-type, p-type, or unintentionally doped. In this example according to FIG. 6D, overlying the substrate may be one or more buffer layers that may be formed from GaAs, AlInGaP, AlInP, InGaP, GaP, or some combination thereof. Overlying the buffer layer may be an optional n-type layer or combination thereof selected from InGaP and/or AlInGaP layers, or other layers. Overlying the optional n-type layer may be a sacrificial region which may contain one or more layers separated by barrier layers. The sacrificial region and entire epi structure allows high selectivity removal in a subsequent step, such as removal by selective chemical etching or photoelectrical chemical etching. Overlying the sacrificial region may be n-type or unintentionally doped layers, or a combination, such as one or more n-type layers of AlInGaP, AlInP, InGaP, or GaP layers, which could also include superlattices. In one embodiment, GaP layers may be used to form optical windows to enable light extraction through the n-side of the LED structure. Overlying the n-type or UID layers, may be the light emission region configured with light emitting layers such as one-or-more AlInGaP quantum wells and one or more InGaP or AlInGaP quantum barriers. In some embodiments, the light emission region is comprised of one or more quantum wells with a thickness ranging from about 1 nm to about 10 nm or 20 nm, and with a composition tuned for the proper peak wavelength emission such red in the 620 nm to 700 nm range. In some embodiments, quantum dots layers, quantum wire layers, or other quantum structures may be used for light emission. Overlying the light emission region may be a combination of one or more p-type or UID layers of AlInGaP, AlInP, InGaP, or GaP that could be UID or p-type, or could be a combination thereof. Overlying the p-type or UID layers may be an optional region which may be comprised of p-type GaP, which may form a an optical window region to enable light extraction. Overlying the p-type layer may be a p++ layer configured with high p-type doping such as p++ GaAs, GaP, InGaP, or AlInGaP for forming a p-type electrical contact. In some embodiments, growth on porous buffer layers or other types of porous layers may be incorporated in the epi structure to improve the light emission properties of the resulting LED structure.

FIG. 6E presents a schematic of an example red LED epitaxial structure grown on a foreign, non-GaAs substrate. Such an approach may be applied to the red emitting LED having a wavelength range from about 620 nm to about 700 nm. In this example, the substrate could be silicon, sapphire, silicon carbide, germanium, templates such as GaAs on sapphire or GaAs on silicon templates, or other substrates. In this example structure, there may be an optional nucleation layer overlying the foreign substrate. The nucleation layer may be formed from one or more of AlInGaP, AlInP, InGaP, GaP, AlP, or other materials. Overlying the optional nucleation layer may be a buffer region comprised of AlInGaP, AlInP, InGaP, GaP, AlP, or other materials and superlattices with combinations that reduce defects and/or improve surface quality resulting from heteroepitaxial growth. Overlying the buffer layer may be an optional UID layer or n-type layer or combination thereof selected from InGaP and/or AlInGaP layers, or other layers. Overlying the optional n-type layer may be a sacrificial region that may contain one or more layers separated by barrier layers. The sacrificial region and entire epi structure allows high selectivity removal in a subsequent step, such as removal by selective chemical etching or photoelectrical chemical etching. Overlying the sacrificial region may be n-type or unintentionally doped layers, or a combination, such as one or more n-type layers of AlInGaP, AlInP, InGaP, GaP layers, which may also include superlattices. In one embodiment, GaP layers may be used to form optical windows to enable light extraction through the n-side of the LED structure. Overlying the n-type or UID layers may be the light emission region configured with light emitting layers such as one-or-more AlInGaP quantum wells and one or more InGaP or AlInGaP quantum barriers. In some preferred embodiments, the light emission region may be comprised of one or more quantum wells with a thickness ranging from about 1 nm to about 10 nm or 20 nm and with a composition tuned for the proper peak wavelength emission such red in the 620 nm to 700 nm range. In some embodiments according to the present invention, quantum dots layers, quantum wire layers, or other quantum structures are used for light emission. Overlying the light emission region may be a combination of one or more p-type or UID layers of AlInGaP, AlInP, InGaP, or GaP that could be UID or p-type, or could be a combination thereof. Overlying the p-type or UID layers may be an optional region that may be comprised of p-type GaP, which may form an optical window region to enable light extraction. Overlying the p-type layer may be a p++ layer configured with high p-type doping such as p++ GaAs, GaP, InGaP, AlInGaP for forming a p-type electrical contact. In some embodiments, growth on porous buffer layers or other types of porous layers may be incorporated in the epi structure to improve the light emission properties of the resulting LED structure.

In another embodiment, the transferred dice have non-rectangular or non-square shapes. FIG. 6F shows an example with hexagonal die. On the left of FIG. 6F is a schematic representation of an array of closely packed hexagonal LED die that are coded to show how all the die may be transferred to carrier wafers in four bonding operations. On the right of FIG. 6F is a schematic representation of a subset of the die transferred to a carrier wafer after a bonding operation. The dotted line 501 indicates the area occupied by a single hexagonal die. In this case the present invention is advantageous in that the die shapes are defined by a lithographic process rather than by a physical sawing or scribing of the epitaxial substrate wafer. Dicing saws blades are relatively large compared to die, such that it would be impossible to singulate a wafer into die of shapes with edges that do not form continuous parallel lines. A laser scribing process may be able to draw guide scribes on the epitaxial substrate, however it is unlikely that the subsequent cleaving process would follow the guide scribes accurately and yield loss would be very high.

Once the carrier wafer is populated with die, wafer level processing can be used to fabricate the die into LED devices. For example, in many embodiments the bonding media and die will have a total thickness of less than about 5 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools. In an example wherein the mesa dice are expanded onto a carrier and then fabricated into an array of individual LEDs spaced out on a carrier wafer for enhanced thermal or light extraction performance the packaging would be inherent to the process. Here, then, you would have a truly wafer-scale LED package, fabricated on a wafer level using standard semiconductor manufacturing techniques and equipment, which, once singulated from the carrier wafer, would be ready for encapsulation and combination with phosphor materials.

A powerful and important enabling element of this invention is the ability to perform integration of different color emitting epi layers and resulting device structures from various substrate members onto a common carrier wafer. In one such example of integration a blue LED based on gallium and nitrogen containing epitaxial materials is integrated onto a common carrier with a green LED based on gallium and nitrogen containing epitaxial materials. In this embodiment one could form a system with comprising of a network of blue and green LED functions. In an alternative example, red, green, and blue LEDs are combined on the common carrier. In yet, an additional example red, green, yellow, and blue LEDs are combined on the common carrier. The LEDs could be electrically addressed in several configurations including series connections, parallel connections, and fully separate addressability of the blue and green diodes.

In one embodiment, the present invention is applied to the manufacturing of a display device. Specifically, the technology is used to make a highly efficient, cost effective, and high performance display based on micro-LEDs by transferring multiple color small LEDs to a common carrier such that the multiple color LEDs form individual pixels, which can be individually addressed to adjust the color and brightness of the pixel. Existing display devices based on liquid crystal technology are highly inefficient due to the use of multiple polarizers, color filters, light guides, and the need to electrically drive both the liquid crystal element and the backlighting element such as LEDs. Such displays typically result in single digit electrical to optical energy efficiency values and require complicated fabrication technologies with many elements leading to high cost. Advances have been made in organic LED [OLED] display technology over the past several years. However, OLED displays suffer from poor OLED efficiency, lower brightness, manufacturing challenges, and reliability barriers.

The present invention breaks the barriers associated with currently available display technology. Specifically, by patterning arrays of micro-LEDs into multiple donor wafers with different emission colors and then selectively transferring these LEDs onto a carrier or host wafer a 2-dimensional matrix of individual pixels comprising multiple color LEDs, such as red, green, and blue LEDs, can be configured. For example, a first donor wafer comprised of a gallium and arsenic substrate can be fabricated to form an array of red emitting LED structures, a second donor wafer comprised of a gallium and nitrogen substrate can be fabricated to form an array of green emitting LED structures, and a third donor wafer comprised of a gallium and nitrogen substrate can be fabricated to form an array of blue emitting LED structures can be formed. Subsequently, the donor wafers can then be subjected to the transfer process described in this invention wherein only a fraction of the LED structures are transferred to a carrier wafer. In some embodiments the carrier wafer is comprised of a gallium and nitrogen containing substrate or a gallium and arsenic containing substrate, or an alternative substrate and comprises micro LEDs with one of the emission colors formed directly on the carrier wafer.

The carrier wafer is designed to receive the different color LEDs into pixel domains. The micro LEDs can be formed in various shapes such as circles, squares, rectangles, triangles, pentagons, hexagons, octagons, or any geometrical shape possible. The largest dimension of the LED emission areas could be smaller than 1 mm, smaller than 200 um, smaller than 100 um, smaller than 50 um, smaller than 20 um, smaller than 10 um, or smaller than 5 um. The carrier wafer is comprised with an interconnect network configured to enable addressability of the micro LEDs in the pixels to generate high resolution display images. Any relevant interconnect schemes, configurations, processes could be taken from existing display technologies such as LCD or OLED, or even from other technologies such as imaging technologies like focal plane arrays (FPA) and applied to the present invention.

The present invention enables a highly manufacturable and cost efficient process for producing micro LED based displays not readily possible with prior art. Specifically, the current invention allows for a wafer level transfer process from a donor LED wafer to a common carrier wafer forming the display panel. Since it is a wafer level process, thousands, tens of thousands, or hundreds of thousands of LEDs can be transferred in one process step [depending on wafer size and pixel pitch] and hence avoiding any one-by-one pick and place techniques or mechanical transfer head techniques. This advantage can enable high throughput for low cost and high alignment tolerances for tight packing of the LEDs. Moreover, since it is a selective transfer process from the donor to the carrier and the pitch of the LEDs from the donor wafer to the carrier wafer can be expanded using the anchor technology, a much higher density of LEDs can be formed on the single color donor wafers than the final density of that single color as expanded on the carrier wafer to form the display panel. For example, a red donor wafer, green donor wafer, and blue donor wafer may be prepared with an LED pitch of X. At the transfer step to the first carrier wafer only ⅓ of the LEDs are transferred to the carrier wafer at a pitch of X/3 such that the resulting donor wafer has a repeating array of red, green, and blue LEDs that spaced from each other by X, but spaced from their next nearest neighbor with the same color by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In one embodiment, the blue and green LEDs based on gallium and nitrogen containing epitaxial materials could be integrated with LEDs based on other material systems such as GaAs-based LEDs. In one example, the AlInGaAsP or GaAs-based LED is a red emitting LED resulting in system comprised of a network of red-green-blue LEDs to form an RGB emitter LED device such as a micro-LED display device wherein a two dimensional array of red, green, and blue LEDs are configured to create a two dimensional array or pixels, wherein each pixel comprises at least one red, one green, and one blue LED. Again, the red, green, and blue LEDs can be electrically connected and driven in many types of configurations. In preferred embodiments the red, green, and blue LEDs are individually addressable or addressable in a fashion that enables independent color control of each pixel in the micro-LED display. In fact, groups of red-green-blue LEDs can be used to comprise pixels to form an RGB based LED display. In alternative embodiments, different color or additional color LEDs are added to the pixels in the micro LED display. For example, a yellow emitting LED can be added to the pixels to achieve an enhanced display color quality.

With respect to LED devices based on GaAs and/or AlInGaAsP such as red LED devices, these devices include a substrate made of GaAs or Ge, but can be others. As used herein, the term "substrate" can mean the bulk substrate or can include overlying growth structures such as arsenic or phosphorus containing epitaxial region, or functional regions such as n-type GaAs, combinations, and the like. The devices have material overlying the substrate composed of GaAs, AlAs, AlGaAS, InGaAS, InGaP, AlInGaP, AlInGaAs or AlInGaAsP. Typically, each of these regions is formed using at least an epitaxial deposition technique of metal organic chemical vapor deposition (MOCVD), molecular beam epitaxy (MBE), or other epitaxial growth techniques suitable for AlInGaAsP growth. In general, these devices have an n-type and p-type conducting layer which may form part of a n-type cladding layer or p-type cladding layer, respectively, with lower refractive index than the light emitting active region. The n-cladding layers can be composed of an alloy of AlInGaAsP containing aluminum. The devices contain an active region which emits light during operation of the device. The active region may have one or more quantum wells of lower bandgap than surrounding quantum barriers.

Undercut AlInGaAsP based LEDs can be produced in a manner similar to GaN based LEDs described in this invention. There are a number of wet etches that etch some AlInGaAsP alloys selectively. In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>1E6 times that of GaAs) when etched with HF. InGaP and AlInP with high InP and AlP compositions can be etched with HCl selectively relative to GaAs. GaAs can be etched selectively relative to AlGaAs using $C_6H_8O_7:H_2O_2:H_2O$. There are a number of other combinations of sacrificial layer, etch-stop layer and etch chemistry which are widely known to those knowledgeable in the art of micromachining AlInGaAsP alloys. For example, phosphoric based etches, hydrogen peroxide based etches, hydrochloric acid based etches, and other etches can be employed, In one embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall. This step is followed by the deposition of a protective insulating layer on the mesa sidewalls, which serves to block etching of the active region during the later sacrificial region undercut etching step. A second top down etch is then performed to expose the sacrificial layers and bonding metal is deposited. With the sacrificial region exposed a compositionally selective etch is used to undercut the mesas. At this point, the selective area bonding process is used to continue fabricating devices. The device layers should be separated from the sacrificial layers by a layer of material that is resistant to etching. This is to prevent etching into the device layers after partially removing the sacrificial layers.

In one embodiment the LED RGB display is formed by transferring each of the red, green, and blue epitaxial structures to a common carrier using the undercut etching and selective bonding technique as described for gallium and nitrogen based devices. In this first RGB LED embodiment the carrier wafer could be comprised of Si, sapphire, SiC, GaAs, InP, AlN, polycrystalline AlN, polycrystalline SiC, metal-core printed circuit board (MCPCB), ceramic printed circuit board or other, and could include functionality such as photodetectors for monitoring individual LED output, and drive circuitry for the micro LEDs such as thin film transistors or other types of transistors. Transparent p-contacts and substrates (carrier wafers or display panels) may be used for backside emissions. The LEDs would be configured with an interconnection system for electrical addressability to enable creation of high resolution images based on signals transmitted from a signal processing unit.

FIG. 6G shows a simplified schematic view of a two dimensional LED matrix comprising red, green, and blue LEDs to compromise an RGB display panel based on one embodiment. As shown in FIG. 6G, a first donor wafer with a first epitaxial material 401 is processed to form a first array of LED dice 402, a second donor wafer with a second epitaxial material 403 is processed to form a second array of LED dice 404, and a third donor with a third epitaxial material 405 is processed to form a third array of LED dice 406. In one example, the first epitaxial material is formed of gallium and nitrogen containing material and comprises a light emitting region configured to emit a blue wavelength, the second epitaxial material is formed of gallium and nitrogen containing material and comprises a light emitting region configured to emit a green wavelength, and the third epitaxial material is formed of gallium and arsenic containing material and comprises a light emitting region configured to emit a red wavelength. After subjecting the donor wafers to the process according to this invention wherein a release layer is removed underneath the LED epitaxial material, at least a fraction of the first array of LED dice 402, a fraction of the second array of LED dice 404, and a fraction of the third array of LED dice 406 are subsequently selectively transferred to the carrier wafer 407 in a predetermined pattern. The pattern shown in FIG. 6G is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels.

In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [e.g. ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In some embodiments, processes or designs are used to increase the light extraction from the LED. For example, wet or dry etching techniques can be used to roughen one or more surfaces from the LED and increase light extraction. In another example, shaping of the LED through etching, sawing, cutting, or other process is used to increase the light extraction. In an example, the p-contact layer of the LED dice is patterned prior to forming the p-contact and etched to produce features such as trenches or pits in the p-contact surface. These pits can be isolated electrically by application of a passivating dielectric prior to deposition of the reflective p-contact material. The features will scatter light incident on the p-contact at shallow angles that would normally not be reflected out of the LED die. In another example, after transfer of the LED dice the n-type conducting layer is patterned and etched to produce features such as trenches or pits. The features in the surface of the n-type conducting layer scatter light rays that would normally by totally internally reflected by the GaN to air interface. In an embodiment, features internal to the LED dice such as gratings or photonic crystals are used to promote scattering of light to enhance extraction. As an example, an LED device epitaxial wafer is grown up to the n-cladding layer. The growth is then interrupted and the wafer removed from the growth system. The wafer is patterned and etched to form features such as pits or trenches which may be of arbitrary configuration or be configured to produce a photonic crystal. The wafer is then reintroduced to the growth system and the remainder of the n-cladding is overlaid on the features such that they are either left as air-gaps or are filled in with a material of differing optical index so as to form a region of patterned index contrast. In the case of arbitrarily configured features, the features may act as random scattering centers that scatter light propagating laterally through the LED die such that more light is direct out through the upper surface of the die. In the case of a photonic crystal, the features are configured to promote scattering of light into specific modes defined by constructive interference which are more easily extracted from the LED die than the unscattered light. In an example, the LED dice are etched on the donor wafer such that the sidewalls of the die are inclined at some angle relative to the plane of the wafer. In the preferred embodiment the sidewalls are angled at 45 degrees with the base of the LED die being larger than the top. After selective etching and transfer, the top of the LED die now becomes the bottom, bonded surface and the die. Light propagating through the LED die in lateral guided modes can be reflected off of the inclined sidewall and directed upward through the n-type surface of the device. In an additional example alternative materials are used to encapsulate or coat one or more surfaces of the LEDs to enhance the light extraction. Specifically, high index materials may be used to reduce the index contrast between the LED chip and the outside world.

Reliability and conservation of the image quality are key considerations for a display system such as the micro LED display system according to this invention. In some embodiments of the present invention each pixel in the display comprises two or more of each color LED such as comprising two, three, or four of each of the red, green, and blue LEDs to provide a redundancy. This redundancy would help overall reliability of the display system since if one of the LEDs were to fail, the pixel would still be operable and the user or viewer would not recognize or comprehend the failed LED chip in the display.

In some embodiments of the present invention, each pixel in the display comprises more than three colors. For example, a single pixel may comprise a red, green and blue device emitting at center wavelengths of 630, 530 and 450 nm as well as a device emitting at a center wavelength of 480 nm. This has the advantage of allowing the display to render a wider color gamut than is achievable with only three colors. In a preferred embodiment, each pixel will comprise at least one red LED device with center wavelength between 600 and 650 nm, at least one blue LED device with center wavelength between 420 and 470 nm, at least one cyan LED device with center wavelength between 490 and 505 nm, at least one green LED device with center wavelength between 505 and 525 nm and at least one green LED device with center wavelength between 525 and 540 nm.

As described previously, a key benefit provided by this invention to the formation of a micro LED display panel is the ability to perform multiple transfer steps from the donor wafers to one or more carrier wafers. This is enabled by the selective nature of the transfer process according to this invention. This key feature allows for the LED dice to be placed on the carrier wafer at positional pitches greater than the pitch on the donor wafer and in various patterns, which is important for creating pixels. FIG. 6H illustrate this multiple-transfer process. FIG. 6H shows the first donor wafer 401 with the remaining epitaxial dice 402, the second donor wafer 403 with the remaining epitaxial dice 404, the third donor wafer 405 with the remaining epitaxial dice 406 after the first transfer process had been performed according to FIG. 6G. As can be seen in the figure some of the dice are depleted from each of the donor wafers due to the preceding transfer. A subsequent second transfer step to a separate carrier wafer or to a different region on the first carrier wafer is performed and results in the RGB LED matrix 407 comprised of repeating pixel elements 408. Subsequently, FIG. 6I illustrates first donor wafer 401 with the remaining epitaxial dice 402, the second donor wafer 403 with the remaining epitaxial dice 404, the third donor wafer 405 with the remaining epitaxial dice 406 after the second transfer process had been performed according to FIG. 6H. A subsequent third transfer step to a separate carrier wafer or to a different region on the first carrier wafer is performed and results in the RGB LED matrix 407 comprised of repeating pixel elements 408. According to this example, after the third transfer process all of the LED dice will be depleted from the donor wafers. At that point the donor wafers can be prepared for a re-use of the bulk gallium and nitrogen containing and bulk gallium and arsenic containing substrates. Of course this is just one example of the multiple transfer process using the selective transfer technique according to this invention and there could be many others.

In yet another embodiment of an RGB micro LED display panel based on this invention, the red, green, or blue LED is fabricated from epitaxial materials grown directly on the carrier substrate and the other color LEDs are fabricated from epitaxial material that is transferred from the bulk substrates they are epitaxially grown on to the carrier wafer. As an example, the carrier wafer could be comprised from the same GaAs substrate that the red LED epitaxial material is grown on and the red LEDs are fabricated in. In this embodiment the green and blue LEDs could be fabricated from gallium and nitrogen containing epitaxial materials grown on a GaN substrate that are transferred to the GaAs carrier substrate. This configuration may be desirable over using the GaN substrate from the green or blue epitaxial material because it allows for reuse of the GaN substrates, which are substantially higher cost than GaAs substrates. Moreover, GaAs substrates are available in larger diameters. FIG. 6H shows a schematic diagram of this configuration.

In one embodiment of this configuration presented in FIG. 6J, a first substrate with a first epitaxial material 401 is processed to form a first array of dice 402 and a second substrate with a second epitaxial material 403 is processed to form a second array of dice 404. However, in this embodiment the carrier wafer is a third substrate 405 with a third epitaxial material processed to form a third array of dice 406. In this example, the first epitaxial material comprises a light emitting region configured to emit a blue wavelength, the second epitaxial material comprises a light emitting region configured to emit a green wavelength, and the third epitaxial material formed on the carrier wafer comprises a light emitting region configured to emit a red wavelength. The first array of dice 402 and second array of dice 404 are transferred to the carrier wafer 405 to form a predetermined pattern array of RGB LEDs 407. FIG. 6J is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels. This is one such example pattern that could be used for an RGB display system.

After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others. In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [e.g., ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In alternative embodiments, the third substrate configured as the carrier wafer with the epitaxial material comprising the third array of dice could be a GaN substrate with epitaxial material configured to emit blue light, or alternatively the third substrate configured as the carrier wafer with the epitaxial material comprising the third array of dice could be a GaN substrate with epitaxial material configured to emit green light.

Further details of manufacturing, processing, and designing multiple color technologies such as RGB integration technologies according to this invention can be found in U.S. Pat. No. 9,379,525, and U.S. patent application Ser. No. 15/180,737, which are commonly owned, and hereby incorporated by reference herein. To create a high resolution display such as a 1080P display a dense two-dimensional array of LEDs is required. For example, wearable devices or handheld devices such as an Apple iWatch with a 312×390 resolution in a 1.5" diagonal screen requires a total pixel size of about 76 um with a pixel density of about 333 ppi, an Apple iPhone 6 with a 375×667 resolution in a 4.7" diagonal screen requires a pixel size of about 156 um with a pixel density of about 163 ppi, or an Apple iPad Pro with a resolution of 1024×1366 in a 12.9" diagonal screen requires a pixel size of about 191 um with a pixel density of about 132 ppi. Larger displays such as high definition television may have increased pixel size. For example a 1080P display with a 1920×1080 resolution on a 32" diagonal screen requires a pixel size of about 368 um with a density of about 69 ppi, on a 46" diagonal screen requires a pixel size of about 530 um with a density of about 38 ppi, or on a 80" diagonal screen requires a pixel size of about 922 um with a density of about 28 ppi. A 4K ultra high definition display with a 3840×2160 resolution on a 32" diagonal screen requires a pixel size of about 184 um with a density of about 138 ppi, on a 46" diagonal screen requires a pixel size of about 265 um with a density of about 96 ppi, or on a 80" diagonal screen requires a pixel size of about 461 um with a density of about 55 ppi. As can be understood from these examples and extending to more extreme cases such as smaller or larger displays, pixel sizes can range anywhere from less than 50 um to well greater than 1,000 um. To accommodate these pixel sizes wherein at least three LEDs (such as red, green, and blue LEDs) must be configured along with other required components such as internconnects, isolating elements, and free space, etc. the LED die size must be substantially smaller than the pixel size. For example, the individual LED die size must be smaller than 1,000 um, smaller than 500 um, less than 250 um, less than 100 um, less than 50 um, less than 25 um, less than 10 um, or even less than 5 um to accommodate pixel pitches of less than 3,000 um, less than 1000 um, less than 500 um, less than 250 um, less than 100 um, less than 50 um, less than 20 um, or even less than 10 um. In fact, in many preferred embodiments according to the present invention, more than three LEDs will be required in each pixel. In some examples of these preferred embodiments additional LEDs are included to enhance the color quality such as adding a yellow LED. In some examples of these preferred embodiments additional LEDs are included to for color redundancy to meet the strict reliability requirements of displays. In some examples, 2, 3, or even 4 of each color LED are included in each pixel. The inclusion of these additional LEDs within the pixel area further forces the area of the LED die to smaller dimensions.

Electrically addressing these pixels within such high pixel density displays in a suitable fashion is a key consideration within a LED display apparatus according to this invention. In one example an interconnect network is created with metal traces on the top surface of the carrier wafer such that the interconnects run between the LED die. Although this example may be the easiest from a process standpoint having the interconnects on the same plane as the LED consumes valuable display real estate area. In a preferred configuration, vertical interconnects are included wherein the interconnect network is formed above or below the plane that the LEDs are attached to and are configured to make a vertical electrical connection from the interconnect network to the micro LEDs. For example, an interconnection network would be formed on the carrier wafer itself, which is then buried in a dielectric layer such as silicon dioxide or silicon nitride, but could be other non-conductive layer such as benzocyclobutene (BCB), acrylic, photoresist, silicon oxide, poly(methyl methacrylate) (PMMA), polyimide, acrylate, or epoxy to planarize the surface. The micro LEDs are attached to a surface overlying the planarization layer such that the planarization layer electrically isolates the interconnects from the micro LEDs. Vias would be formed in the planarization layer to form electrical connections from the interconnect network to the individual LEDs to provide the electrical drive signal to form the display.

It is to be understood that the above descriptions are merely examples. There is a wide range of existing technology currently used for the fabrication of LCD displays, OLED displays, or other panel displays that can be easily applied to the present invention. Additionally, alternative interconnect technology like focal plane array interconnect technology, such as that found at www.raytheon.com/news/technology_today/2015_i1/wafer.html or in Quiping et al, Journal of Semiconductors Vol. 31, No. 11 Nov. 2010, can be applied to the present invention. The interconnection network routes electrical power from a power source to the LEDs within the display panel. Specifically, current must be supplied to the p-side [anode] of the LEDs. In a preferred embodiment of the present invention the p-side will be down on the carrier or back plane such that the LEDs are flip-chip bonded. Common circuitry can include switching transistors, driving transistors, and storage capacitors. These elements can be configured in an architecture to supply current to the anode or pull current from the cathode through various arrangements. There are many suitable drive architectures in the prior art that can be applied to the micro LED display according to the present invention.

The carrier wafer is selected from any suitable material and preferably is configured with interconnection scheme to provide current to the micro LEDs in the display panel and can be configured with electronics to form drive circuitry including resistors, capacitors, and transistor such as a thin film transistor (TFT) network. For example, the primary carrier wafer could be selected from a silicon wafer, a sapphire wafer, an aluminum nitride wafer, a silicon nitride wafer, a silicon carbide wafer, a glass wafer, a group V semiconductor, a III-V semiconductor, or a II-VI semiconductor, or others. In a preferred embodiment the carrier wafer is selected from a silicon wafer. In one example the silicon wafer has interconnects or integrated circuit functionality defined within the wafer such as TFT technology. Such circuits or features defined in the silicon wafer can be formed using Complementary metal-oxide-semiconductor (CMOS) processing. By using such CMOS technology electronic devices such as metal-oxide-semiconductor field-effect transistor (MOSFETs) including nMOSFETs and pMOSFETS and others can be defined directly in the carrier wafer. CMOS processing is ideal for high volume, high circuit density, low cost manufacturing of the logic gates and multiplexing drive circuitry required in the LED based display device. In an alternative embodiment including TFTs, the TFT substrate can be configured on a primary carrier wafer. In alternative embodiments, the carrier wafer material may be flexible or curved to create a flexible or curved display. Some examples of flexible materials would be polymers, other organic based materials, and thin metallic.

The bonding of the micro-LEDs to the carrier wafer is preferably comprised of conductive interfaces such as metallic interfaces like Au—Au bonds to provide an electrical pathway from the interconnection network formed on the carrier wafer to the anode or cathode of the micro LEDs. In some examples of metallic interfaces such as a Au—Au interface the bonding can be performed using a thermo-compressive process such as using a wafer bonding tool. In alternative embodiments, the micro-LEDs are bonded using a reflow process such as using an indium reflow or a AuSn reflow. Using an indium reflow process may be advantageous to limit the temperature exposure of the LED devices.

A display panel and a method of forming a display panel are described. In an embodiment a display panel electronic drive circuitry such as a TFT substrate including regions defining the RGB pixels and regions separating the RGB pixels. The pixel regions could include an array of bank openings and an array of bottom electrodes within the array of bank openings. A ground line would be formed to provide a grounding for the LED banks. In some embodiments the micro LED devices may be vertical micro LED devices such that they conduct the electrical current parallel to the epitaxial growth direction. A combination of transparent and reflective contact layers and passivation layers are configured to maximize the light escape from the top and/or the sides of the LED chips at their respective emission wavelengths. In one example, an array of top electrode layers are configured over the array of micro LED devices to form an electrical connection of the array of micro LED devices to the ground line or other lines.

In other embodiments the LEDs may be formed for a lateral current conduction such that the current path is characterized by at least one flow of current that is perpendicular to the epitaxial growth direction. In this example, an array of separate top electrode layers are formed over the array micro LED devices electrically connecting the array of micro LED devices to the ground line.

In an example embodiment, an array of micro LED devices are on the array of bottom electrodes within the corresponding array of bank openings. The micro LED devices are flip-chip micro LED devices, and may have a maximum width of 1 μm-100 μm. By "flip chip" it is meant that the micro LEDs are configured as shown in FIG. 6C with a p-type contact region 205 as well as an n-type contact region 207 on the bonded side of the transferred epi layers. The carrier wafer 209 has two sets of bond pads 206 and 208 that correspond to the on-die p-type bond pad 205 and on-die n-type bond pad 207 respectively. To form the on-die n-type bond pad A via is etched through the p-type 204 and active region 203 layers exposing the n-type layer 202. In this depiction, the removed sacrificial layer is shown between the mesa layers and the epitaxial substrate 201. Metal anchors would be used in this embodiment but are not shown in this depiction. The right-hand side of FIG. 6C shows the die on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. The non-bonded side of the transferred epi layers 210 does not have an electrical contact but may be patterned or coated as previously described to enhance light extraction. In this embodiment, the backplane comprises an array of a TFT substrate including a pixel area and a non-pixel area, where the pixel area includes an array of bank openings and an array of bottom electrodes within the array of bank openings. The TFT substrate also includes an array of cathode lines and an array of anode lines, with one cathode line corresponding to each row of the micro LEDS and one anode line corresponding to each column of the micro LEDs. The cathode and anode lines are comprised of metal or other conductors and are isolated from one another with a dielectric such as silicon dioxide, silicon nitride, BCB, hardened photoresist, epoxy, or a ceramic such as AlN, aluminum oxy-nitride or the like. The LEDs are configured such that the p-contact of the micro LED is bonded to an anode line and the n-contact is bonded to a cathode line such that each micro LED is individually addressable.

In an embodiment, the micro-LED devices are individually addressable via multiplexing. In an example, FIG. 6K shows a circuit diagram for a multiplexing scheme where positive voltage supply lines or anode lines run from a voltage source 1401. Each anode line is provided with a control transistor 1403 which converts a voltage supplied by control circuitry into a current. The cathode of each micro-LED is connected to a cathode or ground line. Each ground line is provided with a control transistor 1404. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates of the anode and ground line control transistors. In an example, if a sufficiently high voltage is provided to the control transistor 1403 of the first anode line the control transistor will allow current to pass. If sufficiently high voltage is provided to the control transistor 1404 of the first ground line then the transistor will conduct and short the ground line to ground. The micro-LED 1402 connecting the on-state anode control transistor to the ground line corresponding to the on-state ground-line control transistor 1404 will then be provided with current and emit light. All other micro-LED devices will not emit light because either their anode line is open and not conducting or their ground line is open and not conducting. Because the anode and ground lines are individually addressable via their control transistors, it is possible to run all micro-LEDs in each row simultaneously while keeping them individually addressable. An image can be formed by cycling through rows of micro-LEDs at rates too high for humans to perceive, for example cycling through all rows in less than one twentieth of a second or faster would be sufficient. It should be understood that larger, multiplexed micro-LED arrays are possible.

In another example, FIG. 6L shows a circuit diagram for a multiplexing scheme where positive voltage supply lines or anode lines run from a voltage source 1405. The anode of each micro-LED 1408 is tied to an anode line via a control transistor 1407. The gate of each anode line control transistor is tied to a control line 1409. The cathode of each micro-LED is connected to a cathode or ground line. Each ground line is provided with a control transistor 1406. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates ground line control transistor and to the control lines. In an example, if a sufficiently high voltage is provided to the control transistor 1407 of the first micro-LED by applying a voltage to the first control line 1409 the control transistor will enter an on-state and will conduct electricity. If sufficiently high voltage is provided to the control transistor 1406 of the first ground line then the transistor will conduct and short the ground line to ground. The micro-LED 1408 connecting the on-state anode control transistor to the ground line corresponding to the on-state ground-line control transistor 1406 will then be provided with current and emit light. All other micro-LED devices will not emit light because either their control transistor is in the off state and not conducting or their ground line is open and not conducting. Because the anode control lines and ground lines are individually addressable, it is possible to run all micro-LEDs in each column simultaneously while keeping them individually addressable. An image can be formed by cycling through columns of micro-LEDs at rates too high for humans to perceive, for example cycling through all columns in less than one twentieth of a second or faster would be sufficient. It should be understood that larger, multiplexed micro-LED arrays are possible.

The multiplexing configuration found in FIG. 6K is advantageous over that in FIG. 6L because significantly fewer transistors need to be fabricated on the backplane. In certain embodiments, the control transistors are provided by a separate control circuit that is not fabricated on the backplane. This embodiment greatly reduces the complexity of the backplane as it becomes only a grid of electrically isolated conductor lines and bond pads. The configuration in FIG. 6L is also limited to transistors that can be fabricated on the backplane. For example, if the backplane is glass or other insulating material, the transistors would be limited to those that can be fabricated on such substrates such as thin-film transistors (TFTs), organic or polymer semiconductor transistors and the like. In another example, if the backplane is a silicon wafer, then the transistors could be TFTs, bipolar junction-transistors (BJTs), metal-oxide-semiconductor field effect transistors (MOSFETs) or the like and could be fabricated either with deposition of semiconducting layers such as with TFTs or fabricated in the backplane wafer using diffusion processes as in BJTs or MOSFETs.

The multiplexing configuration found in FIG. 6L is advantageous over that in FIG. 6K in that control transistors in the FIG. 6K configuration would need to be able to source current for all micro-LED devices in a column. Design limitations of the transistor may therefore limit how big a micro-LED matrix is practical. By employing the FIG. 6L design, where each micro-LED is driven by a separate transistor, each transistor can be designed to source a relatively small current. It should be understood that other multiplexing configurations in accordance with an embodiment of this invention are possible. For example, a larger array of micro-LEDs could be segmented into individually addressable sub-arrays driven by one or more control circuits. Micro-LED apparent brightness can be controlled in several ways. In an example, the voltage on the control transistors is variable such that the current passed to the micro-LEDs is dynamically controllable. In another example, the voltage supplied to the control transistors is pulse-width-modulated with varying duty cycle such that the time average current passed to the micro-LED is dynamically controllable. In another example, the voltage supplied to the control transistors is applied for various amounts of time. For example, each row of micro-LEDs may be addressed for one millisecond. If one of the micro-LEDs in that row is held in the on-state for 0.1 millisecond every time the row is addressed, then on average it will appear to be 10% of the brightness of micro-LEDs held in the on-state for the entire millisecond every time the row is addressed.

Moreover, techniques used in other methods of forming micro LED displays can be applied such as that found in US 2014/0159067 A1 or US 2016/0013170 A1.

Of course, to form a full display apparatus from the micro LED display panel, the display apparatus must include additional elements such as input interfaces for electrical power and image and sound data, video processing and other imaging conditioning functions, and optionally memory storage. The display can include an input interface receives one or more frames of images to form a video. The input interface can include any conventional connection including hard wire connections such as USB, serial port, video, HDMI, etc., can include wireless interfaces such as WiFi or Bluetooth, and include interfaces to data storage devices such as compact discs, USB drives or thumb drives, hard drives, etc., and additionally the display apparatus may include an internal memory module to store video and sound content. The apparatus could include a video processing module to properly condition the image signal before routing it through the interconnects to the LEDs on the display panel. Moreover, the display device would include a power input interface to receive electrical power and could include batteries to form a portable display device. The display apparatus would be configured with a screen such as a glass screen or a plastic screen, wherein the screen could be configured to be sensitive to touching for data input and user functionality. An example display apparatus according to this invention is provided in FIG. 6M. The micro LED display apparatus according to the present invention could find use in a wide range of applications including mobile devices such as iPhones or Droid phones, tablet devices, televisions, laptop computers and computer monitors, digital camera, electronic book devices, gaming devices, or large lumen display like theatre and signage.

Of course, the LED based micro-display panel device according to this invention could be integrated with the other semiconductor device technologies according to this invention such as transistors, diodes, and laser diodes.

In an embodiment of this invention, the gallium and nitrogen containing epitaxial device layers comprise an AlInGaN laser diode (LD) device stack. Such GaN-based LDs contain n-type and p-type cladding layers surrounding light emitting layers to provide optical confinement in the transverse direction. The cladding layers are typically comprised of AlGaN but can be comprised of GaN or AlInGaN. The layers must be low enough index and thick enough to provide sufficient modal overall lap within the active region while preventing overlap with the lossy metal contact regions. P-type and n-type contacts are made to inject current into the active region for radiative recombination.

In a specific embodiment, the gallium and nitrogen containing substrate member is a bulk GaN substrate characterized by having a polar, nonpolar, or semipolar crystalline surface region, but can be others. In a specific embodiment, the bulk nitride GaN substrate comprises nitrogen and has a surface dislocation density between about $10E5$ cm$^{-2}$ and about $10E7$ cm$^{-2}$ or below $10E5$ cm$^{-2}$. The nitride crystal or wafer may comprise $Al_xIn_yGa_{1-x-y}N$, where $0\leq x, y, x+y\leq 1$. In one specific embodiment, the nitride crystal comprises GaN. In a specific embodiment, the device can be fabricated on a slightly off-cut polar substrate.

The substrate typically is provided with one or more of the following epitaxially grown elements, but is not limiting:
- a buffer layer such as an n-type GaN layer
- a sacrificial region such as an InGaN quantum well region
- an n-GaN or n-AlGaN cladding region with a thickness of about 50 nm to about 6000 nm with a Si or oxygen doping level of about $5E16$ cm$^{-3}$ to about $1E19$ cm$^{-3}$
- an InGaN SCH region with a molar fraction of indium of between about 1% and about 10% and a thickness of about 30 nm to about 300 nm;
- quantum well active region layers comprised of one to five about 1.0 to 7.5 nm InGaN quantum wells separated by about 1.5-15.0 nm GaN or InGaN barriers
- optionally, a p-side SCH layer comprised of InGaN with a molar fraction of indium of between about 1% and about 10% and a thickness from about 15 nm to about 250 nm
- optionally, an electron blocking layer comprised of AlGaN with molar fraction of aluminum of between about 5% and about 20% and thickness from about 10 nm to about 25 nm and doped with Mg.
- a p-GaN or p-AlGaN cladding layer with a thickness from about 400 nm to about 1000 nm with Mg doping level of about $5E17$ cm$^{-3}$ to about $1E19$ cm-3
- a p++-GaN contact layer with a thickness from about 10 nm to about 40 nm with Mg doping level of about $2E19$ cm$^{-3}$ to about $1E21$ cm-3

As in LED structures, each of these regions are typically formed using at least an epitaxial deposition technique of metal organic chemical vapor deposition (MOCVD), molecular beam epitaxy (MBE), or other epitaxial growth techniques suitable for GaN growth. The active region can include one to about twenty quantum well regions according to one or more embodiments. As an example, following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with about 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0\leq w, x, y, z, w+x, y+z\leq 1$, where $w<u$, y and/or $x>v$, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or $Al_wIn_xGa_{1-w-x}N$ layer about 10 nm to about 100 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_s$-

In$_t$Ga$_{1-s-t}$N, where 0≤s, t, s+t≤1, with a higher bandgap than the active layer, and may be doped p-type or the electron blocking layer comprises an AlGaN/GaN super-lattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about 10E16 cm-3 and about 10E22 cm-3 and may have a thickness between about 5 nm and about 1000 nm. The outermost 1-50 nm of the p-type layer may be doped more heavily than the rest of the layer, so as to enable an improved electrical contact.

An example of an epitaxial structure for an LED device is shown in FIG. 7A. In this example, a buffer layer followed by a sacrificial region formed along with an n-contact layer that will be exposed after transfer. Overlaying the n-contact layer may be an n-type layer and an optional n-type layer or unintentionally doped (UID) layer, a light emitting active region, a p-type or UID layer, and optional EBL layer, a p-type layer, and a p++ contact region. In one example of this embodiment, an n-type GaN buffer layer is grown on a bulk-GaN wafer. Overlaying the buffer layer is a sacrificial region comprised of InGaN layers separated by GaN layers. Overlaying the sacrificial region is an n-type contact layer consisting of GaN doped with silicon at a concentration of 5E18 cm-3, though in other embodiments the doping may range between 1E18 and 1E19 cm-3. Overlaying the contact layer is an n-type AlGaN layer with a thickness of 1 micron with an average composition of 4% AlN, though in other embodiments the thickness may range from 0.25 to 2 microns with an average composition of 1-8% AlN. Overlaying the n-type layer is an n-type or UID layer. Overlaying the n-type or UID layer are light emitting layers consisting of two 3.5 nm thick In$_{0.15}$Ga$_{0.85}$N quantum wells separated by 4 nm thick GaN barriers, though in other embodiments there may be 1 to five light emitting layers consisting of 1 nm to 6 nm thick quantum wells separated by GaN or InGaN barriers of 1 nm to 25 nm thick. Overlaying the light emitting active region is a UID or p-type layer that may be GaN or InGaN. Overlaying the UID or p-type layer is an AlGaN electron blocking layer [EBL] with a composition of 10% AlN, though in other embodiments the AlGaN EBL composition may range from 0% to 30% AlN. Overlaying the EBL a p-type AlGaN layer with a thickness of 0.2 micron with an average composition of 4% AlN, though in other embodiments the thickness may range from 0.25 to 2 microns with an average composition of 1-8% AlN. Overlaying the p-type layer is a highly doped p++ or p-contact layer that enables a high quality electrical p-type contact.

Once the LED epitaxial structure has been transferred to the carrier wafer as described herein, wafer level processing can be used to fabricate the die into LED devices. For example, in many embodiments the bonding media and die will have a total thickness of less than about 7 microns, making it possible to use standard photoresist, photoresist dispensing technology, and contact and projection lithography tools and techniques to pattern the wafers. The aspect ratios of the features are compatible with deposition of thin films, such as metal and dielectric layers, using evaporators, sputter and CVD deposition tools.

An example of an LED epitaxial structure transferred to a carrier wafer or backplane of an LED display is shown in FIG. 7B. In this example, the carrier wafer or backplane may include a p-type electrode or trace circuit on a surface. The p-type electrode or trace circuit may include embedded thin film transistors (TFTs) and pixel drivers. The p-type electrode or trace circuit may be reflective in some embodiments to enhance light extraction. In some embodiments, an optional reflective mirror p-contact may be included for top-side emission. In other embodiments, an optional transparent conductive oxide such as ITO may be included for bottom-side emission. The epitaxial structure may be similar to that of FIG. 7A. An n-type contact such as a top-side ring contact may be formed to enable top-side emission through a top of the epitaxial structure. In some embodiments, the n-type contact may be transparent for top-side emission. In other embodiments, the n-type contact may be a solid n-contact.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. Minimizing die size is critical to reducing manufacturing costs as smaller die sizes allow a greater number of devices to be fabricated on a single wafer in a single processing run. Through the deployment of the die expansion technology enabled by this invention, the current invention is a method of maximizing the number of devices which can be fabricated from a given gallium and nitrogen containing substrate and overlying epitaxial material by spreading out the epitaxial material onto a carrier In an example of die expansion for the LED devices, the die are transferred to a carrier wafer at a second pitch where the second pitch is greater than the first pitch. This invention enables fabrication of die at very high density on a substrate. This high density being greater than what is practical for a device built using current fabrication processes. LED die are transferred to a carrier wafer at a larger pitch (e.g. lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the die can be processed into LED devices using standard lithographic processes. The carrier wafer diameter can be chosen such that die from multiple gallium and nitrogen containing substrates can be transferred to a single carrier and processed into LED devices in parallel using standard lithographic processes.

When manufacturing displays based on micro LEDs, the pixel count can reach thousands, millions, or even tens of millions, so it is helpful to have a manufacturing, testing, and screening strategy that does not lead to excessive numbers of dead or malfunctioning pixels that degrade the display quality, make the yields unacceptable, and manufacturing costs too high. There are several approaches that can be deployed to manage this according to the embodiments described herein. In some embodiments, each pixel may have more than one micro LED die of each color to ensure redundancy in case of a die failure. In one example of this redundancy approach, each pixel may have two red micro LED die, two green micro LED die, and two blue micro LED die. In this configuration, each pixel could have one of the red, green, and blue micro LED die fail, but the overall pixel, and hence the micro LED display, would still be operable. In some embodiments, variants of a redundant die approach is configured in the micro LED display.

In several embodiments of forming a micro LED based display, the approach to include micro LED die redundancy in each pixel may not be practical or may be too expensive.

For example, in miniature pixels (e.g., less than 100 um, less than 50 um, or less than 10 um) it may be difficult to fit multiple micro LED die of each emitting color due to size of the pixel and placement or alignment technology limitations. In other cases, the redundancy approach could be too expensive since now more micro LED die are needed in the display.

In cases where die redundancy is not desired or feasible, an alternative approach may be to test and screen each of the micro LED die before they are transferred from the donor wafer to the carrier wafer or the display back plane. In this embodiment, the testing or screening could be based on a visual inspection such as an automated optical inspection technique to identify defects or features indicative of a defective die. In some embodiments, artificial intelligence or machine learning may be deployed in these visual or optical inspection techniques to enhance the effectiveness and efficiency of the inspection and screening. The inspection method and process can be performed with other techniques in addition to or instead of optical or visual inspection. For example, inspection can be performed with different wavelength light sources including ultraviolet, visual, and infrared light sources and combinations thereof. In some embodiments, inspection methods using x-ray or ultrasonic techniques can be used, photoluminescence techniques can be deployed, including others. These techniques are example inspection approaches, but of course there could be others that could be used with the embodiments described herein.

In an embodiment, defective die are identified by an inspection process, and in some examples, the location of the die or the spatial position or coordinates of the die may be logged and stored in memory. In a subsequent step, the defective die may be removed from the donor wafer prior to the bonding and transfer process that transfers the die from the donor wafer to the carrier wafer.

In an embodiment, the defective die may be removed after the sacrificial region has been partially or fully removed. In this embodiment, the die could be detached from the donor wafer and "picked up" since the mechanical attachment of the die to the donor wafer is weak and designed for removal during the transfer process. The inspection step could be performed either before or after the sacrificial region is partially or fully removed depending on the embodiment. In some embodiments, the inspection is done after the sacrificial region has been fully or partially removed so that the inspection step can detect any defects that occur during removal of the sacrificial region. Once the defective die are identified, the die "pick up" process could be performed in a number of ways. In one example, the die are picked up with a precise mechanical clamping tool that mechanically clamps to secure the defective die and then lifts it up. In another example, the pick-up tool uses an adhesive type of attachment on a mechanical finger to secure the die and then lift it off the donor wafer. In yet another example, a precise vacuum tool is used to secure the die and then lift it off the donor wafer. Mechanical tooling and fixtures with precise spatial control coupled with image and pattern recognition capabilities could be used to locate the defective die based on inspection data and then precisely pick the die up off the donor wafer. These pick-up techniques are merely example pick-up or removal approaches, but of course there could be others that may be used with the embodiments described herein.

In another embodiment, the defective die screening approach includes electrical or optoelectrical testing of the micro LED die in place of or in addition to the optical or visual inspection step. Such testing could be performed with a direct probing technique or with a contactless technique such as mercury probing. Various electrical tests and characteristics could be used to identify defective micro LED die including current versus voltage (IV) curves, turn-on voltage, series resistance, leakage current, reverse bias leakage, and many other characteristics that may be indicative of defective die. Various optoelectrical tests could be used to identify defective micro LED die including electroluminescence, spectral characterization such as peak wavelength, spectral intensity, and spectral width, light output versus current injected (LI) curves, polarization, and many other characteristics that may be used to identify defective die. These electrical and optoelectrical screening techniques are merely example techniques, but of course there could be others that may be used with the embodiments described herein.

In the processes described above where the die are screened on the donor wafer and then the defective die are removed prior to being transferred to the carrier wafer, a void or unpopulated area will exist on the carrier wafer or in the micro LED based display panel where the die was removed from the donor wafer. This could lead to "dark" pixels with no light output, or with pixels that cannot color tune over the full color range based on not having all the micro LED colors (e.g., red, green, and blue) in the pixel. According to some embodiments described herein, there are many methods to address these dark or incomplete pixels using die replacement or pixel repair techniques.

In an embodiment of die replacement or pixel repair, the missing micro LED die on primary donor wafers may be replaced. In this donor level die replacement or pixel repair method, a spare die bank may be created for each of the micro LED colors and made available as spare die or replacement die. In an example, extra or "spare" donor wafers having micro LED die of each color may be processed and subjected to the same screening processes used for the primary donor wafers. With the defective die removed from the spare donor wafers, only good die remain. In a subsequent step, a pick and place method or an alternative method may be used to move the good die from the spare donor wafers to empty locations on the primary donor wafers. To ensure that the die sufficiently stick or fasten to the primary donor wafer, various methods for attachment can be used including an isolated bond technique such as thermocompression, interdiffusion, or using an adhesive to act as a glue material between the replacement die and the primary donor wafer. The attachment method may be designed to create a strong bond to remain on the donor wafer throughout the subsequent processing and handling steps, but then detach appropriately during the transfer process from the donor wafer to the carrier wafer. In methods that use an adhesive, a cleaning process may be used after transfer to remove the adhesive and any residual materials.

As described earlier, any tool or tools used to pick up defective die from a donor wafer and/or repair or replace the defective die would need to be a precision tool with location recognition and alignment tolerances acceptable for removing the defective die and/or placing a replacement die into the empty position. The pick-up of the replacement die from the spare donor wafer, tape, or other, could happen in a number of ways and is not limited to those described herein. In one example, the die are picked up from the spare donor wafer or tape with a precise mechanical clamping tool that mechanically clamps to secure the replacement die and then lifts it up. In another example, the pick-up tool uses an adhesive type of attachment on a mechanical finger to secure the replacement die and then lift it off the donor wafer. In yet another example, a precise vacuum tool is used to secure the replacement die and then lift it off the spare donor. Mechanical tooling and fixtures with precise spatial control coupled with image and pattern recognition capabilities could be used to locate the replacement die based on inspection data and then precisely pick the die up off the spare donor wafer. These pick-up techniques are merely example pick-up or removal approaches, but of course there could be others that may be used with the embodiments described herein.

In another embodiment of die replacement or pixel repair, the missing micro LED die on the carrier wafer or micro LED display panel could be replaced. In this carrier level die replacement or pixel repair method, again a spare die bank may be created for each of the micro LED colors and would be available as spare die or replacement die. In an example, extra or "spare" donor wafers having micro-LED die of each color may be processed and subjected to the same screening processes used for the primary donor wafers. With the defective die removed from the spare donor wafers, only good die remain. In a subsequent step, a pick and place method or an alternative method may be used to move the good die from the spare donor wafers to empty locations on the carrier wafers or the micro LED display panel. In this approach, the replacement die is provided with a bond interface to the carrier wafer or micro LED display panel that has similar properties to the bond interfaces between the die that were transferred to the carrier wafer from the primary donor wafer. In one example, an interdiffusion bond such as a metallic bond is used both for the primary die bonds and the replacement die bonds. In another embodiment, a solder may be used and a die bonding approach may be used for the die replacement step. For example, if interdiffusion bonding is impractical, an approach such as eutectic bonding or solder bonding may be more practical. A heated pick up tool can be used to remove the die from the spare donor wafer and solder bond it to the carrier wafer or micro LED display panel. Specialized tooling may be used for this isolated bonding of the micro LED die to the carrier wafer or micro LED display panel.

As described herein, there are many sequences and testing methods that can be used for die screening and die repair in accordance with various embodiments. FIGS. 8A-8C are flowcharts of exemplary methods that include screening die during a transfer process in accordance with some embodiments. FIG. 8A provides a method where the screening may be performed after fully or partially removing a sacrificial region. In the FIG. 8A sequence, a donor wafer is formed in a first step. Forming the donor wafer may include forming a sacrificial region (or release material) and an epitaxial material over a surface region of a substrate. The epitaxial material is patterned to form a plurality of dice arranged in an array. Another step includes either fully or partially removing the sacrificial region. This may include subjecting the sacrificial region to an energy source to fully or partially remove the sacrificial region. Another step includes subjecting the die to a screening process to identify defective die. The screening process may include at least one of a visual inspection, an optical inspection, an electrical test, or an optoelectrical test. Another step includes selectively removing the defective die from the donor wafer. This may involve using a pick up technique as described previously. Another step includes bonding at least some of the good die to a carrier wafer. This may include bonding interface regions overlying the plurality of dice with bonding regions on the carrier wafer. Optionally, another step may include selectively bonding "spare" die to the carrier wafer where there are missing die. This may involve using pick and place technique as described previously. Alternatively, rather than selectively bonding spare die to the carrier wafer, the spare die may be selectively bonded to the donor wafer before the good die are bonded to the carrier wafer. The spare die may then be transferred, along with the good die, to the carrier wafer. FIG. 8B provides a method where the screening may be performed before fully or partially removing the sacrificial region. The steps in the method of FIG. 8B are otherwise similar to those of FIG. 8A.

FIG. 8C provides a method where the screening may be performed after transferring the epitaxy material to a carrier wafer. In this embodiment, the screening process may include at least one of a visual inspection, an optical inspection, an electrical test, or an optoelectrical test. The screening process may be performed either immediately after transfer or after additional processing steps are completed. After the screening process, defective die are removed from the carrier wafer, which may involve using a pick up technique as described previously. Alternatively, the defective die could be disabled rather than removed. After removing or disabling the defective die, a "spare" die would be bonded in place of the defective die. Alternatively, the "spare" die could be bonded to a prepared extra bond pad on the carrier. This may involve using pick and place technique as described previously. The screening, die removal, and die replacement can be done after transferring one, several, or all of the intended die to the carrier.

Some embodiments involve massively parallel die transfer processes where a donor wafer with a sacrificial region and specified epitaxial stacks that will subsequently form the devices, such as micro LED dies, is prepared for transfer to a carrier wafer by performing pre-processing steps such as etching mesas and forming anchor supports to hold the dies in place when the sacrificial region is removed.

For manufacturing micro LED displays using this method, the epitaxial layer stack for the violet, blue, cyan, green, or yellow emitting die within the pixels could be formed on native gallium nitride substrates. Such gallium nitride substrates offer the advantage of low defect density, homoepitaxy, high-quality LED epitaxy structures with the proper cladding regions, active regions with InGaN containing light emitting layers, and/or proper electrical properties. The epitaxial stacks containing InGaN light emitting layers may contain GaN layers, AlGaN layers, AlInGaN layers, and other types of layers, and the light emitting regions may be formed with double heterostructures, quantum wells, quantum wires, or quantum dots. Growth approaches such as growth on porous layers, growth on patterned substrates, growth on relaxed buffer layers, and other approaches may be included in some embodiments. In another embodiment, these various color emitting die utilizing InGaN containing light emitting layers may be grown on alternative substrates such as on silicon substrates, silicon carbide substrates, sapphire substrates, or other types of substrates. The said substrates may have modifications such as patterning as in patterned sapphire or other modifications or features to enhance the epitaxial layers or light extraction from the micro LED die. Due to the limited availability of large area bulk gallium nitride wafers, it may be advantageous to grow the epitaxial structures with InGaN emitting regions on alternative substrate types such as silicon substrates, where the growth could be performed on 200 mm, 300 mm or even larger diameter substrates. If the carrier wafer is also 200 mm or 300 mm in diameter, it would enable an ultra-massively parallel die transfer process. The carrier and the donor substrates may be made from the same material, such as silicon, to match coefficients of thermal expansion.

In an embodiment, the red emitting micro LED die may be configured with InGaP and AlInGaP layers wherein the AlInGaP layers have a composition that provides the desired light emission wavelength. The epitaxial layer stack for the red emitting micro LED die may be grown on GaAs substrates and contain GaAs layers, AlGaAs layers, and/or AlInP layers. In an alternative embodiment, the epitaxial layer stack for the red emitting micro LED die may be grown on large area wafers, such as silicon wafers, for ultra-massively parallel die transfer.

One challenge for micro LED displays where the micro LED die are small in diameter (i.e., less than 100 um, less than 50 um, less than 25 um, less than 10 um, or less than 5 um) is edge effects. Surface recombination, oxidation, defect penetration, damage, diffusion, and other effects at an edge surface of the die can limit the reliability, lifetime, performance, and efficiency of the light emitting die. To mitigate these effects, passivation layers may be implemented to passivate the sidewalls of the micro LED die. Red micro LEDs formed from the AlInGaP material system are known to have a degradation and performance suppression due to the high surface recombination and edge effects. Therefore, in an embodiment, the red light emitting die may be formed from high indium content InGaN light emitting layers. Red emission can be a challenge for III-nitride materials, such as InGaN, because of the large lattice mismatch between InN and GaN. To overcome these challenges, non-conventional approaches, such as growth on relaxed buffer layers, growth on porous GaN or AlInGaN alloys, the use of nanorod structures, employing quantum-dot color conversion, and Eu-doped GaN, are actively being researched. With this strong research activity, red emitting InGaN emitting LEDs are emerging and could offer advantages to micro LED displays. The epitaxial stacks containing red, yellow, or orange InGaN light emitting layers may contain GaN layers, AlGaN layers, AlInGaN layers, and other types of layers, and light emitting regions may be formed with double heterostructures, quantum wells, quantum wires, or quantum dots. The micro LED devices in some embodiments described herein may use color conversion techniques to provide some emission colors. For example, some embodiments may use RGB micro LED devices that include blue LEDs with color converters for the green and red emissions. The color converters are not limited and may include phosphors, quantum dots, semiconductor materials, and the like that are pumped by the blue LEDs. As another example, other embodiments may use RGB micro LED devices that include violet LEDs with color converters for the blue, green, and red emissions. The color converters are not limited and may include phosphors, quantum dots, semiconductor materials, and the like that are pumped by the violet LEDs. Growth approaches such as growth on porous layers, growth on patterned substrates, growth on relaxed buffer layers, and other approaches are included in embodiments described herein. In another embodiment, these red emitting micro LEDs utilizing InGaN containing light emitting layers may be grown on alternative substrates such as on silicon substrates, silicon carbide substrates, sapphire substrates, or other types of substrates. The substrates may have modifications such as patterning (as in patterned sapphire or other modifications) or features to enhance the epitaxial layers or light extraction from the micro LED die. Due to the limited availability of large area bulk gallium nitride wafers, it may be advantageous to grow the epitaxial structures with InGaN emitting regions on alternative substrate types such as silicon substrates where the growth could be performed on 200 mm, 300 mm or even larger diameter substrates.

Once donor wafers are prepared by growing the epitaxial structures for the micro LEDs to emit at the desired wavelengths, and sacrificial regions, mesas, and anchor structures are formed, the donor wafers are prepared for die transfer to a carrier wafer. An energy source may be applied to the sacrificial layer (or release material) to fully or partially removed it, reducing the strength at which the die are secured to the donor wafer. In one example, the energy source is a chemical source with a massively selective wet etch to preferentially etch the sacrificial region. The die are held in place by a small unetched portion of the sacrificial region or by small anchors that may be formed by metal or other materials.

In another step, the donor wafers are aligned to a properly prepared carrier wafer with bonding pads that are designed to mate to the die on the donor wafer to which they are intended to bond. The bond pads can be formed with metal such as gold or with other materials such as oxides, dielectrics, ceramics, organic materials, transparent conductive oxides, or other materials. The carrier wafer can be comprised of any type of appropriate carrier wafer material including ceramic, silicon, silicon on insulator, silicon carbide, quartz, purity fused silica, glass, sapphire, diamond, copper, aluminum nitride, aluminum oxynitride, gallium arsenide, gallium nitride, gallium nitride on silicon, indium phosphide, a flexible member, a circuit board, or other types of materials or substrates. The massively parallel die transfer process according to some embodiments may undergo a wafer-to-wafer bonding process with careful alignment to properly align the intended die from the donor wafer to bond onto the intended bond pad on the carrier wafer, within an alignment tolerance according to predetermined design rules. The bond between the die and the pads on the carrier wafer can be formed in many ways. In one approach, a Au—Au interdiffusion bond is used where heat and pressure are applied for an incremental time period such as 15 seconds, 30 seconds, 60 seconds, or more. The bond could also be formed with oxides or dielectrics or could be formed with solders such as eutectic solders, bump bonds, indium bumps, or other types of bonds. Once the bond is formed between the die and the carrier wafer with sufficient strength, the donor wafer and carrier wafer are separated, breaking the anchor features and leaving the micro LED epi stack ready for additional device processing.

One challenge with the direct bonding process from the donor wafer to the carrier wafer is the bonding alignment of the die. As the die become smaller in size within the micro LED display, the alignment becomes more important. For example, in micro LEDs that are less than 25 um in diameter, less than 15 um in diameter, less than 10 um in diameter, or even less than 5 um in diameter, controlling the alignment of the die placement down to +/−5 um, +/−3 um, or even +/−1 um may be required. Bonding processes are typically heated so the coefficient of thermal expansion of the donor wafer and the carrier wafer may play a role in proper alignment. In some embodiments the die spacings on the donor wafer and/or on the carrier wafer are specifically designed with comprehension of the coefficient of thermal expansion, the process temperature, and other factors that may affect the alignment. The die spacing on the donor wafer and/or the bond pad spacing on the carrier wafer has a special design consideration, and could even be chirped, with a varying or non-uniform pitch of the die on the donor wafer and/or on the bond pads of the carrier wafer. Very precise, repeatable, and uniform temperature control of the donor wafer and the carrier wafer may be required during the bonding process. This may be accomplished with heater systems and designs, and/or with heating and cooling sequences. There are many other designs and process improvements that may be implemented with these embodiments to ensure sufficient alignment of the donor die on the carrier wafer during the bonding process.

After the die has been transferred, it may be desirable or necessary to remove the anchor features. There are several ways that this can be accomplished. For example, a selective wet etch of the anchor material can remove the anchors without damaging any of the desirable device layers or the epitaxial material. One example workflow is illustrated in FIGS. 9A-9D, which are simplified cross sectional diagrams illustrating a process of selective anchor removal in accordance with an embodiment. In this example, the epitaxial material is prepared for transfer, including forming of p-contacts, n-contacts, passivation layers, and anchor metals by performing steps that may include an active region exposure etch and a sacrificial region exposure etch. Common metals that may be included for the gallium and nitrogen containing die include Pd, Al, Au, Ti, Pt, and others. Passivation layer materials can include SiO2, Al2O3, SiN, AlN, AlON, and others. In this example, TiW is selected as the anchor metal material, but alternative anchor metal materials including Ti, Al, W, SiO2, SiN, Ni, Cr, may be used in some embodiments. After the die is prepared, the sacrificial region is etched, followed by bonding and transfer to the carrier wafer. After transfer the anchors are removed by a wet etch process. In this example, a Ti-Tungsten TiW-30 etchant, a commercially available product from Trasense Company, is used to remove the TiW Anchors. This wet etchant is selected for compatibility with all metals in the device structure, and in this case it will not etch Pd, Au, Al, or Al2O3. Alternate wet etchants with selectivity to common metals include, but are not limited to HF, buffered HF, Ti etchant TFT, H2O2, Ni etchant type TFB, chromium etchant, and the like. An alternative method to preventing unwanted etching during anchor removal is to cap an etching-susceptible layer with a non-susceptible layer to prevent the etchant from coming in contact with the etching-susceptible layer. In addition to wet etching processes, selective anchor removal can be performed by dry etching methods as well. These dry etching methods can be chemically selective, or masking using photoresist may be used to avoid unwanted material removal.

As described herein, the die on the donor wafers may be arranged with a first set of spacings or pitch, and then they may be transferred to the carrier wafer at a second pitch that could be larger than the first set of spacings or pitch. This configuration is referred to as die expansion since the transferred die have a larger or expanded pitch on the carrier wafer than the first pitch on the donor wafer. This die expansion enables increased epi and donor substrate area utilization for improved cost and manufacturing efficiency. In addition, since some embodiments enable a direct wafer to wafer bond process to transfer die from the donor to the carrier wafer in a single step, a massively parallel or ultra-massively parallel transfer of epitaxial die to the carrier wafer may be provided.

FIGS. 10-11 are simplified cross sectional diagrams illustrating some of the challenges with bonding die to a carrier wafer in a transfer process. The die transfer process complexity is increased when transferring die from multiple different donor wafers into a small area or domain such as a pixel on the carrier wafer. Moreover, the die are transferred from various donor wafers at a first closely spaced pitch, to the carrier wafer at a second expanded or increased pitch, but with very closely spaced adjacent die of different micro LED colors. The challenges include unintentionally bonding adjacent die from the donor wafers to the carrier wafer. This kind of defect or process malfunction will arise if adjacent die to the intended die on the donor wafer contact the bond pads on the carrier wafer and undergo the bonding process. This challenge is illustrated in FIG. 10, where a center die is targeted for bonding to the carrier wafer, but adjacent die on the left and right will contact corresponding bond pads on the carrier wafer. Another challenge is encountered when bonding die from the second, third, or any subsequent donor wafers after the first die are transferred to the carrier. The challenge in this case is mechanical interference between the die that have already been bonded to the carrier wafer and the die on the second and subsequent donor wafers that are adjacent to the die intended to be bonded as illustrated in FIG. 11. In FIG. 11, the center G die is targeted for bonding to the carrier wafer, but an adjacent G die will collide with an already transferred B die before the center G die contacts the bond pad on the carrier wafer. If there are already bonded die on the carrier wafer whose locations are spatially overlapping with die on the donor wafer, there will be a collision between the die during the bonding process. This may impact both the carrier wafer with the bonded die and the donor wafer with the die that are being transferred.

In an embodiment, a bonding prevention layer may be selectively formed on the donor wafer and/or the carrier wafer so die on the donor wafer that are not being transferred (or are not intended to be transferred) do not bond to bond pads on the carrier wafer. For example, the bonding prevention layer may be formed on the interface regions of some die on the donor wafer so that the interface regions of those die do not bond to the carrier wafer (or do not bond to bond pads on the carrier wafer). Similarly, the bonding prevention layer may be formed on the bond pads of the carrier wafer to prevent them from bonding with die on the donor wafer. The bonding prevention layers may be any material that prevents a bond from forming with the bond material. For example, a dielectric layer may be used as a bonding prevention layer for a metal bond material in some embodiments.

In some embodiments, various measures can be utilized to preferentially prevent certain die from bonding or sticking to the carrier wafer according to a predetermined sequence. In one example, a layer of non-stick material could be deposited onto either the carrier wafer bond pads or to interface regions of the die to prevent certain die on the donor wafers from bonding to the carrier wafer. In this embodiment, various materials can be used to prevent bonding or sticking such as polymer materials like photoresist that can be patterned on the donor wafer or carrier wafer with an expose and develop process. After the bonding step, the polymer material can be removed with a stripping or developing agent. This sequence can be repeated for subsequent bonding steps to achieve desired bonding. Other materials can also be used such as waxes, liquids, dielectrics, ceramics, or other types of materials that prevent bonding or sticking.

In yet another embodiment, die on the donor wafer can be preferentially prevented from bonding to the carrier wafer by controlling the strength of anchor regions or controlling the attachment strength of the die to the donor wafer. This can be achieved by using adhesives such as polymers that can be preferentially patterned on the donor wafer such that they are only contained in regions where the die are not intended to be released from the donor wafer. In another embodiment, metal, dielectric, plastic, or other materials are used for maintaining die attachment to the donor wafer, and they are specifically designed for a certain attachment strength to enable the die to transfer to a carrier wafer in an intended sequence. Of course, other means of modulating attachment strength of the die to the donor wafer can be deployed, and the above examples are not intended to be limiting.

FIGS. 12A-12D are simplified cross sectional diagrams illustrating a process for transferring die having a large pitch on a donor substrate to a carrier substrate at a smaller pitch in accordance with an embodiment. This embodiment may overcome some of the challenges described above where unintended die from the donor wafer may inadvertently bond to the carrier wafer or where already bonded die on the carrier wafer may inadvertently collide with die on the donor wafer. In some embodiments, die expansion may not be necessary and the die can be transferred from the donor wafers at a first pitch to the carrier at the same pitch or a smaller pitch. In this embodiment, the space between adjacent die on the donor wafers is sufficient to avoid having die on the donor wafer bond to the carrier wafer and sufficient to avoid interference with the already bonded die on the carrier wafer. In this embodiment, the pitch on donor wafer for a particular color of micro LED die may be equal to the pitch on the carrier wafer for that particular color of the micro LED die. This process is illustrated in FIGS. 12A-12D, where a first die Epi 1 is bonded to the carrier wafer (e.g., a blue die), a second die Epi 2 is bonded to the carrier wafer (e.g., a green die), and a third die Epi 3 is bonded to the carrier wafer (e.g., a red die). Each of the die Epi 1, Epi 2, and Epi 3 may represent sets of dies that are transferred simultaneously or sequentially from a donor wafer to the carrier wafer. Of course, this sequence is merely an example, as there could be other orders, sequences, geometries, spatial arrangements, or processes for this approach according to the various embodiments. One benefit of this process is that it is simple and minimizes process steps on the carrier and donor wafers. One disadvantage is that it does not enable die expansion, so it does not maximize the use of the epi and substrate area on the donor wafer.

FIGS. 13A-13F are simplified cross sectional diagrams illustrating a process for transferring die from a donor substrate to a carrier substrate by varying bond pad thickness on the carrier substrate in accordance with an embodiment. In this alternative embodiment, the bond metal on the carrier wafer is varied in thickness and deposited in subsequent steps. In this approach, both issues of adjacent die on the donor wafer inadvertently sticking to the carrier wafer and adjacent die on the donor wafer colliding with already bonded die on the carrier wafer can be avoided. This is accomplished by varying the bond metal thickness or some other material thickness making up the bond pad height on the carrier wafer. The bond pads with different thicknesses may be subsequently formed on the carrier wafer after the preceding die transfer step. This is illustrated in FIGS. 13A-13F. In this example, after the first set of die represented by Epi 1 are transferred to the first set of bond pads on the carrier wafer, a second set of bond pads are formed on the carrier wafer. The second set of bond pads are taller in height than the first bond pad plus the first die Epi 1 that was already transferred. The bond pads can be created by a deposition process, a plating process, or some other process to form a bond pad comprised of a metal or other material like a dielectric, ceramic, or polymer. The second set of bond pads are thick enough that a second set of die represented by Epi 2 can be bonded to the second bond pads without adjacent die sticking to the carrier wafer or colliding with already bonded die on the carrier wafer such as the first die Epi 1. Subsequently, after the second set of die represented by Epi 2 are transferred to the second set of bond pads on the carrier wafer, a third set of bond pads are formed on the carrier wafer. The third set of bond pads are taller in height than the second bond pad plus the second die Epi 2 that was already transferred to the carrier wafer. The third set of bond pads are thick enough that a third set of die represented by Epi 3 can be bonded to the third bond pads without adjacent die sticking to the carrier wafer or colliding with already bonded die on the carrier wafer. This sequence can be repeated n times where n can be any integer number. Each of the die Epi 1, Epi 2, and Epi 3 may represent sets of dies that are transferred simultaneously or sequentially from a donor wafer to the carrier wafer. The illustrations in FIGS. 13A-13F are merely examples and are not intended to be limiting since there could be other sequences and arrangements according to the embodiments described herein.

One advantage of this embodiment where the bond pad height is varied on the carrier wafer for each set of die is that it allows dense packing of die on the donor wafers and die expansion for maximum use of the valuable epi and substrate area. One disadvantage is that it requires subsequent depositions of metal bond pads or other material on the carrier wafer after each color die is bonded. Moreover, it may also necessitate tall bonding pads depending on epi thickness so that the ending topology can be high. If the epi stack thickness of the die that are transferred can be maintained at a minimal level, the topology can be minimized. For example, if the transferred epi thickness or height is less than 0.25 um, less than 0.5 um, less than 1.0 um, or less than 2.0 um, the topology variation can be minimized. There are several techniques that can be used to vary the bond pad height on the carrier wafer. In one approach, a thick metal is deposited or plated using techniques such as e-beam evaporation, thermal evaporation, sputtering, plating, or the like. The metal may be gold, copper, aluminum, silver, molybdenum, or any other metal. In some configurations, the bond pad height is created with materials other than metals such as oxides, dielectrics, ceramics, polymers, semiconductors, or other materials. Of course, there can be many different methods used to achieve the varied height of bond pads and the configurations described here are not intended to be limiting.

FIGS. 14A-14D are simplified cross sectional diagrams illustrating a process for transferring die from a donor substrate to a carrier substrate by varying die height in accordance with an embodiment. In this embodiment, the bond metal (or interface region) thickness or thickness of another layer or material on the donor wafer die is varied to create different heights of the different sets of die to be transferred. Incrementally increasing heights of the sets of die on the donor wafer will prevent inadvertent sticking or bonding of unintended die to the carrier wafer. In this embodiment, the thickness or height variation of the die on the donor wafer is selected to prevent the adjacent die on the donor wafer from inadvertently bonding to adjacent bond pads on the carrier wafer. This method is illustrated in FIGS. 14A-14D, where a first set of die Epi $1_1$ that are the tallest with the thickest bond metal or other material are bonded to the carrier wafer in a first bonding step. Since there is vertical clearance between the bond pads on the other die and the bond pads on the carrier wafer, the second and third set of die Epi $1_2$ and Epi $1_3$ are prevented from inadvertently bonding to the carrier in the first step intended to bond the first set of die Epi $1_1$. Then, in the second bonding step, the second set of die Epi $1_2$ with the second thickest metal or other material are bonded to a second carrier wafer or to a different region on the first carrier wafer. In the third bonding step, the third set of die Epi $1_3$ with the third thickest metal or other material are bonded to a third carrier wafer or to a different region on the first or second carrier wafers. Of course, this process can be extended to a fourth thickness or height which is less than the third thickness or height, fifth thickness or height which is less than the fourth thickness or height, and an N thickness or height which is less than an N−1 thickness of the bond metal or other material on the donor wafer so that a third set of die, a fourth set of die, or an Nth set of die can be bonded to the same or a different carrier wafer in subsequent steps. Some embodiments combine variances in die height with variances in bond pad thickness as explained with regard to FIGS. 13A-13F. In these embodiments, die height and/or bond pad thickness may be varied to provide vertical clearance to avoid inadvertent bonding and inadvertent collisions. Of course, the illustration of FIGS. 14A-14D are merely for example purposes and could use any emitting color die or other type of die. One benefit of this process is that it enables close packing of the die with a small pitch on the donor wafer and then a selective transfer to the carrier wafer at an expanded pitch. In short, this approach can enable die expansion from the donor wafer to the carrier wafer. One disadvantage is the extra processing required to create the sets of die having different heights on the donor wafers. Also, with only incrementally taller die on the carrier wafer, this process may not be sufficient to avoid collisions between adjacent die on the donor wafer and the already bonded die on the carrier wafer.

There are several techniques that can be used to vary the die height on the donor wafer according to the embodiments described herein. In one approach, thick metal is deposited or plated to different heights on the different sets of dies using techniques such as e-beam evaporation, thermal evaporation, sputtering, plating, or the like. The metal can be gold, copper, aluminum, silver, molybdenum, or any other metal. In another approach a thickness of the epi material is varied. In some configurations, the height difference between the different set of dies is created with other materials such as oxides, dielectrics, ceramics, polymers, semiconductor materials, or the like. Of course, there can be many different methods used to achieve the varied die height, and the configurations described herein are not intended to be limiting.

In a further embodiment where die height on the donor wafer is varied, the bond metal thickness or thickness of another layer or material is varied to a more extreme level to create substantially different heights of the different sets of die on the donor wafers that are bonded to the carrier wafer subsequent to the first set of die being bonded to the carrier wafer. In this embodiment, the variation in the die height is sufficient to create enough vertical clearance to avoid both inadvertent sticking or bonding of the unintended die and collisions or mechanical interference between the adjacent die on the donor wafer and already bonded die on the carrier wafer. In this embodiment, the thickness or height variation of the second set of die on the second and successive donor wafers is sufficiently high to enable full vertical clearance of the die that have already been bonded to the carrier wafer. Thus, in this embodiment, the height difference between the different sets of die on the donor wafers not only prevents the adjacent die on the donor wafers from inadvertently bonding to adjacent bond pads on the carrier wafer, but the height difference also prevents the adjacent die on the donor wafers from contacting the die that are already bonded to the carrier.

Figure 15B:
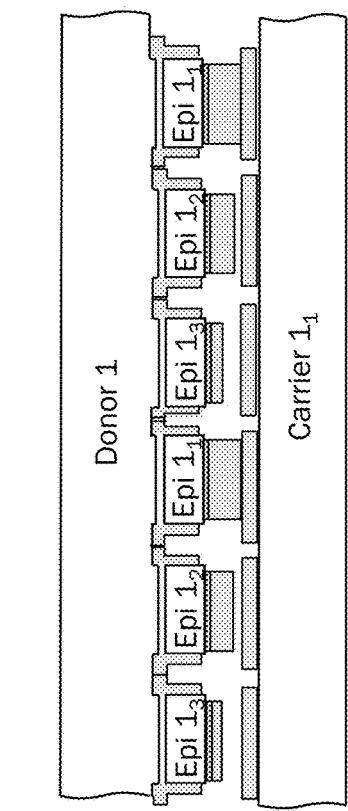
Figure 15C:
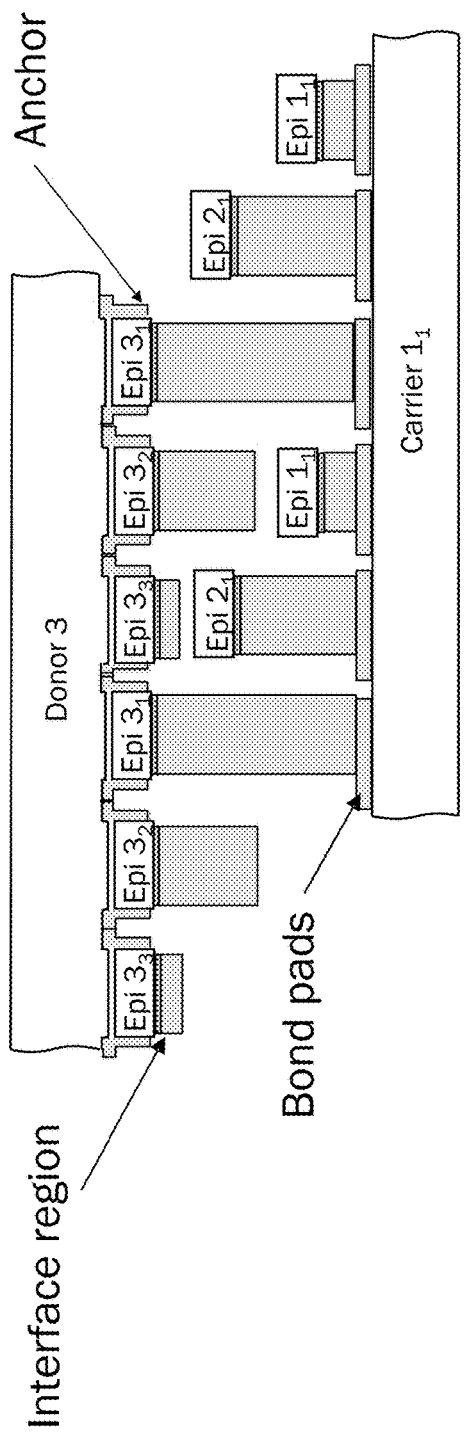

An example of this embodiment is shown in FIGS. 15A-15I. These figures are simplified cross sectional diagrams illustrating a process for transferring die from a donor substrate to a carrier substrate by varying die height. As shown in FIG. 15A, there are three sets of die (Epi $1_1$, Epi $1_2$, Epi $1_3$) on a first donor wafer (Donor 1) that have varying heights with different thicknesses of bond metals or other materials. The first set of die Epi $1_1$ with the tallest height are bonded to a first carrier wafer (Carrier $1_1$). The die height on Donor 1 is configured to be tall enough such that adjacent die do not interfere with the other bond pads on Carrier $1_1$. FIG. 15B shows three sets of die (Epi $2_1$, Epi $2_2$, Epi $2_3$) on a second donor wafer (Donor 2) that have varying heights with different thicknesses of bond metals or other materials. The first set of die Epi $2_1$ with the tallest height from Donor 2 are bonded to Carrier $1_1$. The die height on Donor 2 is configured to be tall enough such that the adjacent die Epi $2_2$, Epi $2_3$ on Donor 2 do not interfere with the first set of die Epi $1_1$ from Donor 1 that have already been bonded to Carrier $1_1$. FIG. 15C shows three sets of die (Epi $3_1$, Epi $3_2$, Epi $3_3$) on a third donor wafer (Donor 3) that have varying heights with different thicknesses of bond metals or other materials. The first set of die Epi $3_1$ with the tallest height from Donor 3 are bonded to Carrier $1_1$. The die height on Donor 3 is configured to be tall enough such that the adjacent die Epi $3_2$, Epi $3_3$ on Donor 3 do not interfere with the first set of die Epi $1_1$ from Donor 1 and the first set of die Epi $2_1$ from Donor 2 that have already been bonded to Carrier $1_1$.

Figure 15D:
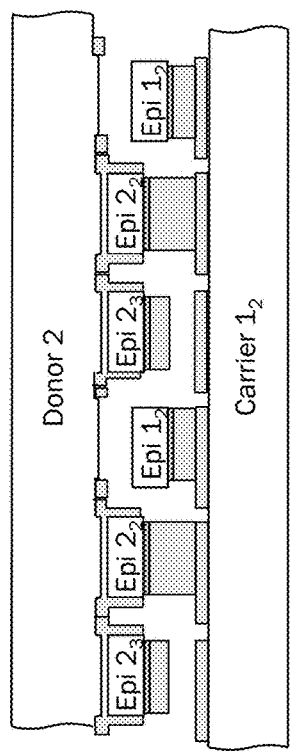
Figure 15E:
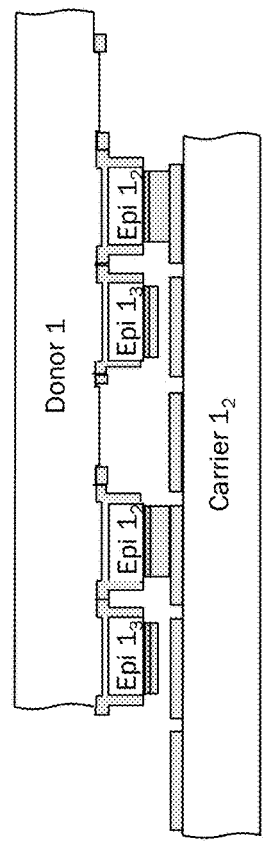
Figure 15F:
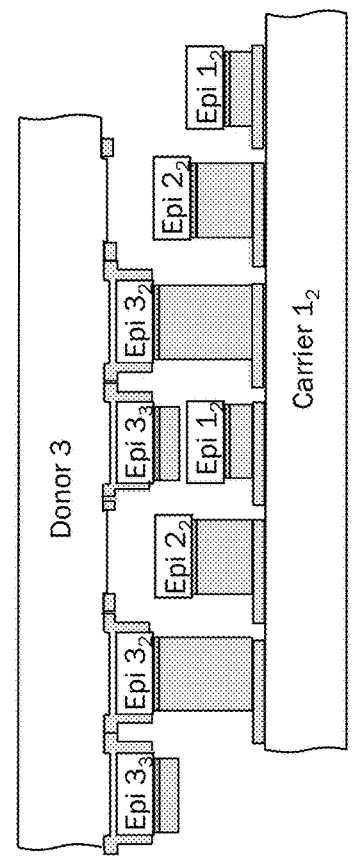

FIG. 15D shows that a second set of die Epi $1_2$ with a second tallest height from Donor 1 are bonded to a second carrier wafer or a different area on the first carrier wafer (Carrier $1_2$). The die height on Donor 1 is configured to be tall enough such that adjacent die do not interfere with the other bond pads on Carrier $1_2$. FIG. 15E shows that a second set of die Epi $2_2$ with a second tallest height from Donor 2 are bonded to Carrier $1_2$. The die height on Donor 2 is configured to be tall enough such that the adjacent die Epi $2_3$ on Donor 2 do not interfere with the second set of die Epi $1_2$ that have already been bonded to Carrier $1_2$. FIG. 15F shows that a second set of die Epi $3_2$ with a second tallest height from Donor 3 are bonded to Carrier $1_2$. The die height on Donor 3 is configured to be tall enough such that the adjacent die Epi $3_2$ on Donor 3 do not interfere with the second set of die Epi $1_2$ from Donor 1 and the second set of die Epi $2_2$ from Donor 2 that have already been bonded to Carrier $1_2$.

Figure 15G:
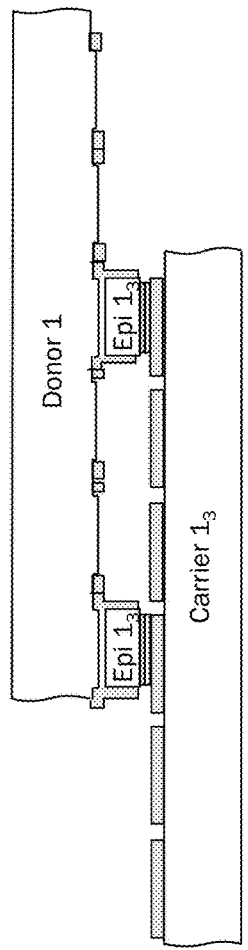
Figure 15H:
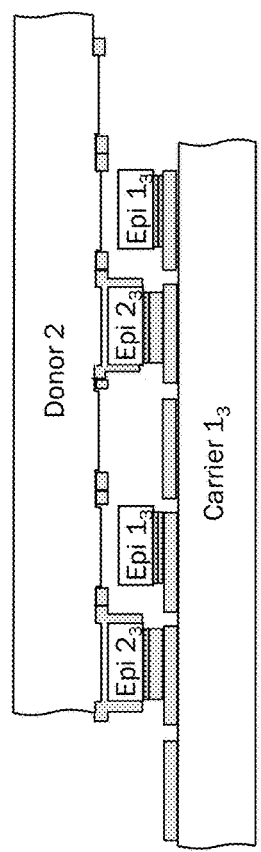
Figure 15I:
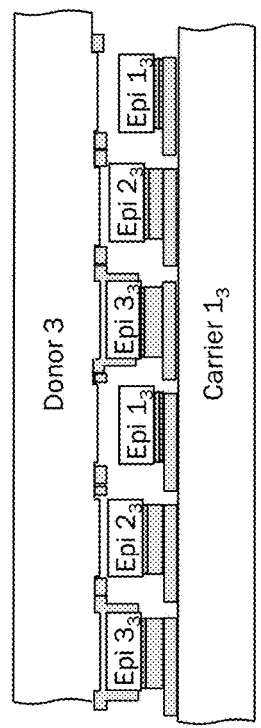

FIG. 15G shows that a third set of die Epi $1_3$ with a third tallest height from Donor 1 are bonded to a third carrier wafer or a different area on the first carrier wafer (Carrier $1_3$). FIG. 15H shows that a third set of die Epi $2_3$ with a third tallest height from Donor 2 are bonded to Carrier $1_3$. FIG. 15I shows that a third set of die Epi $3_3$ with a third tallest height from Donor 3 are bonded to Carrier $1_3$. Of course, FIGS. 15A-15I provide an example sequence according to an embodiment, but there could be many other sequences and orders of operations consistent with the principles described herein.

In the embodiment illustrated in FIGS. 15A-15I, the different donor wafers Donor 1, Donor 2, Donor 3 may each have die with different emission colors. As an example, Donor 1 may have blue emitting die, Donor 2 may have green emitting die, and Donor 3 may have red emitting die. This embodiment is not limited to these colors and any of the donor wafers may be configured to have die with any emission color. This embodiment is also not limited to three donor wafers with die having three different emission colors, and instead includes any number of donor wafers and emission colors. Also, the embodiment illustrated in these figures can be extended to a fourth die height which is less than the third die height, a fifth die height which is less than the fourth die height, and an Nth die height which is less than an N−1 die height on each donor wafer Donor 1, Donor 2, Donor 3 so that a fourth set of die, fifth set of die, or an Nth set of die can be bonded to different carrier wafers or to different areas on the same carrier wafer in subsequent steps. Some embodiments combine variances in die height with variances in bond pad thickness as explained with regard to FIGS. 13A-13F. In these embodiments, die height and/or bond pad thickness may be varied to provide vertical clearance to avoid inadvertent bonding and inadvertent collisions. One benefit to this process is that it enables close packing of the die with a small pitch on the donor wafers and a selective transfer to the carrier wafer at an expanded pitch. In short, this approach can enable die expansion. One disadvantage to this process is the extra processing required to create the different die heights on the donor wafers.

FIGS. 16A-16C are simplified cross sectional diagrams illustrating a round robin sequence for transferring die from a donor substrate to a carrier substrate in accordance with an embodiment. In this embodiment, a kind of a round robin workflow sequence with the donor wafers and carrier wafers is implemented to avoid having adjacent die on the donor wafer collide with die that have already been bonded to the carrier wafer. In this example of sequencing, there may be three different carrier wafers or three different regions or areas on the same carrier wafer. In order to achieve die expansion and to avoid both adjacent die from the donor wafer sticking to the carrier wafer and to prevent collisions or mechanical interference between the adjacent die on the donor wafer and die already bonded to the carrier, the round robin sequencing may be combined with an additional technique such as sequentially forming the bond pads on the carrier wafer, similar to the process of FIGS. 13A-13F, or by varying the height of the different sets of die on the donor wafers, similar to the process of FIGS. 14A-14D or FIGS. 15A-15I. The specific approach shown in FIGS. 16A-16C utilizes the successive formation of the bond pads with the appropriate height, but this is just for illustration and of course other methods could be combined with the round robin workflow approach.

In the example shown in FIGS. 16A-16C, the sequence is comprised of three different carrier wafers or three different regions on the same carrier wafer, and a donor wafer for each of the blue emitting die (Donor 1), the green emitting die (Donor 2), and the red emitting die (Donor 3). An objective of this round robin sequence is to utilize the "gaps" that are formed on the donor wafers where there are missing die as the different sets of die are bonded from the donor wafers to the carrier wafers. By aligning these gaps on the donor wafers with the die that are already bonded to the carrier wafer, there is sufficient clearance to prevent adjacent die on the donor wafers from colliding with die that are already bonded to the carrier wafer. As shown in FIGS. 16A-16C, a first set of blue die Epi $1_1$ is bonded from Donor 1 to the first carrier wafer, a second set of green die Epi $2_2$ is bonded from Donor 2 to a second carrier wafer or another area on the first carrier wafer, and a third set of red die Epi $3_3$ is bonded from Donor 3 to a third carrier wafer or another area on the first carrier wafer. In another bonding sequence, a second set of blue die Epi $1_2$ is bonded to the carrier wafer, a third set of green die Epi $2_3$ is bonded to the carrier wafer, and a first set of red die Epi $3_1$ is bonded to the carrier wafer. In yet another bonding sequence, a third set of blue die Epi $1_3$ is bonded to the carrier wafer, a first set of green die Epi $2_1$ is bonded to the carrier wafer, and a second set of red die Epi $3_2$ is bonded to the carrier wafer.

It should be understood that the method described above and partially illustrated in FIGS. 16A-16C is merely one example of this round robin bonding sequence. Other sequences, emission colors, and number of donor wafers and carrier wafers may be used in accordance with the principles described. There are many configurations, sequences, arrangements, spatial layouts, geometries, and processes that could utilize this round robin approach. For example, FIGS. 16A-16C show a cross sectional view of blue, green, and red die arranged in a side-by-side or linear configuration. This linear configuration is one such arrangement for pixels in a micro LED display, but of course there could be others. In this linear approach, there is a horizontal or vertical translational bonding method to execute the round robin bonding sequence. In other configurations, the sequence could be performed using a rotational method where the bonding from the donor wafers to the carrier wafer occurs with rotational symmetry. For example, for a three micro LED die per pixel configuration such as the red-green-blue design described above, the three die could be arranged in an equilateral triangle such that the die bond pads on the carrier wafer and center points of the three bonded die in each of the pixels would be at the vertices of the triangle. When the round robin sequence is executed, the blue, green, and red die may end up in the same bond pad location within the pixel. For example, the blue die may be at the top vertex of the triangle, the green could be at the lower left vertex of the triangle, and the red die could be at the lower right vertex of the triangle. The donors would also have the same equilateral triangle arrangement of die, and as the different die sets of each color are bonded from the donor wafers to the different carrier wafers or different locations on the same carrier wafer, the donor wafer or the carrier wafer would rotate by 120 degrees after each set of die was bonded. The geometry and methodology could be extended to a square pattern for a 4-die pixel arrangement, a pentagon for a 5-die pixel arrangement, a hexagon for a 6-die pixel arrangement, and so forth.

FIGS. 17A-17F are simplified cross sectional diagrams illustrating a process for transferring die from a donor substrate to a carrier substrate using an intermediate member in accordance with an embodiment. In this embodiment, an intermediate member and pick and place member, such as a pedestal collet, can be used to eliminate bonding interference issues associated with bonding multiple die from different donor wafers to a carrier wafer. In this approach, after the sacrificial release layer is removed, the die are weakly bond to the donor substrate. The donor wafer is pressed into an intermediate member which, for example, has a pressure sensitive adhesive tape or coating applied to the surface that adheres to each individual die and has an adhesion force strong enough to break the anchors on the donor wafer as the donor wafer and intermediate member are pulled apart. This process may provide a mass transfer of the die from the donor wafer to the intermediate member.

Substrates with low flatness and total thickness variation (TTV) may be used for the intermediate member. These include, but are not limited to, silicon substrates, sapphire substrates, glass substrates, and the like. In some instances, an ultraviolet (UV) release layer or laser based release layer can be used with substrates of an appropriate transparency.

A wide variety of materials can be used for the adhesive layer. As an example, a double-sided thermal release tape may be directly applied to the intermediate member and be used as the temporary adhesive layer. These tapes are traditionally used in many areas of semiconductor processing and have very good thickness and thickness variation control. In addition, the initial adhesive strength of the tape can be tuned to overcome the failure strength of the anchors on the donor wafer to facilitate transfer from the donor wafer to the intermediate member. Upon heating, the adhesive strength drops so the transferred die can be removed in subsequent transfer steps. In addition to thermal release tapes, a double-sided UV release tape may be used in some embodiments. Similar to the thermal release tape, the adhesion strength of the UV release tape can be reduced to facilitate transfer from the intermediate member. Instead of using heat, the UV release tape is activated by exposing the tape to UV light to reduce the adhesion strength. When using UV release tape, a transparent substrate may be used so the tape can be exposed through the substrate. In other embodiments, the transferred die may be coupled to the intermediate member by a vacuum, Vander walls forces, chemical bonds, and the like.

After the die are transferred to the intermediate member, the adhesion strength of the adhesion layer is reduced to enable subsequent pickup with, for example, a die attach collet. A pedestal style die attach collet may be used to selectively align and pick up die from the intermediate member. The pedestal feature is designed to avoid X, Y, and Z clearance issues with existing die from previous transfers or existing topography of the carrier wafers. In addition, these collets can be designed to pick up many die at one time allowing massive parallel die transfer to a receiving carrier substrate. After pickup from the intermediate member, the die are aligned and bonded to the carrier wafer. The pickup collets can be made of typical materials used in a variety of high temperature die attach processes. This process is repeated until all the die from the intermediate member are transferred to the carrier wafer.

FIGS. 17A-17F provide an example of how this approach may be used to transfer die from multiple donor wafers for a microLED application. Initially, epitaxial device layers are grown on each donor wafer. The donor wafers then go through device processing. As shown in FIGS. 17A-17B, an adhesive layer is formed on one or more intermediate members, and after processing, the die are transferred to the one or more intermediate member s using the release process described previously. As shown in FIGS. 17C-17D, the pedestal pickup collet is used to selectively pick up die from the intermediate member and subsequently align and bond the die to the carrier wafer. This process is repeated for each donor wafer resulting in a fully populated carrier wafer. FIG. 17D illustrates the process of bonding a green emitting die to the carrier wafer, FIG. 17E illustrates the process of bonding a red emitting die to the carrier wafer, and FIG. 17E illustrates the process of bonding a blue emitting die to the carrier wafer. Of course this is just an example and other sequences and colors may be used without departing from the spirit of this embodiment.

A challenge in the manufacture of high-efficiency, high-reliability micro LED displays where the micro LED die are small in diameter (e.g., less than 100 um, less than 50 um, less than 25 um, less than 10 um, or less than 5 um) is edge or sidewall effects. Surface recombination, oxidation, defect penetration, damage such as etch damage, diffusion, and other effects at the edge surface of the die can limit performance and reliability. To mitigate these surface and edge effects, passivation layers may be implemented to passivate the sidewalls of the micro LED die. In the case of AlGaInP/InGaP quantum well based red micro LEDs, due to surface recombination velocity and minority carrier diffusion length, devices without sidewall passivation may have high leakage and reduced external quantum efficiency (EQE). The surface recombination velocity in AlInGaP/InGaP is known to be larger than for InGaN/GaN quantum well based blue and green micro LEDs. This can result in significant performance degradation as the die size is reduced. Sidewall defects, which may be caused by the mesa formation processes, such as inductively-coupled plasma (ICP) etching, reactive ion etching (RIE), combinations thereof, or other etching techniques, can create damage and/or defects and/or impurities that can act as Shockley-Read-Hall (SRH) recombination centers. This recombination results in the degradation of the EQE. This may be especially acute in micro LEDs because the smaller LEDs have a larger surface-to-volume ratio as the device size decreases versus conventional sized LEDs.

To suppress and mitigate sidewall induced performance and reliability degradation, a wide array of sidewall passivation strategies may be used in accordance with various embodiments. Any of these passivation strategies for InGaN/GaN, AlInGaP/InGaP, or other light emitting material systems may be used. For example, some InGaN/GaN based micro LEDs may use a KOH treatment followed by an atomic layer deposition (ALD) to passivate the InGaN emitting layers. ALD may be used to deposit Al2O3 for passivation, but other layers could be deposited such as GaN, AlInGaN alloys, AlN, AlON (aluminum oxy nitride), SiO2, or others. With passivation, the light emission uniformity and EQR can be improved.

The micro LED die fabrication process including the passivation strategy is important for the formation of highly efficient micro-displays. Red micro-LEDs formed from AlInGaP/InGaP may be subjected to a surface passivation technique with a sulfur treatment followed by a deposition of Al2O3. ALD of Al2O3 on AlInGaP/InGaP red micro LEDs can provide an effective sidewall passivation that improves current-voltage characteristics, lowers leakage current, and increases light output power. Moreover, the use of trimethyl aluminum (TMA) with a nitrogen plasma surface treatment can be used to further enhanced the forward current-voltage characteristics. In some embodiments, deposition techniques other than ALD can be utilized. Such alternative deposition techniques could include metal organic vapor deposition (MOCVD), molecular beam epitaxy (MBE), electron cyclotron resonance (ECR) deposition, electron beam deposition, sputtering deposition, ion beam deposition, plasma enhanced chemical vapor deposition, thermal evaporation deposition, and other deposition techniques.

In some embodiments, the passivation layers may be comprised of semiconductor layers such as GaN, AlGaN, InGaN, AlInGaN, InGaP, GaP, GaAs, AlGaAs, InAlGaAs, or other combinations. The passivation layers may also be comprised of oxides such as Al2O3, AlON, SiO2, GaO, or any other oxide. The passivation layers may also include other materials such as SiN, AlN, or any other materials.

In addition to the various deposition techniques for passivation layers and the different types of passivation layers that could be used according to the various embodiments, many different surface treatments can be employed such as chemical etches to remove oxides, contaminants, or other undesired constituents. In some embodiments, a high temperature annealing step or other reconfiguration step can be included to anneal out damage in the semiconductor material, remove oxides, or diffuse out unwanted constituents. Examples of surface treatments include KOH treatments, BOE/BHF treatments, HCl treatments, or many other chemical treatments. In some embodiments, plasma treatments can also be used.

In some embodiments, approaches to modify a band-edge in light emitting layers near the surface of the micro LED die are implemented. By increasing the band edge locally to the surface, carrier recombination at the sidewalls can be mitigated or reduced. In one embodiment, the micro LED die may be subjected to quantum well intermixing (QWI). QWI can be used to locally increase the bandgap of the light emitting layers in the sidewall region of the micro LED. The basic principle of quantum well intermixing is based on the exchange of atoms between epitaxial layers of different atomic compositions within the quantum well or other light emitting layers in the epitaxial stack. In the case of intermixing quantum wells, typically the atomic exchange happens between the one or more quantum wells and the adjacent barrier layers in the stack. For example, for an AlInGaP/InGaP quantum well/barrier stack, some of the Al from the quantum well layers may diffuse into the barrier layers based on the concentration gradient. This diffusion of the Al incrementally increases the effect bandgap of the light emitting quantum well layers while incrementally reducing the bandgap of the barrier layers. This approach may be used for LEDs in a GaAs/AlGaAs material system, for red and other wavelength LEDs in an AlInGaP/InGaP material system, for photonics and LEDs in an InGaAsP/InP material system, and for LEDs in the InGaN/GaN material system.

This concentration gradient driven effect can be accomplished in many different materials systems and with many different methods, including but not limited to impurity free vacancy diffusion (IFVD), impurity induced diffusion (IID), ion implantation induced diffusion (IIID), and laser induced diffusion (LID). IIID induced QWI generally has good repeatability and controllability so that it can control the defect distribution region and profile by manipulating the implantation dose and energy. IIID induced QWI may follow a kick-out mechanism where the implanted ions introduced into semiconductor layers reduce the activation energy of the lattice atoms and generate vacancies and interstitials.

In an embodiment, red micro LEDs formed from the GaInP/AlGaInP material systems are subjected to N ion implantation induced quantum well intermixing. N ions can be implanted with an energy of, for example, 10 keV and greater, 40 keV and greater, 100 keV and greater, or even greater energies and at doses of 1e15 ions/cm2 and greater, 1e17 ions/cm2 and greater, or 1e18 ions/cm2 and greater. After the implantation, a thermal process may be performed such as a rapid thermal annealing process at greater than 500° C., greater than 700° C., greater than 800° C., or greater than 1000° C. and at times that range from about 1 s to about 200 s or to about 1000 s or longer to induce the intermixing. The intermixing process leads to a wavelength blue-shift indicating an increase in the bandgap energy. Of course, this is merely an example of one approach to quantum well intermixing, but other approaches may be included in various embodiments such as strain induced quantum well intermixing, impurity based intermixing such as Zn diffusion, impurity free intermixing, or others. Moreover, the light emitting region may not be a quantum well in some embodiments. Instead, it could be a double heterostructure, a quantum wire, a quantum dot, or others.

The QWI step could be performed prior to the micro LED mesa etching step when the epitaxial growth wafer is still planar, or it could be performed after the mesas have been etched with the sidewalls exposed. QWI may also be used to passivate the sidewalls of AlInGaP micro LEDs.

FIGS. 18A-18I are simplified cross sectional diagrams illustrating a process for passivating sidewalls of epitaxial material in accordance with an embodiment. This process is merely an example and there are many other process sequences for implementing sidewall passivation that may be used with the embodiments described herein. In an embodiment, the sidewall passivation of the micro LED die may be applied at the donor wafer level. In one process flow according to this embodiment, the passivation may be applied prior to fully or partially removal of the sacrificial release region. As shown in FIG. 18A, in a first step device layers are grown with a buried sacrificial release region on the donor wafer. In FIG. 18B, a p-side contact is deposited that may be comprised of a metal, a mirror stack, a conductive oxide, or a combination thereof. In FIG. 18C, the epi layers are etched to form mesas that expose the active region. The etch may stop prior to the sacrificial region. In some embodiments, the p-contact may be applied after the etch step. In FIG. 18D, the passivation layer is formed on the sidewalls of the mesas. This passivation layer could be formed by ALD, MBE, MOCVD, PECVD, ECR, IBD, or any other deposition technique and could be any material such as Al2O3, AlON, AlN, GaN, or other. In FIG. 18E, the passivation layer is etched over the p-contact to open vias for the p-contact layers. In FIG. 18F, an etch down through the sacrificial release region is performed to expose the sidewalls of the release region. In FIG. 18G, the release region is fully or partially removed to leave the micro LED die supported by anchor regions (not shown in this example). In FIG. 18H, the donor wafer is aligned and one or more die are bonded to a carrier wafer in accordance with embodiments described herein. In FIG. 18I, the donor wafer is separated leaving the transferred die on the carrier wafer. In some embodiments that are part of a die expansion process, only some of the die on the donor waver are bonded onto the carrier wafer at a time such that the bond/stamp and repeat process can be used to provide multiple bonding steps from the same donor wafer to multiple carrier wafers or multiple locations on the same carrier wafer.

The die passivation sequence described here is not meant to be comprehensive since there can be many sequences. For example, the die passivation can be applied at the donor wafer level, but after the sacrificial region has been fully or partially removed. In the case of quantum well intermixing, the die passivation step could be performed at the donor wafer level, but prior to any etching process. It could be performed on the as grown planar epi wafer to define the passivated high bandgap regions around each active die area that are to be spatially defined in a subsequent step. In some embodiments of the quantum well intermixing method, a subsequent epitaxial regrowth step may be performed after the intermixing process is performed but prior to the etching of the die. In yet another embodiment, the die passivation process can be performed at the carrier wafer level after the die has been transferred from the donor wafer to the carrier wafer.

Figure 19A:
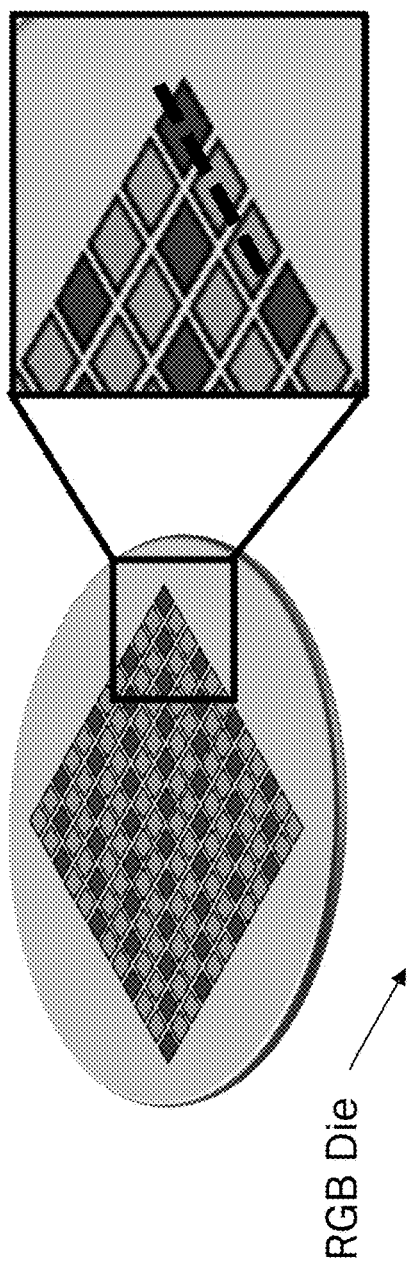
FIGS. 19A-19B are simplified diagrams of a micro LED device having both an n-contact and a p-contact on the same side of the chips in accordance with an embodiment.
Figure 19B:
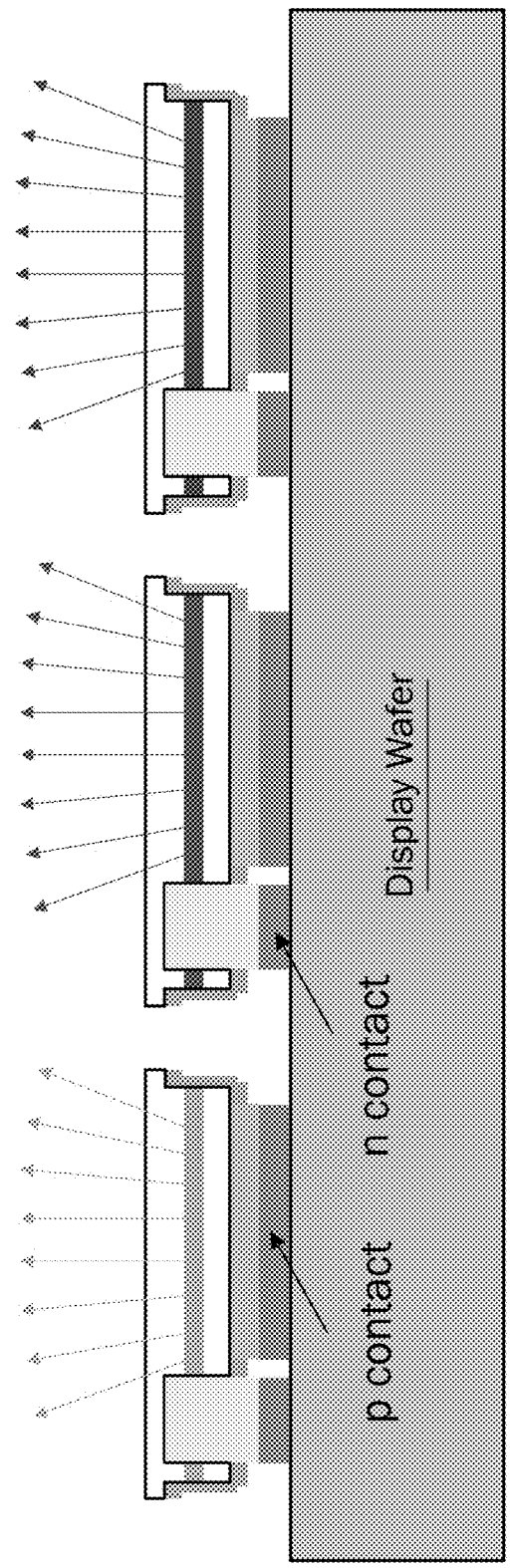

FIGS. 19A-19B are simplified diagrams of a micro LED device having both an n-contact and a p-contact on the same side of the chips in accordance with an embodiment. FIG. 19B is a cross section of the micro LED array shown in FIG. 19A. As shown in FIG. 19B, the n-contact and the p-contact directly contact the carrier wafer. Some of the micro LED devices described herein may include these features. These features allow simultaneous connection of both the n- and p-contacts and enables transfer of functioning die. This can eliminate the need for some or all processing steps after the transfer.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description but should be determined with reference to the appended claims along with their full scope of equivalents.

REFERENCES 1. en.wikipedia.org/wiki/Light-emitting_diode
2. H. Amano, M. Kito, K. Hiramatsu, and I. Akasaki, "p-type conduction in Mg-doped GaN treated with low-energy electron beam irradiation (LEEBI)," Jpn. J. Appl. Phys. vol. 28, pp. L2112-L2114, 1989.
3. S. Nakamura, M. Senoh, and T. Mukai, "p-GaN/n-InGaN/n-GaN double-heterostructure blue-light-emitting diodes," Jpn. J. Appl. Phys., vol. 32, pp. L8-L11, 1993.
4. S. Nakamura, T. Mukai, and M. Senoh, "Candera-class high-brightness InGaN/AlgaN double-heterostructure blue-light-emitting diodes," Appl. Phys. Lett., vol. 64, pp. 1687-1689, 1994.
5. Lidow, Alex, Strydom, Johan; GaN Technology Overview, EPC White Paper. (2012)

What is claimed is:
1. A method for manufacturing a light emitting diode based display panel device, the method comprising:
providing at least one carrier wafer;
providing a first substrate having a first surface region;
forming a first release material overlying the first substrate;
forming a first gallium and nitrogen containing epitaxial material overlying the first surface region, the first gallium and nitrogen containing epitaxial material comprising at least an n-type gallium and nitrogen containing region, a first light emitting gallium and nitrogen containing region configured to emit electromagnetic radiation at a first blue wavelength, and a p-type gallium and nitrogen containing region;
patterning the first gallium and nitrogen containing epitaxial material and forming first mesas to form a first plurality of dice arranged in a first array, each die corresponding to at least one light emitting diode device and being arranged by a first pitch between adjacent die in the first array;
forming a first interface region overlying the first gallium and nitrogen containing epitaxial material;
subjecting the first release material to a first energy source to fully or partially remove the first release material, the first release material disposed between the first substrate and the first gallium and nitrogen containing epitaxial material;
subjecting at least a first portion of the first plurality of dice to a screening process to identify one or more first defective dice of the first plurality of dice;
selectively removing the one or more first defective dice of the first plurality of dice from the first substrate after fully or partially removing the first release material;
bonding the first interface region of at least a first fraction of the first plurality of dice to the at least one carrier wafer to form first bonded structures, while maintaining the first release material fully or partially removed from the first bonded structures;
releasing at least the first fraction of the first plurality of dice provided on the first substrate to transfer the first fraction of the first plurality of dice to the at least one carrier wafer as first transferred dice; wherein the first transferred dice do not include any of the one or more first defective dice of the first plurality of dice identified by the screening process; and wherein each pair of the first transferred dice is configured with a second pitch between each pair of the first transferred dice, the second pitch being equal to or greater than the first pitch; and
processing the at least one carrier wafer with at least the first fraction of the first plurality of dice to form the light emitting diode based display panel device operable at least at the first blue wavelength, the first blue wavelength having a range of range of 420 nm to 480 nm.

2. The method of claim 1, further comprising:
providing a second substrate having a second surface region;
forming a second release material overlying the second substrate;
forming a second epitaxial material overlying the second surface region, the second epitaxial material comprising at least an n-type gallium and nitrogen containing region, a second light emitting gallium and nitrogen containing region configured to emit electromagnetic radiation at a second green wavelength, and a p-type gallium and nitrogen containing region;
patterning the second epitaxial material and forming second mesas to form a second plurality of dice arranged in a second array, each die corresponding to at least one light emitting diode device and being arranged by a third pitch between adjacent die in the second array;
forming a second interface region overlying the second epitaxial material;
subjecting the second release material to a second energy source to completely or partially remove the second release material, the second release material disposed between the second substrate and the second epitaxial material;

subjecting at least a second portion of the second plurality of dice to the screening process to identify one or more second defective dice of the second plurality of dice;

bonding the second interface region of at least a second fraction of the second plurality of dice to the at least one carrier wafer to form second bonded structures, while maintaining the second release material completely or partially removed from the second bonded structures;

releasing at least the second fraction of the second plurality of dice provided on the second substrate to transfer the second fraction of the second plurality of dice to the at least one carrier wafer as second transferred dice; wherein the second transferred dice do not include any of the one or more second defective dice of the second plurality of dice identified by the screening process; and wherein each pair of the second transferred dice is configured with a fourth pitch between each pair of the second transferred dice, the fourth pitch being equal to or greater than the third pitch; and processing the at least one carrier wafer with at least the first fraction of the first plurality of dice and the second fraction of the second plurality of dice to form the light emitting diode based display panel device operable at least at the first blue wavelength and at the second green wavelength, the second green wavelength having a range of 500 nm to 550 nm.

3. The method of claim 2, further comprising:

providing a third substrate having a third surface region;

forming a third release material overlying the third substrate;

forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third red wavelength; and a p-type gallium, indium, phosphorous, nitrogen, aluminum, arsenic, or combinations thereof containing region;

patterning the third epitaxial material and forming third mesas to form a third plurality of dice arranged in a third array, each die corresponding to at least one light emitting diode device and being arranged by a fifth pitch between adjacent die in the third array;

forming a third interface region overlying the third epitaxial material;

subjecting the third release material to a third energy source to fully or partially remove the third release material, the third release material disposed between the third substrate and the third epitaxial material;

subjecting at least a third portion of the third plurality of dice to the screening process to identify one or more third defective dice of the third plurality of dice;

bonding the third interface region of at least a third fraction of the third plurality of dice to the at least one carrier wafer to form third bonded structures, while maintaining the third release material fully or partially removed from the third bonded structures;

releasing at least the third fraction of the third plurality of dice provided on the third substrate to transfer the third fraction of the third plurality of dice to the at least one carrier wafer as third transferred dice; wherein the third transferred dice do not include any of the one or more third defective dice of the third plurality of dice identified by the screening process; and wherein each pair of the third transferred dice is configured with a sixth pitch between each pair of the third transferred dice, the sixth pitch being equal to or greater than the fifth pitch; and processing the at least one carrier wafer with at least the first fraction of the first plurality of dice, the second fraction of the second plurality of dice, and the third fraction of the third plurality of dice to form the light emitting diode based display panel device operable at least at the first blue wavelength, the second green wavelength, and the third red wavelength, the third red wavelength having a range of 620 nm to 700 nm.

4. The method of claim 3, further comprising:

selectively removing the one or more first defective dice of the first plurality of dice from the first substrate before bonding the first interface region of the first fraction of the first plurality of dice to the at least one carrier wafer;

selectively removing the one or more second defective dice of the second plurality of dice from the second substrate before bonding the second interface region of the second fraction of the second plurality of dice to the at least one carrier wafer; and/or selectively removing the one or more third defective dice of the third plurality of dice from the third substrate before bonding the third interface region of the third fraction of the third plurality of dice to the at least one carrier wafer.

5. The method of claim 3, further comprising:

selectively removing the one or more second defective dice of the second plurality of dice from the second substrate after fully or partially removing the second release material; and/or selectively removing the one or more third defective dice of the third plurality of dice from the third substrate after fully or partially removing the third release material.

6. The method of claim 3, wherein:

the first portion of the first plurality of dice are subjected to the screening process after subjecting the first release material to the first energy source to fully or partially remove the first release material;

the second portion of the second plurality of dice are subjected to the screening process after subjecting the second release material to the second energy source to fully or partially remove the second release material; and/or the third portion of the third plurality of dice are subjected to the screening process after subjecting the third release material to the third energy source to fully or partially remove the third release material.

7. The method of claim 3, wherein the screening process includes at least one of a visual inspection, an optical inspection, an electrical test, or an optoelectrical test.

8. The method of claim 3, further comprising:

selectively removing the one or more first defective dice of the first plurality of dice from the first substrate and selectively attaching good first dice to the first substrate in place of the one or more first defective dice of the first plurality of dice, the good first die being part of the first fraction of the first plurality of dice that are transferred to the at least one carrier wafer;

selectively removing the one or more second defective dice of the second plurality of dice from the second substrate and selectively attaching good second dice to the second substrate in place of the one or more second defective dice of the second plurality of dice, the good second die being part of the second fraction of the second plurality of dice that are transferred to the at least one carrier wafer; and/or selectively removing the one or more third defective dice of the third plurality of dice from the third substrate and selectively attaching good third dice to the third substrate in place of the one or more third defective dice of the third plurality of dice, the good third die being part of the third fraction of the third plurality of dice that are transferred to the at least one carrier wafer.

9. The method of claim 3, further comprising:

selectively removing the one or more first defective dice of the first plurality of dice from the first substrate and selectively attaching good first dice to the at least one carrier wafer at locations on the at least one carrier wafer where the one or more first defective dice of the first plurality of dice would have been bonded if not removed from the first substrate;

selectively removing the one or more second defective die of the second plurality of dice from the second substrate and selectively attaching good second dice to the at least one carrier wafer at locations on the at least one carrier wafer where the one or more second defective dice of the second plurality of dice would have been bonded if not removed from the second substrate; and/or selectively removing the one or more third defective dice of the third plurality of dice from the third substrate and selectively attaching good third dice to the at least one carrier wafer at locations on the at least one carrier wafer where the one or more third defective dice of the third plurality of dice would have been bonded if not removed from the third substrate.

10. The method of claim 3, wherein the light emitting diode based display panel device is a red-green-blue (RGB) light-emitting-diode display panel device; and wherein the first fraction of the first plurality of dice, the second fraction of the second plurality of dice, and the third fraction of the third plurality of dice are arranged in a two dimensional array with repeating red-green-blue light emitting diode devices forming pixels.

11. The method of claim 3, wherein the first substrate is comprised of a gallium and nitrogen containing material, a silicon material, a sapphire material, or a silicon carbide material; and wherein the second substrate is comprised of a gallium and nitrogen containing material, a silicon material, a sapphire material, or a silicon carbide material; and wherein the third substrate is comprised of a gallium and nitrogen containing material, a gallium and arsenide containing material, a silicon material, a sapphire material, or a silicon carbide material.

12. The method of claim 3, wherein at least the first release material or the second release material is selected from a gallium containing material or a gallium and nitrogen containing material, and/or wherein the third release material is selected from a gallium, aluminum, nitrogen, arsenic, indium, or phosphorous containing material.

13. The method of claim 3, wherein the first energy source, the second energy source, or the third energy source includes an etching process to fully or partially remove the first release material, second release material, or third release material, respectively.

14. The method of claim 3, wherein the first energy source, the second energy source, or the third energy source includes a photoelectrochemical (PEC) etch that comprises KOH, HCl, or HNO$_3$.

15. The method of claim 3, wherein the first energy source, the second energy source, or the third energy source includes a photoelectrochemical (PEC) etch; wherein the PEC etch selectively removes the respective first release material, the respective second release material, or the respective third release material, while leaving an anchor region intact to support a respective die before bonding the respective first interface region, the respective second interface region, or the respective third interface region to the carrier wafer, and the anchor region separates after the bonding; wherein the anchor region is comprised of metal, semiconductor, dielectric, oxide, polymer, or a combination thereof.

16. The method of claim 3, wherein the third epitaxial material comprises InGaP, AlInGap, GaN, and/or InGaN.

17. The method of claim 3, wherein the at least one carrier wafer is selected from a silicon wafer, a sapphire wafer, a glass wafer, glass ceramics wafer, a quartz wafer, a high purity fused silica wafer, a silicon carbide wafer, an aluminum nitride wafer, a germanium wafer, an aluminum oxynitride wafer, a gallium arsenide wafer, a diamond wafer, a gallium nitride wafer, an indium phosphide wafer, a flexible member, a circuit board member, a silicon wafer with complementary metal-oxide-semiconductor (CMOS) circuitry, silicon on insulator (SOI) wafer, or a gallium nitride on silicon wafer.

18. The method of claim 3, wherein the first interface region, the second interface region, and the third interface region each comprise a metal, a semiconductor, a dielectric, an oxide, a glass, or a polymer.

19. The method of claim 3, wherein the at least one carrier wafer includes a micro light emitting diode (LED) display panel.

20. The method of claim 3, further comprising:
on the first substrate:
etching the first gallium and nitrogen containing epitaxial material and stopping the etch before reaching the first release material;
forming a first passivation layer to cover exposed portions of the first gallium and nitrogen containing epitaxial material; and
etching portions of the first gallium and nitrogen containing epitaxial material to expose sidewalls of the first release material and form the first mesas;
on the second substrate:
etching the second gallium and nitrogen containing epitaxial material and stopping the etch before reaching the second release material;
forming a second passivation layer to cover exposed portions of the second gallium and nitrogen containing epitaxial material; and
etching portions of the second gallium and nitrogen containing epitaxial material to expose sidewalls of the second release material and form the second mesas;
on the third substrate:
etching the third epitaxial material and stopping the etch before reaching the third release material;
forming a third passivation layer to cover exposed portions of the third epitaxial material; and
etching portions of the third epitaxial material to expose sidewalls of the third release material and form the third mesas.

21. The method of claim 3, further comprising:
on the first substrate:
- forming first anchor regions extending along first sidewalls of the first gallium and nitrogen containing epitaxial material, the first anchor regions supporting the first plurality of dice after fully or partially removing the first release material; and
- removing the first anchor regions after bonding the first interface region to the at least one carrier wafer;

on the second substrate:
- forming second anchor regions extending along second sidewalls of the second gallium and nitrogen containing epitaxial material, the second anchor regions supporting the second plurality of dice after fully or partially removing the second release material; and
- removing the second anchor regions after bonding the second interface region to the at least one carrier wafer;

on the third substrate:
- forming third anchor regions extending along third sidewalls of the third epitaxial material, the third anchor regions supporting the third plurality of dice after fully or partially removing the third release material; and
- removing the third anchor regions after bonding the third interface region to the at least one carrier wafer.

22. The method of claim 3, wherein:
a second height of the second fraction of the second plurality of dice is greater than a first height of the first fraction of the first plurality of dice; and
a third height of the third fraction of the third plurality of dice is greater than the second height of the second fraction of the second plurality of dice.

23. The method of claim 1, further comprising:
providing a third substrate having a third surface region;
forming a third release material overlying the third substrate;
forming a third epitaxial material overlying the third surface region, the third epitaxial material comprising at least an n-type gallium, indium, phosphorous, nitrogen, aluminum, arsenic, or combinations thereof containing region; a gallium, indium, phosphorous, nitrogen, aluminum, arsenic, or combinations thereof containing light emitting region configured to emit electromagnetic radiation at a third red wavelength; and a p-type gallium, indium, phosphorous, nitrogen, aluminum, arsenic, or combinations thereof containing region;
patterning the third epitaxial material and forming third mesas to form a third plurality of dice arranged in a third array, each die corresponding to at least one light emitting diode device and being arranged by a fifth pitch between adjacent die in the third array;
forming a third interface region overlying the third epitaxial material;
subjecting the third release material to a third energy source to fully or partially remove the third release material, the third release material disposed between the third substrate and the third epitaxial material;
subjecting at least a third portion of the third plurality of dice to the screening process to identify one or more third defective dice of the third plurality of dice;
bonding the third interface region of at least a third fraction of the third plurality of dice to the at least one carrier wafer to form third bonded structures, while maintaining the third release material fully or partially removed from the third bonded structures;
releasing at least the third fraction of the third plurality of dice provided on the third substrate to transfer the third fraction of the third plurality of dice to the at least one carrier wafer as third transferred dice; wherein the third transferred dice do not include any of the one or more third defective dice of the third plurality of dice; and wherein each pair of the third transferred dice is configured with a sixth pitch between each pair of the third transferred dice, the sixth pitch being equal to or greater than the fifth pitch; and
processing the at least one carrier wafer with at least the first fraction of the first plurality of dice, a second fraction of a second plurality of dice, and the third fraction of the third plurality of dice to form the light emitting diode based display panel device operable at least at the first blue wavelength, a second green wavelength, and the third red wavelength, the third red wavelength having a range of 620 nm to 700 nm.

* * * * *